United States Patent
Wu et al.

(10) Patent No.: US 12,432,918 B2
(45) Date of Patent: Sep. 30, 2025

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Linchun Wu, Wuhan (CN); Kun Zhang, Wuhan (CN); Wenxi Zhou, Wuhan (CN); Zhiliang Xia, Wuhan (CN); Wei Xie, Wuhan (CN); Di Wang, Wuhan (CN); Bingguo Wang, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 863 days.

(21) Appl. No.: 17/570,091

(22) Filed: Jan. 6, 2022

(65) Prior Publication Data

US 2023/0056340 A1 Feb. 23, 2023

Related U.S. Application Data

(63) Continuation of application No. PCT/CN2021/138167, filed on Dec. 15, 2021.

(30) Foreign Application Priority Data

Aug. 23, 2021 (WO) ................ PCT/CN2021/114050

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27* (2023.02); *H10B 41/35* (2023.02); *H10B 43/35* (2023.02)

(58) Field of Classification Search
CPC ........ H10B 43/27; H10B 41/27; H10B 41/35; H10B 43/35
See application file for complete search history.

(56) References Cited

U.S. PATENT DOCUMENTS

2010/0302848 A1 12/2010 Mikhalev
2020/0168622 A1* 5/2020 Fukuzumi ............ H10D 64/037
(Continued)

FOREIGN PATENT DOCUMENTS

CN 109417076 A 3/2019
CN 109786388 A 5/2019
(Continued)

OTHER PUBLICATIONS

International Search Report issued in corresponding International Application No. PCT/CN2021/138198, mailed May 19, 2022, 4 pages.

(Continued)

*Primary Examiner* — Jeff W Natalini
*Assistant Examiner* — Brandon C Fox
(74) *Attorney, Agent, or Firm* — BAYES PLLC

(57) ABSTRACT

A three-dimensional (3D) memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The memory film includes a tunneling layer over the semiconductor channel, a storage layer over the tunneling layer, and a blocking layer over the storage layer. A first thickness of the bottom portion of the channel structure is larger than a second thickness of a top portion of the channel structure.

20 Claims, 54 Drawing Sheets

(51) Int. Cl.
*H10B 41/35* (2023.01)
*H10B 43/35* (2023.01)

(56) References Cited

U.S. PATENT DOCUMENTS

| | | | |
|---|---|---|---|
| 2020/0373324 A1* | 11/2020 | Lee | H10B 43/40 |
| 2021/0167176 A1 | 6/2021 | Inden et al. | |
| 2021/0225863 A1* | 7/2021 | Wu | H01L 21/76831 |
| 2021/0225864 A1 | 7/2021 | Zhang et al. | |
| 2023/0225124 A1* | 7/2023 | Wu | H10B 43/20 |
| | | | 257/329 |

FOREIGN PATENT DOCUMENTS

| | | |
|---|---|---|
| CN | 109817635 A | 5/2019 |
| CN | 109887927 A | 6/2019 |
| CN | 112437983 A | 3/2021 |
| CN | 112992914 A | 6/2021 |
| CN | 113097218 A | 7/2021 |
| CN | 113169184 A | 7/2021 |
| KR | 20210080571 A | 6/2021 |

OTHER PUBLICATIONS

International Search Report issued in corresponding International Application No. PCT/CN2021/138167, mailed May 20, 2022, 4 pages.

* cited by examiner

THREE-DIMENSIONAL MEMORY DEVICES AND METHODS FOR FORMING THE SAME

CROSS-REFERENCES TO RELATED APPLICATIONS

This application is a continuation of International Application No. PCT/CN2021/138167, filed on Dec. 15, 2021, entitled "THREE-DIMENSIONAL MEMORY DEVICES AND METHODS FOR FORMING THE SAME," which claims the benefit of priority to International Application No. PCT/CN2021/114050, filed on Aug. 23, 2021, entitled "THREE-DIMENSIONAL MEMORY DEVICES AND METHODS FOR FORMING THE SAME," both of which are incorporated herein by reference in their entireties. This application is also related to U.S. application Ser. No. 17/570,123, filed on Jan. 6, 2022, entitled "THREE-DIMENSIONAL MEMORY DEVICES AND METHODS FOR FORMING THE SAME," which is incorporated herein by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. As the number of 3D memory layers continues to increase, the control of channel profile becomes more and more difficult.

SUMMARY

Embodiments of 3D memory devices and methods for forming the same are disclosed herein.

In one aspect, a 3D memory device is disclosed. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The memory film includes a tunneling layer over the semiconductor channel, a storage layer over the tunneling layer, and a blocking layer over the storage layer. A first thickness of the blocking layer at the bottom portion of the channel structure is larger than a second thickness of the blocking layer at an upper portion of the channel structure.

In another aspect, a 3D memory device is disclosed. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The semiconductor channel comprises an angled structure, and a first diameter of the semiconductor channel at the bottom portion of the channel structure below the angled structure is smaller than a second diameter of the semiconductor channel at an upper portion of the channel structure above the angled structure.

In still another aspect, a system is disclosed. The system includes a 3D memory device configured to store data, and a memory controller coupled to the 3D memory device and configured to control operations of the 3D memory device. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The memory film includes a tunneling layer over the semiconductor channel, a storage layer over the tunneling layer, and a blocking layer over the storage layer. A first thickness of the blocking layer at the bottom portion of the channel structure is larger than a second thickness of the blocking layer at an upper portion of the channel structure.

In yet another aspect, a system is disclosed. The system includes a 3D memory device configured to store data, and a memory controller coupled to the 3D memory device and configured to control operations of the 3D memory device. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The semiconductor channel comprises an angled structure, and a first diameter of the semiconductor channel at the bottom portion of the channel structure below the angled structure is smaller than a second diameter of the semiconductor channel at an upper portion of the channel structure above the angled structure.

In yet another aspect, a method for forming a 3D memory device is disclosed. A first stack structure including a first dielectric layer, a first polysilicon layer, a second dielectric layer, and a second polysilicon layer is formed on a substrate. A second stack structure including a plurality of third dielectric layers and a plurality of sacrificial layers alternatingly arranged is formed on the first stack structure. A channel hole is formed penetrating the second stack structure and the first stack structure along a first direction. An oxidation operation is performed to form a fourth dielectric layer on the first polysilicon layer exposed by sidewalls of the channel hole. A channel structure is formed in the channel hole. The substrate, the first dielectric layer, the first polysilicon layer, the fourth dielectric layer, and a bottom portion of the channel structure are removed. A third polysilicon layer is formed over the exposed channel structure.

In yet another aspect, a method for forming a 3D memory device is disclosed. A first stack structure including a first dielectric layer, a first polysilicon layer, a second dielectric layer, and a second polysilicon layer is formed on a substrate. A second stack structure including a plurality of third dielectric layers and a plurality of sacrificial layers alternatingly arranged is formed on the first stack structure. A channel hole is formed penetrating the second stack structure and the first stack structure along a first direction. A fourth dielectric layer is formed on the first polysilicon layer exposed by sidewalls of the channel hole along a second direction perpendicular to the first direction to connect the first polysilicon layer divided by the channel hole. A channel structure is formed in the channel hole above the fourth dielectric layer. The substrate, the first dielectric layer, the first polysilicon layer, the fourth dielectric layer, and a bottom portion of the channel structure are removed. A third polysilicon layer is formed over the exposed channel structure.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
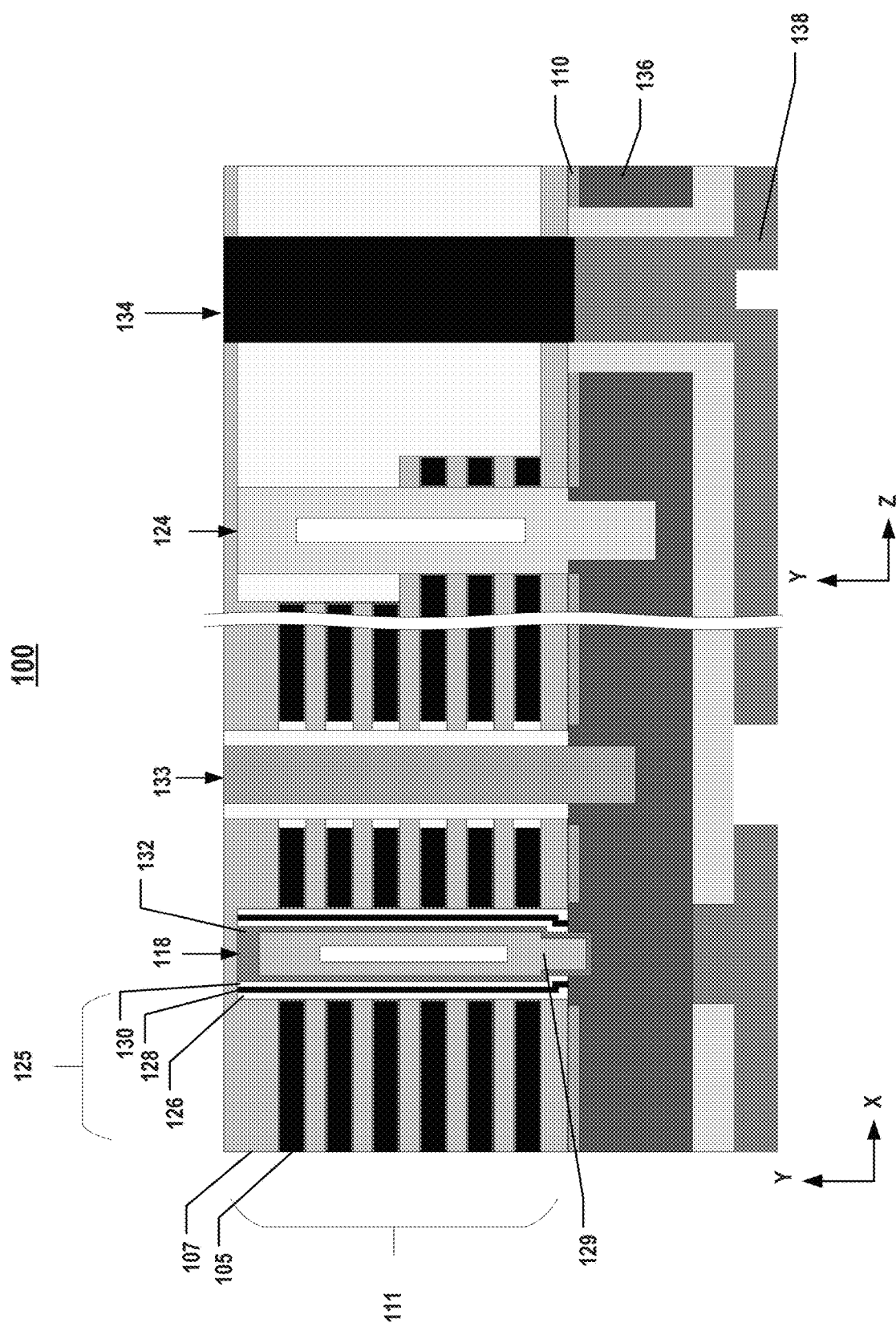
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

A 3D semiconductor device can be formed by stacking semiconductor wafers or dies and interconnecting them vertically so that the resulting structure acts as a single device to achieve performance improvements at reduced power and a smaller footprint than conventional planar processes. However, as the number of 3D memory layers continues to increase, the control of channel profile becomes more and more difficult FIG. 1 illustrates a cross-section of an exemplary 3D memory device 100, according to some aspects of the present disclosure. As shown in FIG. 1, 3D memory device 100 includes a stack structure 111 and a channel structure 118 extending through stack structure 111 along the y-direction. Stack structure 111 may include interleaved conductive layers 105 and dielectric layers 107, and the stacked conductive/dielectric layer pairs are also referred to as a memory stack. In some implementations, dielectric layers 107 may include dielectric materials including, but not limited to, silicon oxide, silicon nitride, silicon oxynitride, or any combination thereof. In some implementations, conductive layers 105 may form the word lines and may include conductive materials including, but not limited to, tungsten (W), cobalt (Co), copper (Cu), aluminum (Al), polysilicon, doped silicon, silicides, or any combination thereof.

Channel structure 118 may extend through stack structure 111, and the bottom of channel structure 118 may contact a source of 3D memory device 100. In some implementations, channel structure 118 may include a semiconductor channel 132 and a memory film 125 formed over semiconductor channel 132. The meaning of "over" here, besides the explanation stated above, should also be interpreted "over" something from the top side or from the lateral side. In some implementations, channel structure 118 may also include a dielectric core 129 in the center of channel structure 118. In some implementations, memory film 125 may include a tunneling layer 130 over semiconductor channel 132, a storage layer 128 over tunneling layer 130, and a blocking layer 126 over storage layer 128.

Dielectric core 129, semiconductor channel 132, tunneling layer 130, storage layer 128, and blocking layer 126 are arranged radially from the center toward the outer surface of channel structure 118 in this order, according to some implementations. In some implementations, tunneling layer 130 may include silicon oxide, silicon oxynitride, or any combination thereof. In some implementations, storage layer 128 may include silicon nitride, silicon oxynitride, silicon, or any combination thereof. In some implementations, blocking layer 126 may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

As shown in FIG. 1, a dummy channel structure 124 may be formed in stack structure 111 extending along the y-direction. In some implementations, a contact structure 134 may be formed in stack structure 111 extending along the y-direction. It is understood that, in the actual structure, stack structure 111 and the staircase region (including dummy channel structure 124 and/or contact structure 134) may not bee seen in the same cross-section. For the purpose of better describing the present disclosure, the cross-sections of stack structure 111 and the staircase region are illustrated in the same drawings in the present disclosure, and the coordinates of x-direction and z-direction are noted in FIG. 1 to shown the perpendicularity of the cross-sections of stack structure 111 and the staircase region.

Figure 2:
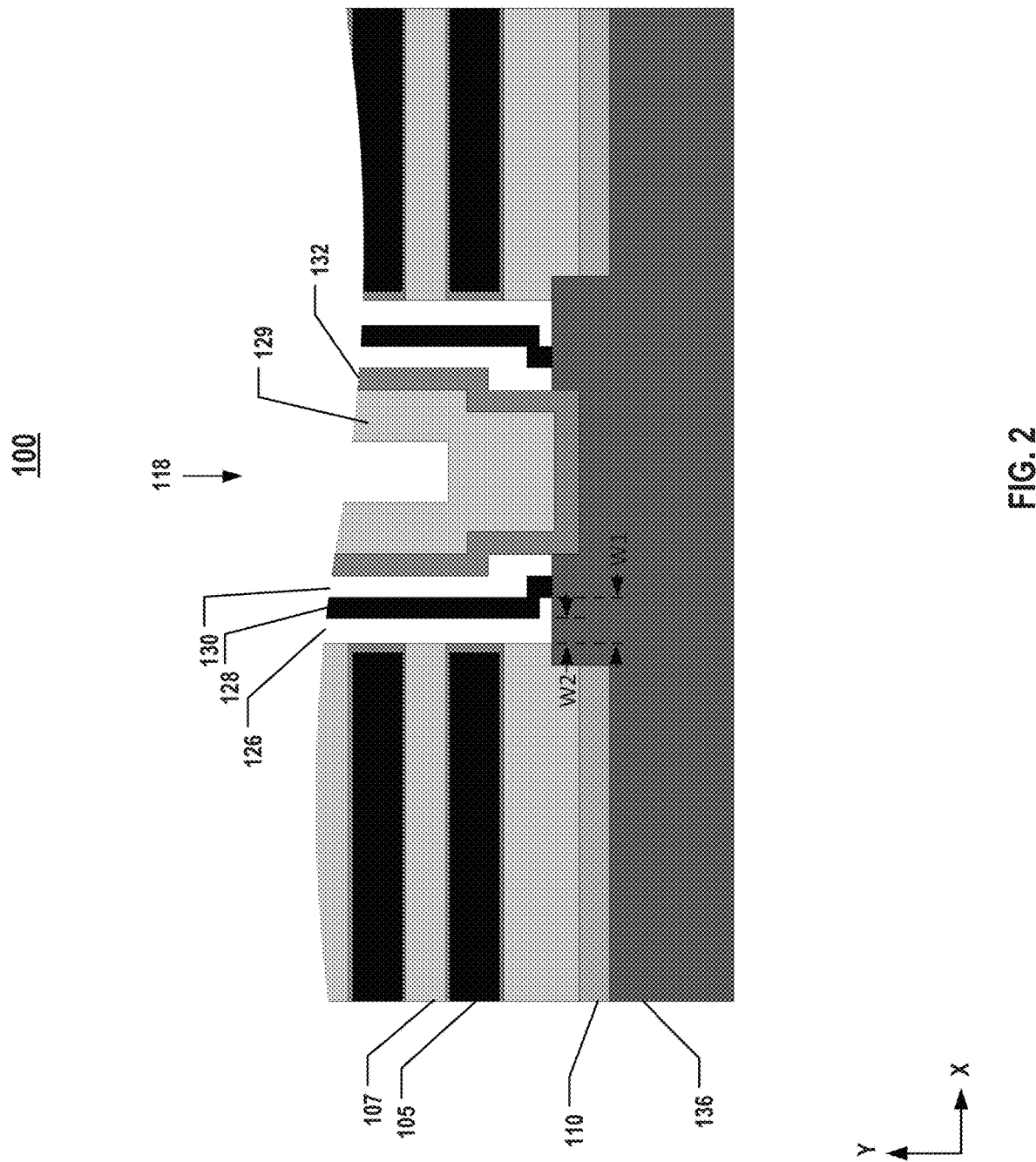
FIG. 2 illustrates a cross-section of a bottom portion of a channel structure, according to some aspects of the present disclosure.

FIG. 2 illustrates a cross-section of a bottom portion of channel structure 118 of 3D memory device 100, according to some aspects of the present disclosure. As shown in FIG. 2, the bottom portion of channel structure 118 may include a bending structure of semiconductor channel 132, tunneling layer 130, and storage layer 128. In some implementations, blocking layer 126 at the bottom portion of channel structure 118 may have different thickness comparing to blocking layer 126 at an upper portion of channel structure 118. In some implementations, blocking layer 126 at the bottom portion of channel structure 118 may have a thickness W1, blocking layer 126 at an upper portion of channel structure 118 may have a thickness W2, and W1 is larger than W2, as shown in FIG. 2.

In some implementations, blocking layer 126 may include dielectric materials by forming the channel structure memory film 125 and dielectric materials of forming a fifth dielectric layer 116, which will be described later. In other words, thickness W1 of blocking layer 126 or thickness W2 of blocking layer 126 may include dielectric materials formed between storage layer 128 and the sidewalls of stack structure 111 along the x-direction.

A conductive layer 136 may be disposed under stack structure 111, as shown in FIG. 1 and FIG. 2. In some implementations, conductive layer 136 may be a polysilicon layer. In some implementations, conductive layer 136 is in direct contact with semiconductor channel 132. In some implementations, conductive layer 136 is in direct contact with the bottom surface of semiconductor channel 132 and a portion of a side surface of semiconductor channel 132 at the bottom portion of channel structure 118. In some implementations, the bottom surface of memory film 125, including blocking layer 126, storage layer 128, and tunneling layer 130, is above the bottom surface of semiconductor channel 132, as shown in FIG. 2.

Figure 3:
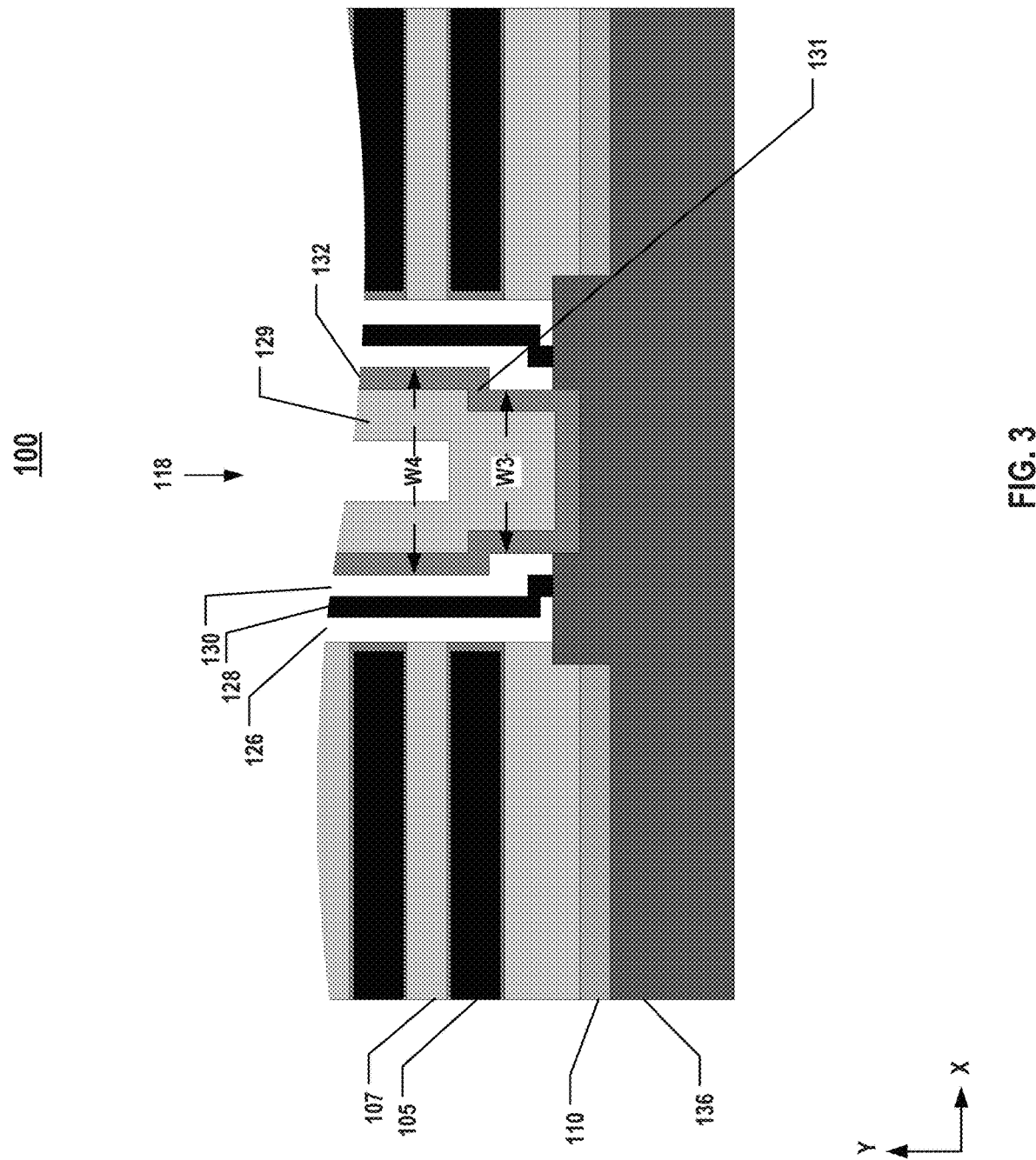
FIG. 3 illustrates a cross-section of a bottom portion of a channel structure, according to some aspects of the present disclosure.

FIG. 3 illustrates a cross-section of the bottom portion of channel structure 118 of 3D memory device 100, according to some aspects of the present disclosure. In some implementations, channel structure 118 is a circular structure in a plan view of 3D memory device 100. In some implementations, dielectric core 129, semiconductor channel 132, tunneling layer 130, storage layer 128, and blocking layer 126 are arranged radially from the center toward the outer surface of channel structure 118. As shown in FIG. 3, semiconductor channel 132 at the bottom portion of channel structure 118 may have a different diameter comparing to semiconductor channel 132 at the upper portion of channel structure 118. In some implementations, in the plan view of 3D memory device 100, semiconductor channel 132 at the bottom portion of channel structure 118 may have an outer diameter W3, semiconductor channel 132 at the upper portion of channel structure 118 may have an outer diameter W4, and W3 is smaller than W4. In some implementations, semiconductor channel 132 may be formed as an angled structure 131 in the cross-section of the bottom portion of channel structure 118. For example, as shown in FIG. 3, semiconductor channel 132 may be formed as two right angle structures. In some implementations, semiconductor channel 132 may be formed as obtuse angle structures, acute angle structures, right angle structures, arc angle structures, or any combination of these angled structures. The outer diameter W3 of semiconductor channel 132 at the bottom portion of channel structure 118 below the angled structure is smaller than the outer diameter W4 of semiconductor channel 132 at the upper portion of channel structure 118 above the angled structure.

Figure 20:
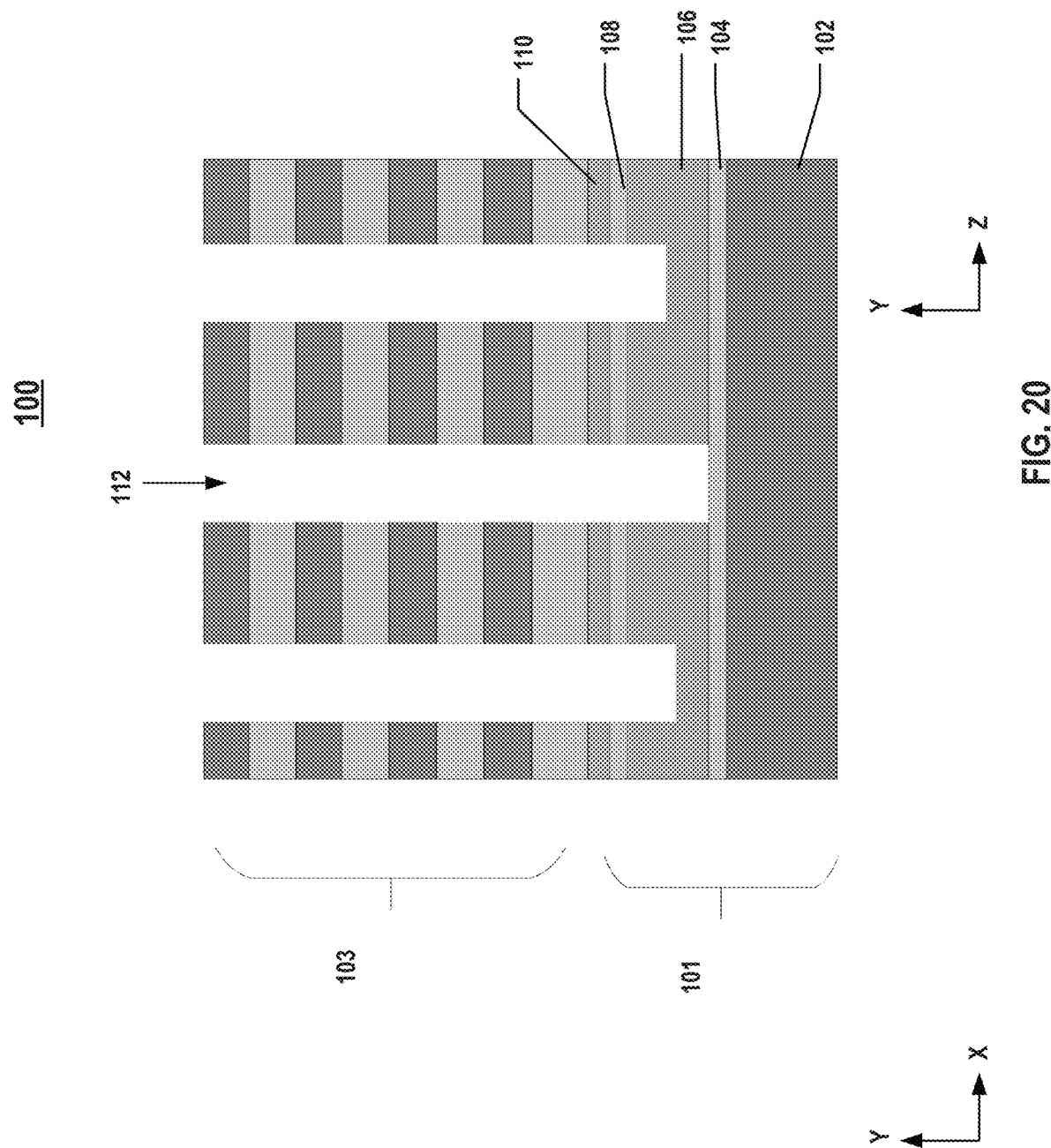
Figure 21:
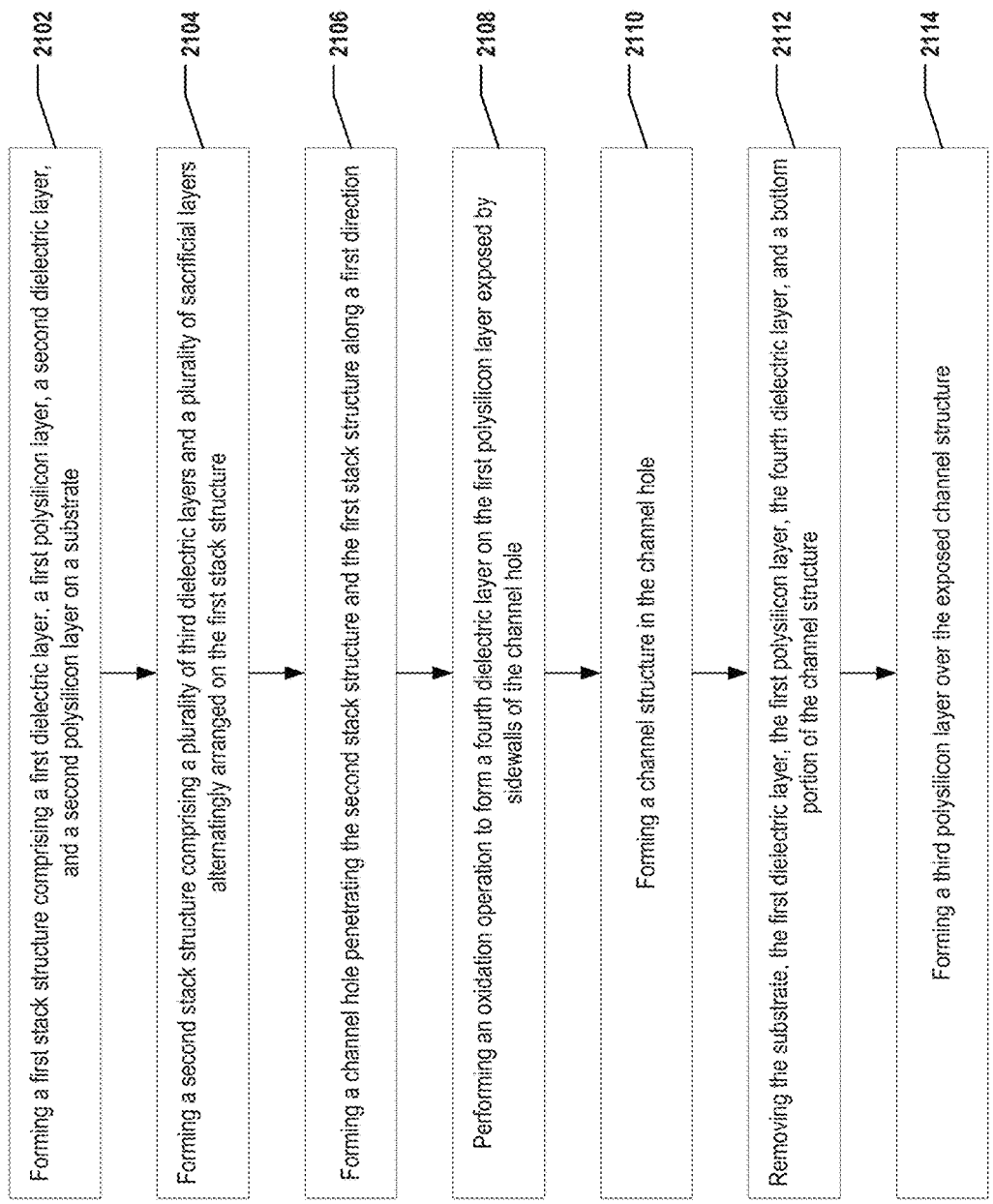
FIG. 21 illustrates a flowchart of an exemplary method for forming a 3D memory device, according to some aspects of the present disclosure.

FIGS. 4-20 illustrate cross-sections of 3D memory device 100 at different stages of a manufacturing process, according to some aspects of the present disclosure. FIG. 21 illustrates a flowchart of an exemplary method 2100 for forming 3D memory device 100, according to some aspects of the present disclosure. For the purpose of better describing the present disclosure, the cross-sections of 3D memory device 100 in FIGS. 4-20 and method 2100 in FIG. 21 will be discussed together. It is understood that the operations shown in method 2100 are not exhaustive and that other operations may be performed as well before, after, or between any of the illustrated operations. Further, some of the operations may be performed simultaneously, or in a different order than shown in FIGS. 4-20 and FIG. 21.

Figure 4:
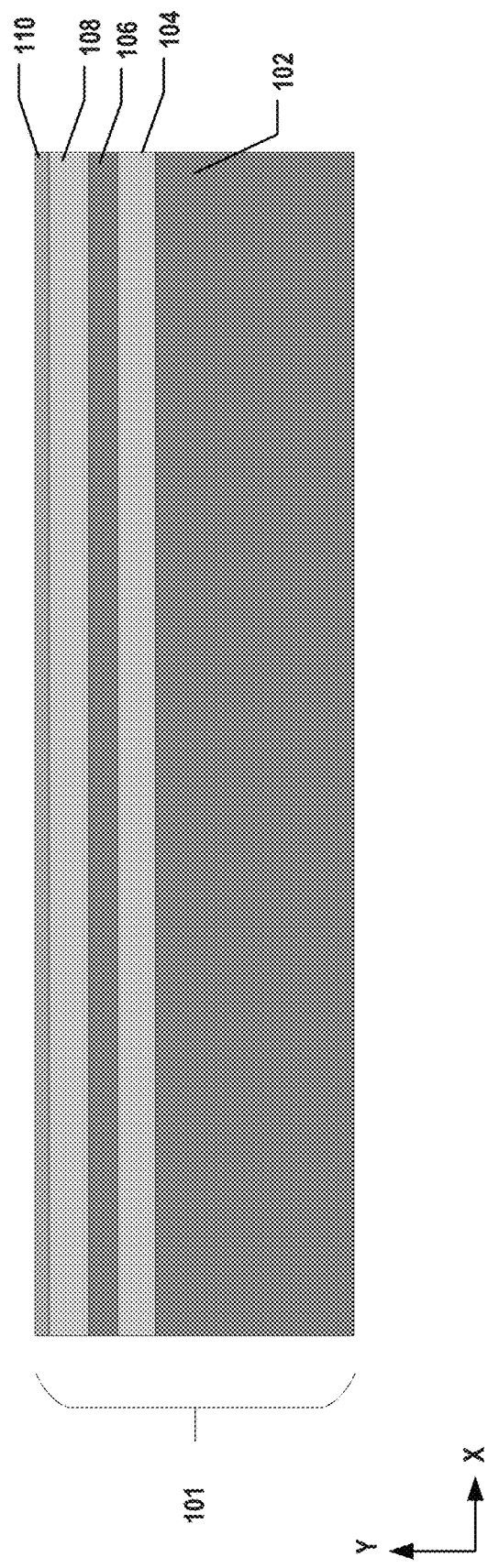
FIGS. 4-20 illustrate cross-sections of an exemplary 3D memory device at different stages of a manufacturing process, according to some aspects of the present disclosure.

As shown in FIG. 4 and operation 2102 in FIG. 21, a first stack structure 101 including a first dielectric layer 104, a first conductive layer 106, a second dielectric layer 108, and a second conductive layer 110 is formed on a substrate 102. In some implementations, substrate 102 may be a doped semiconductor layer. In some implementations, conductive layer 106 may be a polysilicon layer, and conductive layer 110 may be a polysilicon layer. In some implementations, first dielectric layer 104 and/or second dielectric layer 108 may include a layer of silicon oxide. In some implementations, first conductive layer 106 may include a doped polysilicon layer. In some implementations, first conductive layer 106 may include a p-doped polysilicon layer. In some implementations, second conductive layer 110 may include an undoped polysilicon layer. In some implementations, first dielectric layer 104, first conductive layer 106, second dielectric layer 108, and second conductive layer 110 may be sequentially deposited by one or more thin film deposition processes including, but not limited to, chemical vapor deposition (CVD), physical vapor deposition (PVD), atomic layer deposition (ALD), or any combination thereof. In some implementations, first stack structure 101 may include only one polysilicon layer, e.g., first conductive layer 106.

In some implementations, during the formation of first stack structure 101, an ammonia ($NH_3$) treatment may be performed on first conductive layer 106 and second conductive layer 110. In some implementations, the $NH_3$ treatment may be performed on top surfaces of first conductive layer 106 and second conductive layer 110. In some implementations, the $NH_3$ treatment on top surfaces of first conductive layer 106 and second conductive layer 110 may prevent an oxide layer formed along the x-direction on first conductive layer 106 and second conductive layer 110 in a later oxidation process.

Figure 5:
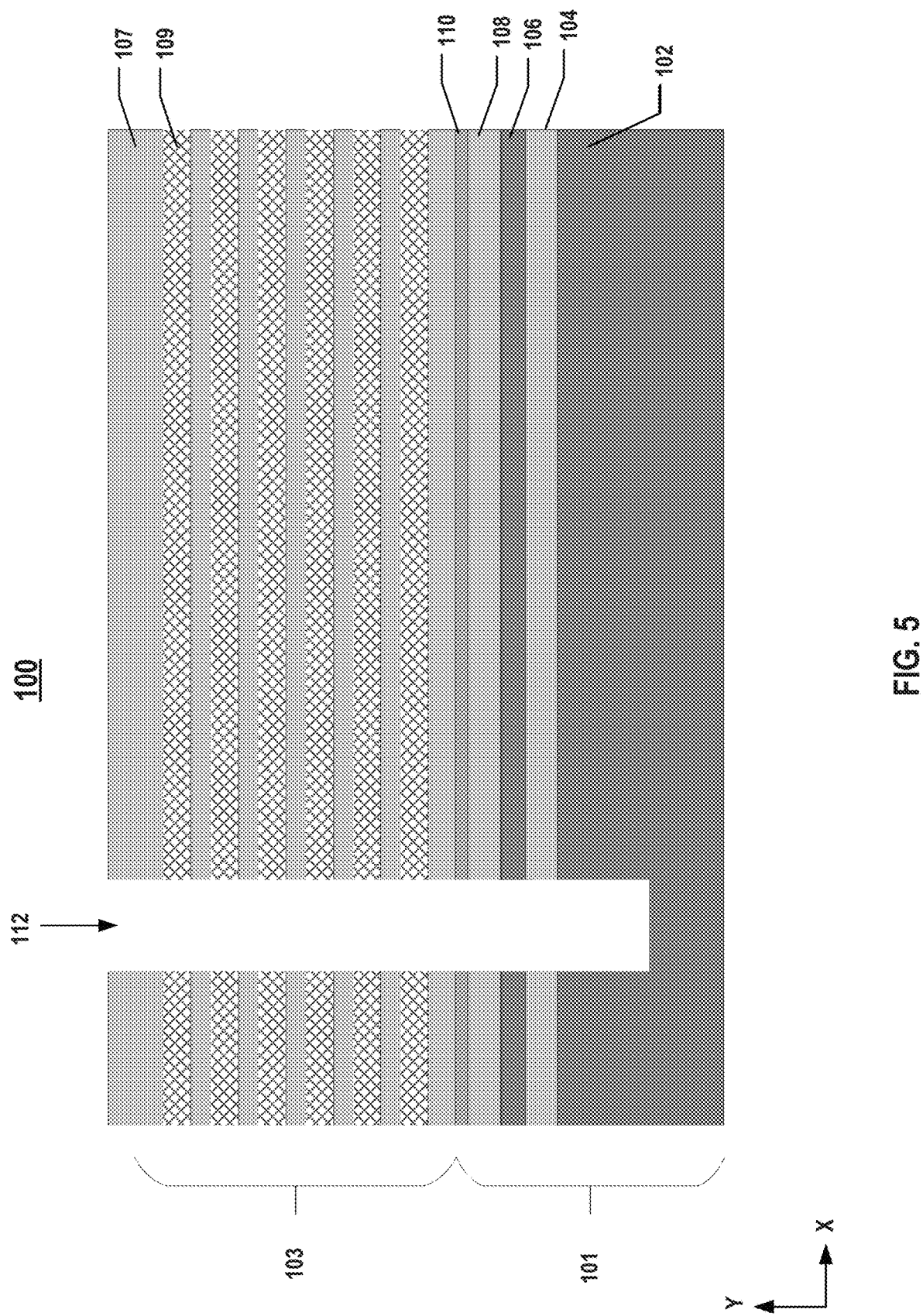

As shown in FIG. 5 and operation 2104 in FIG. 21, a second stack structure 103 including a plurality of third dielectric layers 107 and a plurality of sacrificial layers 109 alternatingly arranged is formed on first stack structure 101. The dielectric/sacrificial layer pairs may include interleaved third dielectric layers 107 and sacrificial layers 109 extending along the x-direction and a plane perpendicular to the y-direction. In some implementations, each third dielectric layer 107 may include a layer of silicon oxide, and each sacrificial layer 109 may include a layer of silicon nitride. The second stack structure 103 may be formed by one or more thin film deposition processes including, but not limited to, CVD, PVD, ALD, or any combination thereof.

Further referring to FIG. 5 and operation 2106 in FIG. 21, a channel hole 112 is formed in second stack structure 103 and first stack structure 101 along a first direction (y-direction). In some implementations, channel hole 112 may penetrate second stack structure 103 and extend to the top surface of first conductive layer 106. In some implementations, channel hole 112 may extend to the middle of first conductive layer 106, as shown in FIG. 20. In some implementations, channel hole 112 may penetrate second stack structure 103 and first conductive layer 106 and expose the substrate, as shown in FIG. 5. As shown in FIG. 5, the first dielectric layer, first conductive layer 106, the second dielectric layer, and second conductive layer 110 are exposed by the sidewalls of channel hole 112. In some implementations, fabrication processes for forming channel hole 112 may include wet etching and/or dry etching, such as deep reactive ion etching (DRIE). In some implementations, channel hole 112 may extend further into the top portion of the substrate.

Figure 6:
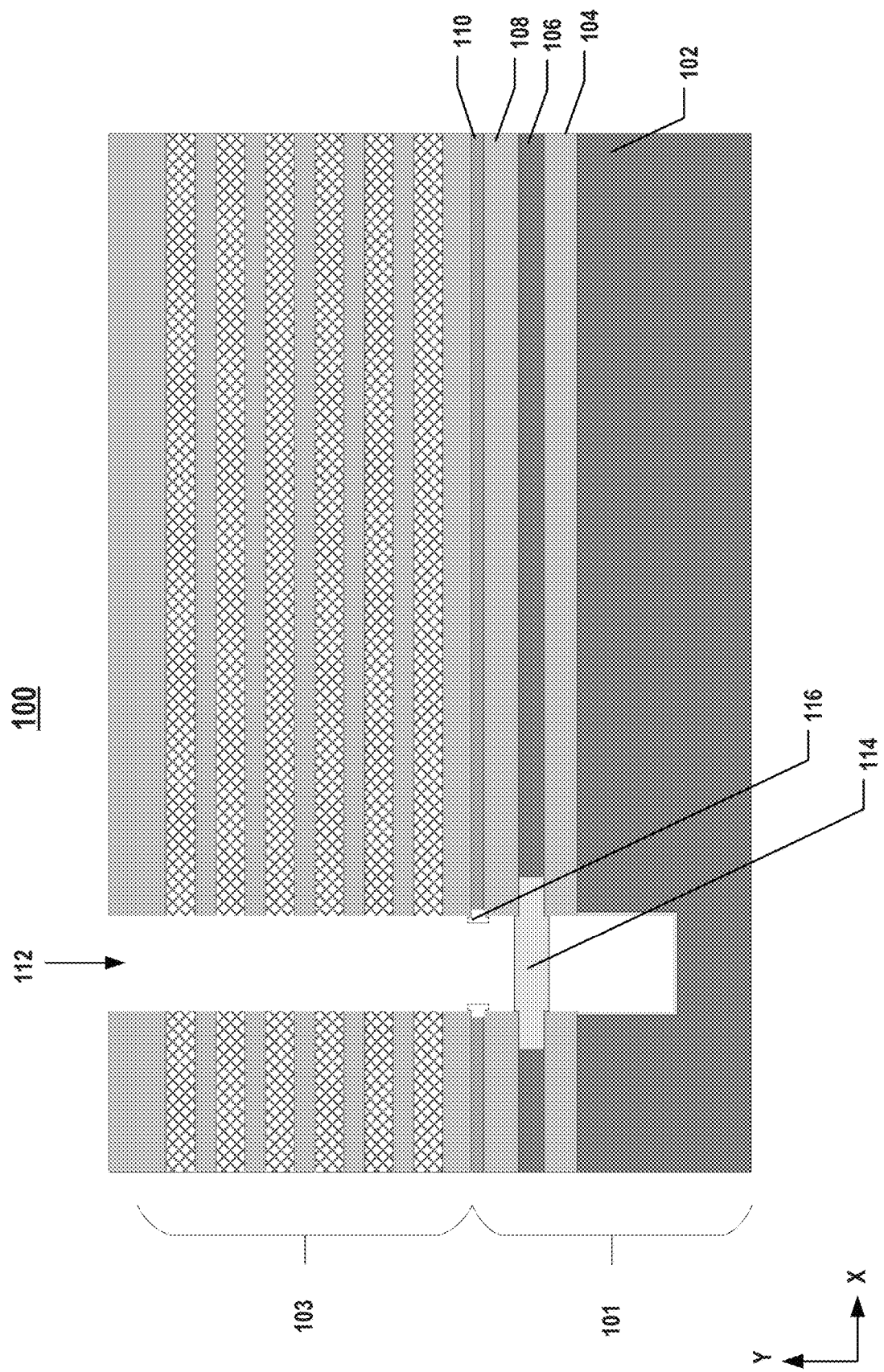

As shown in FIG. 6 and operation 2108 in FIG. 21, an oxidation operation is performed to form a fourth dielectric layer 114 on first conductive layer 106 exposed by sidewalls of channel hole 112. In some implementations, because the $NH_3$ treatment is performed on top surfaces of first conductive layer 106 and second conductive layer 110 during the formation of the first stack structure, fourth dielectric layer 114 may be formed on first conductive layer 106 exposed by sidewalls of channel hole 112 along the x-direction which is a plane perpendicular to the y-direction.

In the plan view of 3D memory device 100, channel hole 112 may be a circle, and the exposed sidewall is the circumference of the circle. In some implementations, the formation of fourth dielectric layer 114 begins from the circumference of the circle on first conductive layer 106, and then extends to the center of the circle.

In some implementations, based on the formation speed of fourth dielectric layer 114, fourth dielectric layer 114 formed on one side of first conductive layer 106 in channel hole 112 may be in contact with fourth dielectric layer 114 formed on the other side of first conductive layer 106. In some implementations, fourth dielectric layer 114 formed on one side of first conductive layer 106 in channel hole 112 may be separated with fourth dielectric layer 114 formed on the other side of first conductive layer 106 by a gap. It is understood that the one side or the other side of channel hole 112 described here are the viewpoints from the cross-sectional view. In the actual structure, from a plan view, channel hole 112 may be a hole, and fourth dielectric layer 114 formed on first conductive layer 106 may be formed from the circumference to the center. In some implementations, in the plan view, fourth dielectric layer 114 formed on first conductive layer 106 may cover the whole channel hole 112. In some implementations, in the plan view, fourth dielectric layer 114 formed on first conductive layer 106 may have a gap (a hole) at the center of channel hole 112. In some implementations, the width of the gap may be controlled during the formation operation, and the size of the gap may further cause various structures of the memory film formed in a later process. In some implementations, the width of the gap may be controlled to cause parts of the memory film or the whole memory film filled in the gap. For example, the blocking layer may be formed, filling the gap.

In some implementations, fifth dielectric layer 116 may be formed on second conductive layer 110 exposed by sidewalls of channel hole 112. Because first conductive layer 106 includes doped polysilicon, and second conductive layer 110 includes undoped polysilicon, the formation speed of fourth dielectric layer 114 may be higher than fifth dielectric layer 116. Hence, the area of fourth dielectric layer 114 may be larger than the area of fifth dielectric layer 116. It is understood that in the cross-sectional view of FIG. 6, fifth dielectric layer 116 is formed from two sides of second conductive layer 110, however, in the plan view of the structure, fifth dielectric layer 116 is formed on second conductive layer 110 from the circumference to the center.

Figure 7:
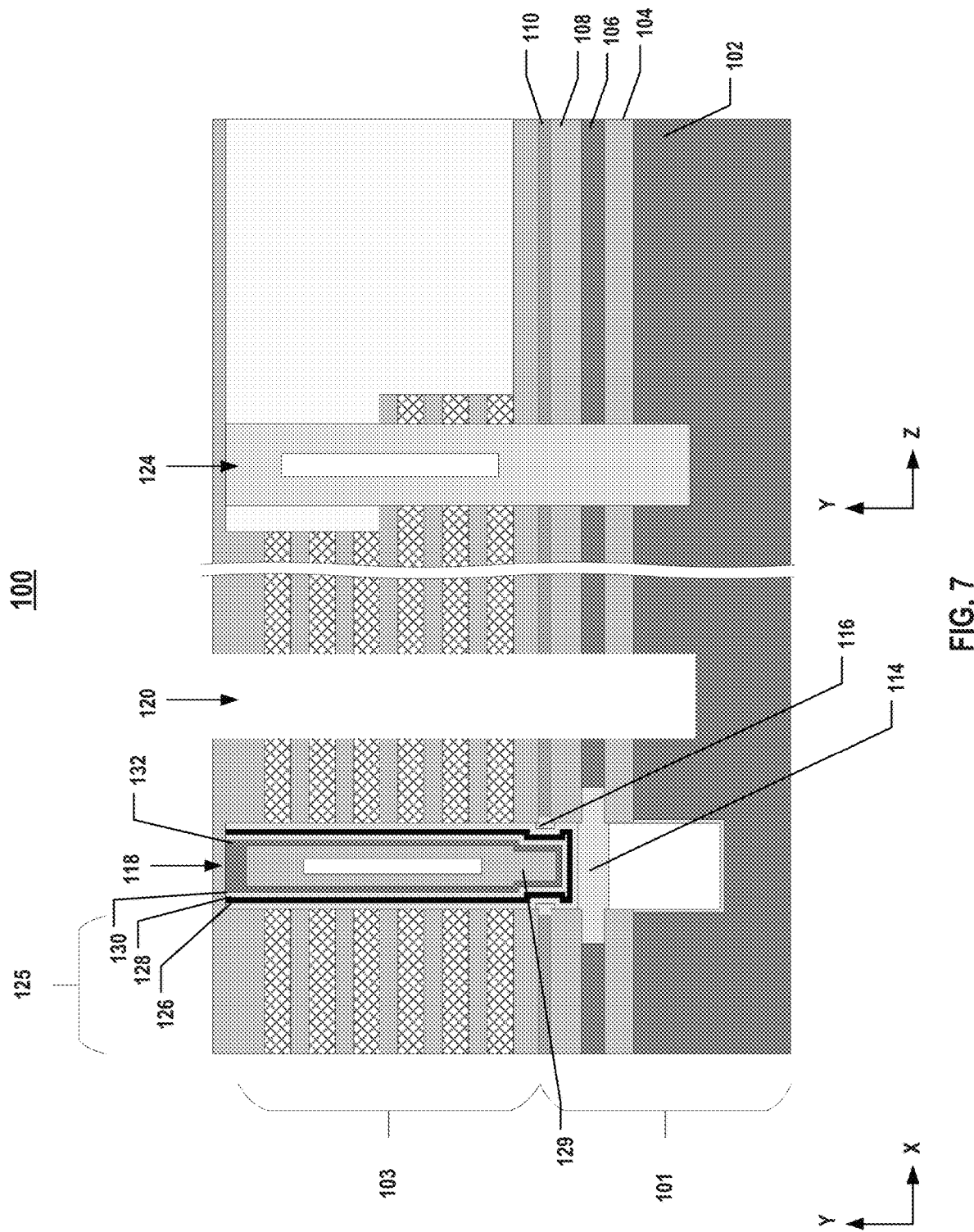

As shown in FIG. 7 and operation 2110 in FIG. 21, channel structure 118 may be formed in channel hole 112. Channel structure 118 may include memory film 125 and semiconductor channel 132. In some implementations, channel structure 118 may also include dielectric core 129 in the center of channel structure 118. In some implementations, memory film 125 is a composite layer including tunneling layer 130, storage layer 128 (also known as a "charge trap layer"), and blocking layer 126. Channel structure 118 can have a cylinder shape (e.g., a pillar shape), and the bottom portion of the cylinder shape may be shrunk at the portion having fifth dielectric layer 116 formed on sidewalls of channel hole 112. In some implementations, channel structure 118 may be a cone shape, and the bottom portion of the cone shape is smaller than the upper portion of the cone shape. In this situation, the bottom portion of the cone shape may be shrunk at the portion having fifth dielectric layer 116 formed on sidewalls of channel hole 112.

Dielectric core 129, semiconductor channel 132, tunneling layer 130, storage layer 128, and blocking layer 126 are arranged radially from the center toward the outer surface of the pillar in this order, according to some implementations. In some implementations, tunneling layer 130 may include silicon oxide, silicon oxynitride, or any combination thereof. In some implementations, storage layer 128 may include silicon nitride, silicon oxynitride, silicon, or any combination thereof. In some implementations, blocking layer 126 may include silicon oxide, silicon oxynitride, high dielectric constant (high-k) dielectrics, or any combination thereof. In one example, memory film 125 may include a composite layer of silicon oxide/silicon oxynitride (or silicon nitride)/silicon oxide (ONO).

As shown in FIG. 7, a gate line slit opening 120 may be further formed in second stack structure 103 and first stack structure 101 along the y-direction. Gate line slit opening 120 may be formed by performing dry etch, wet etch, or other suitable processes. In some implementations, gate line slit opening 120 may extend to substrate 102.

Figure 8:
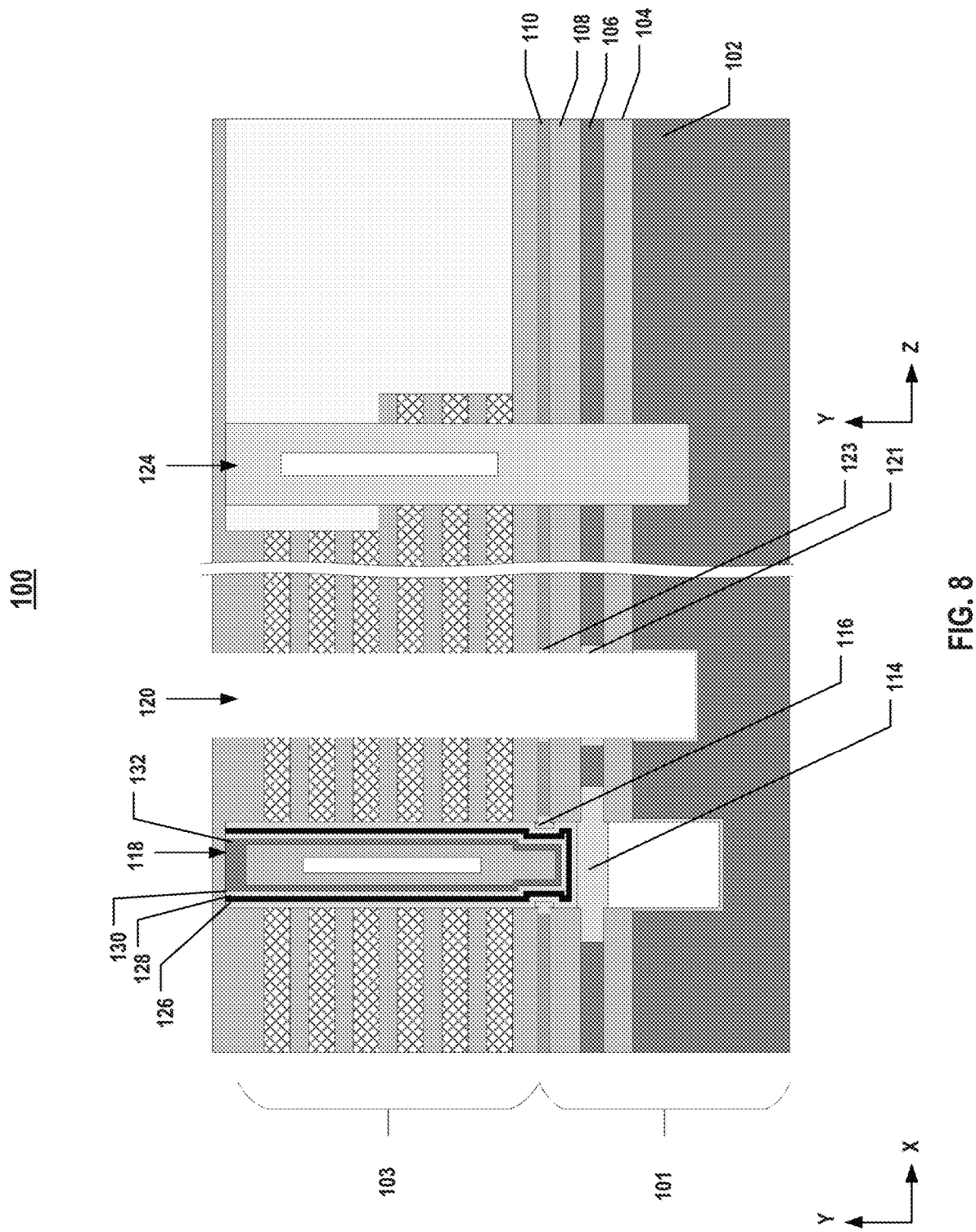

As shown in FIG. 8, a polysilicon oxidation operation may be further performed in gate line slit opening 120 to form an oxide layer 121 on first conductive layer 106 and an oxide layer 123 on second conductive layer 110 exposed by gate line slit opening 120. The oxide layer 121 and 123 formed on first conductive layer 106 and second conductive layer 110 may protect first conductive layer 106 and second conductive layer 110 during a later etch process of the word line replacement operation.

Figure 9:
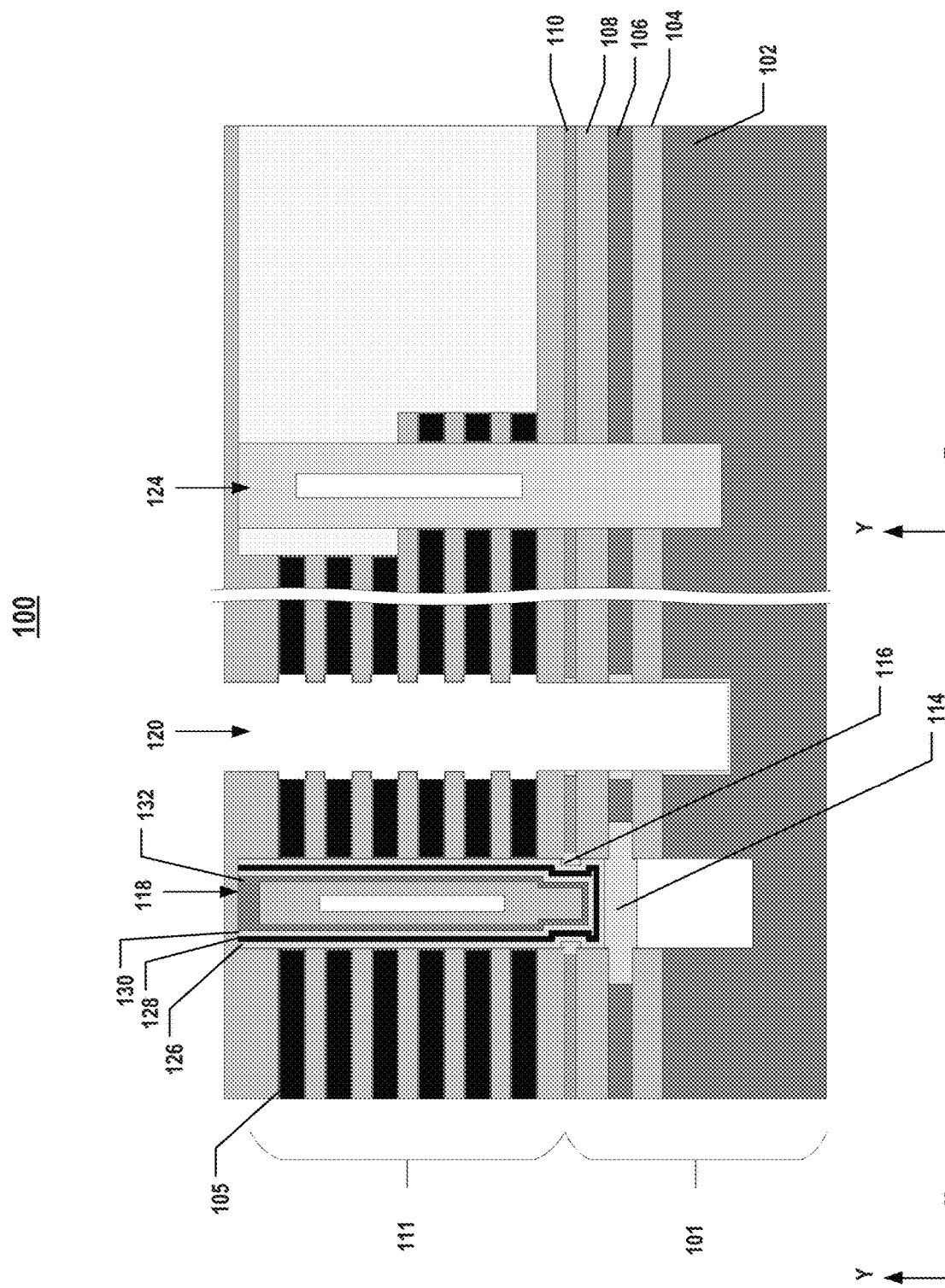

As shown in FIG. 9, a word line replacement operation is performed, and sacrificial layers 109 may be removed and replaced by word lines 105, which are conductive layers 105 in FIG. 1. For example, sacrificial layers 109 may be removed by dry etch, wet etch, or other suitable processes to form a plurality of cavities. Word lines 105 may be formed in the cavities by sequentially depositing the gate dielectric layer made from high-k dielectric materials, the adhesion layer including titanium/titanium nitride (Ti/TiN) or tantalum/tantalum nitride (Ta/TaN), and the gate conductor made from tungsten. After the word line replacement operation, stack structure 111 is formed, as shown in FIG. 9.

Figure 10:
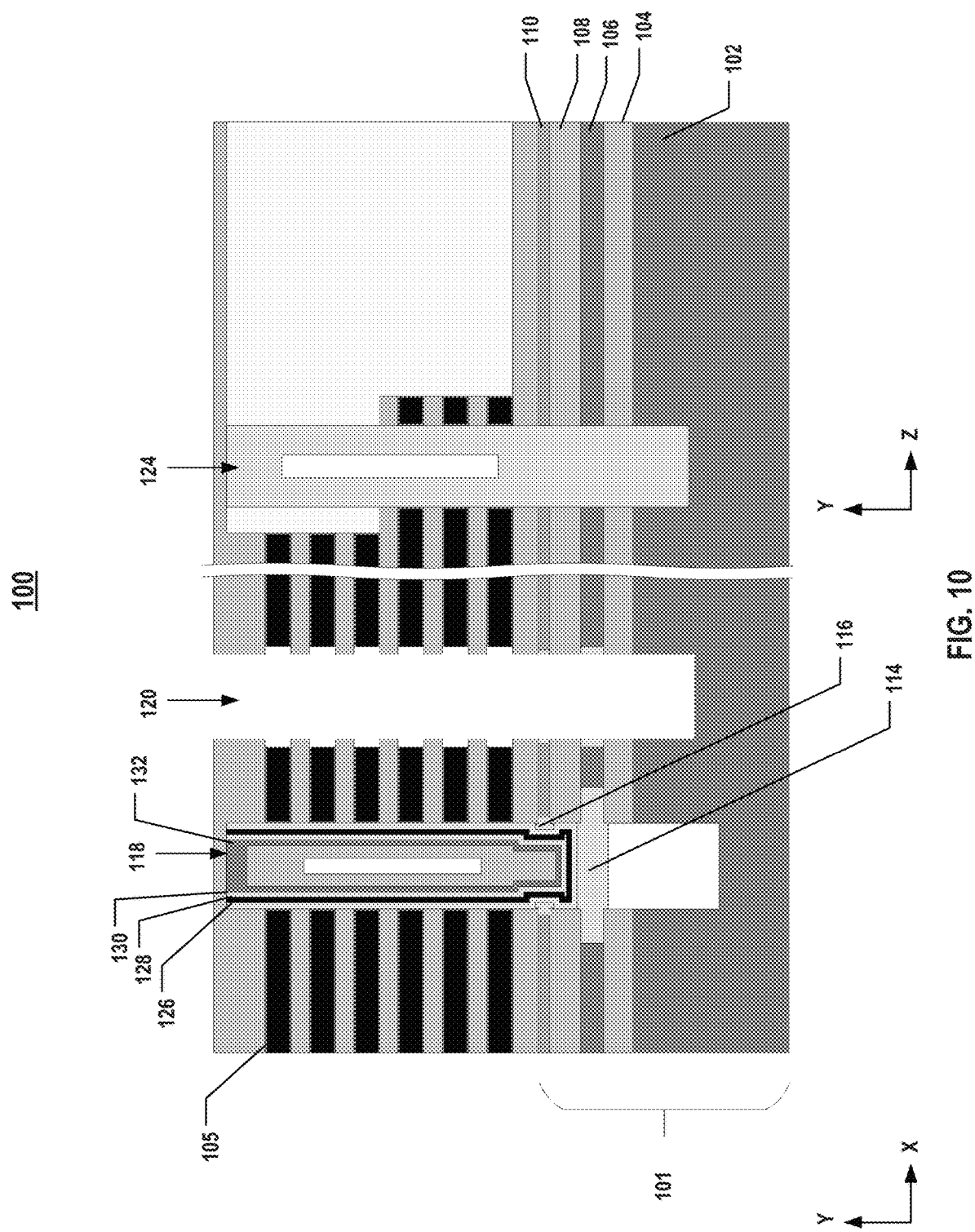

As shown in FIG. 10, a removal process may be performed to clean gate line slit opening 120. The removal process may remove the residues of former procedures from gate line slit opening 120. For example, the high-k dielectric materials may be removed from gate line slit opening 120.

Figure 11:
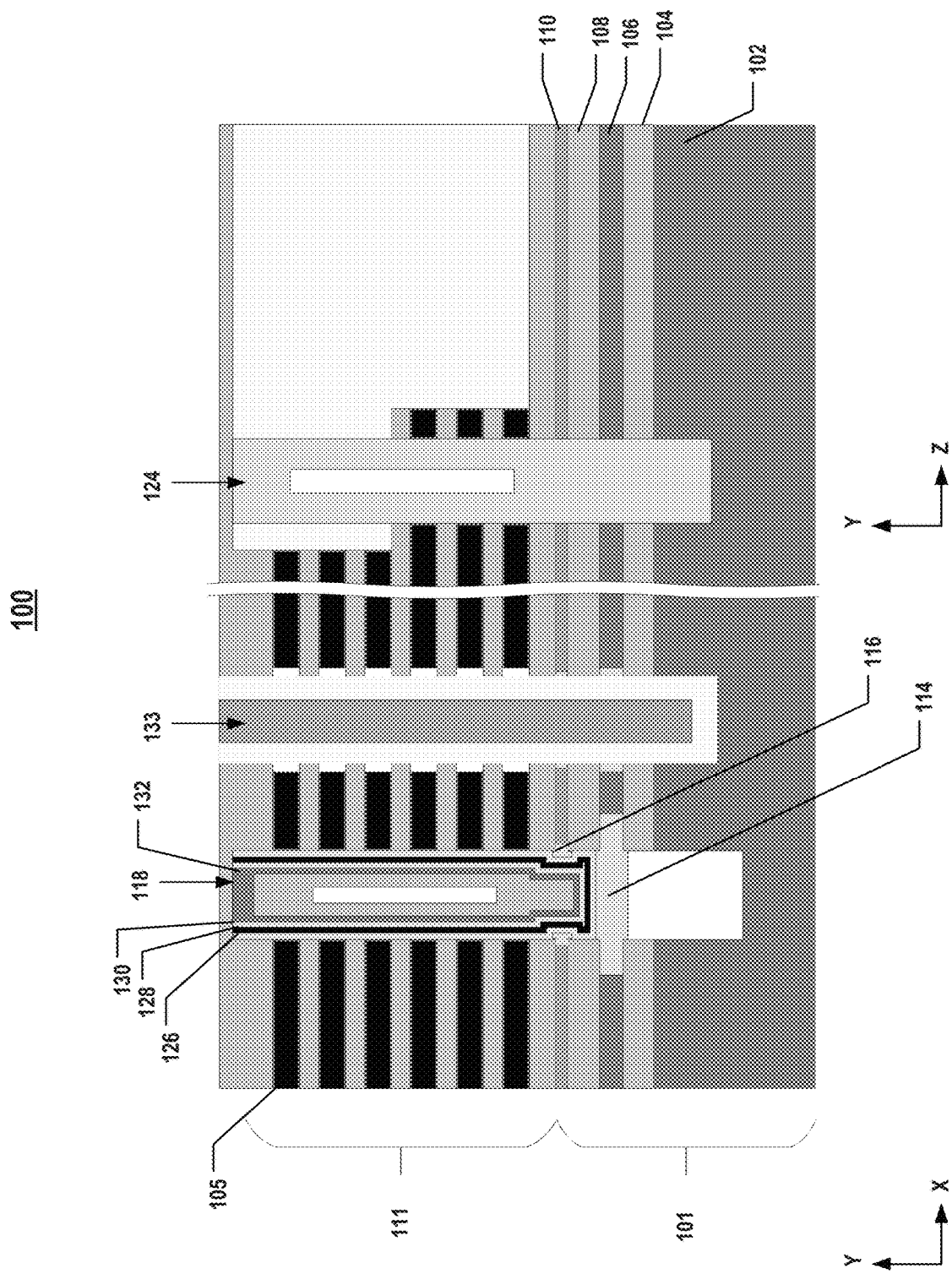

As shown in FIG. 11, a gate line slit 133 may be formed in gate line slit opening 120. In some implementations, gate line slit 133 may include a dielectric layer. In some implementations, gate line slit 133 may further include one or more conductive layers, such as polysilicon, tungsten (W), or the combination of polysilicon and W.

Figure 12:
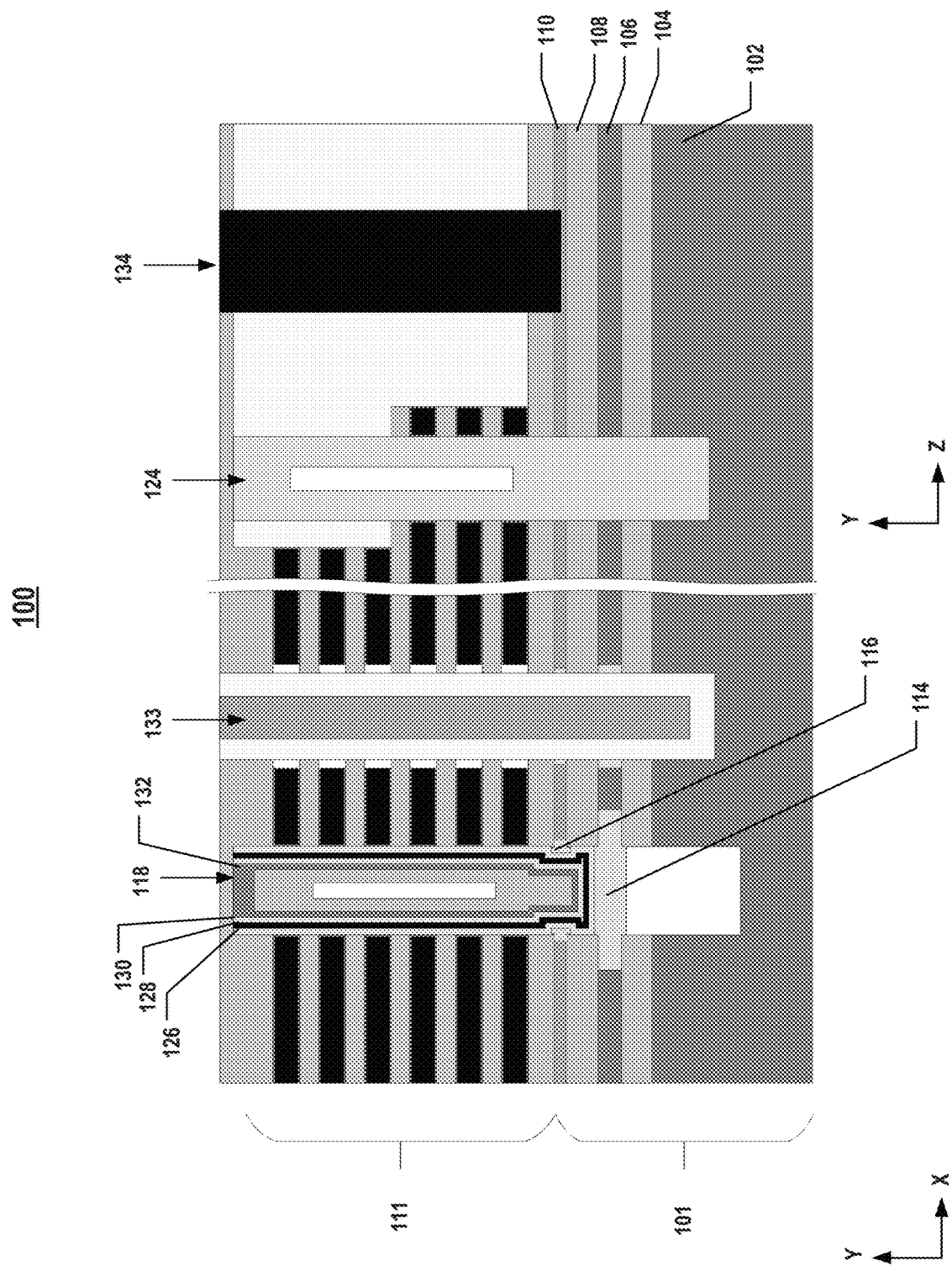

As shown in FIG. 12, dummy channel structure 124 may be formed in stack structure 111 extending along the y-direction. In some implementations, contact structure 134 may be formed in stack structure 111 extending along the y-direction. In some implementations, contact structure 134 may be in contact with second conductive layer 110.

In some implementations, gate line slit 133 may be formed before the word line replacement operation. In some implementation, after forming gate line slit 133, dummy channel structure 124, and contact structure 134 on substrate 102, one or more interconnection layers may be further formed on the memory array. In addition, a peripheral circuit may be formed on another substrate and be bonded with the memory array in a later process.

Figure 13:
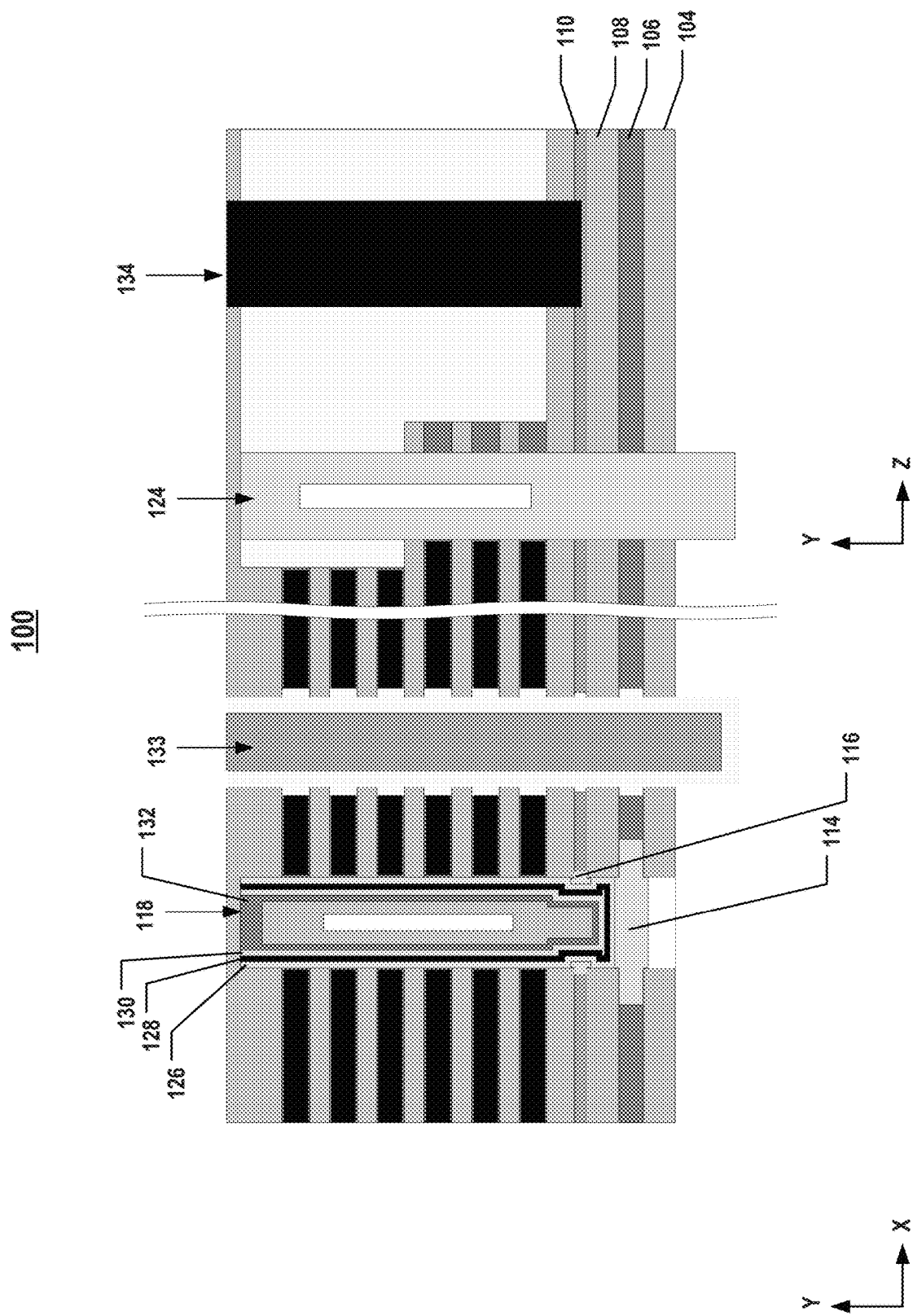
Figure 22:
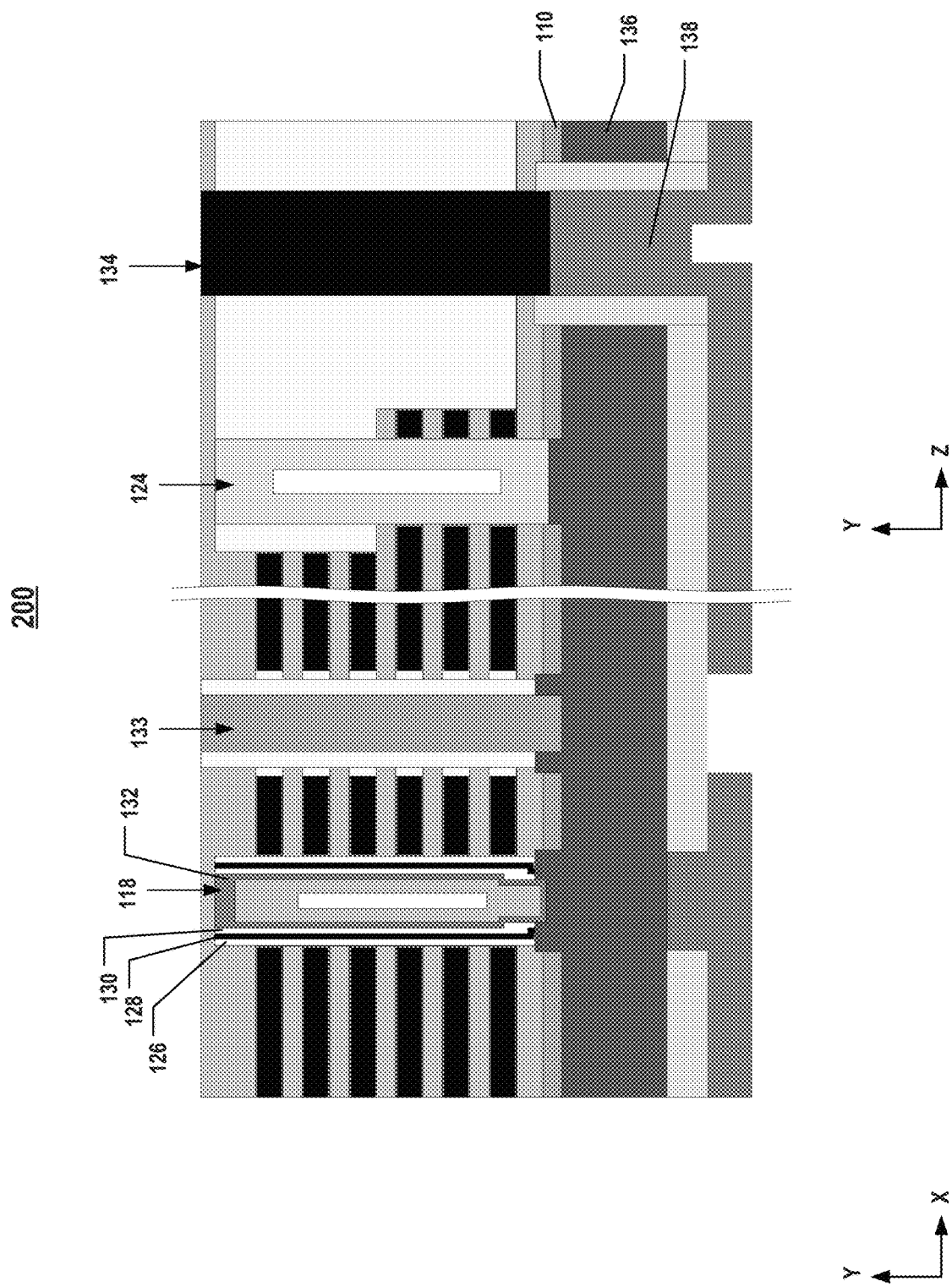
FIG. 22 illustrates a cross-section of an exemplary 3D memory device, according to some aspects of the present disclosure.
Figure 23:
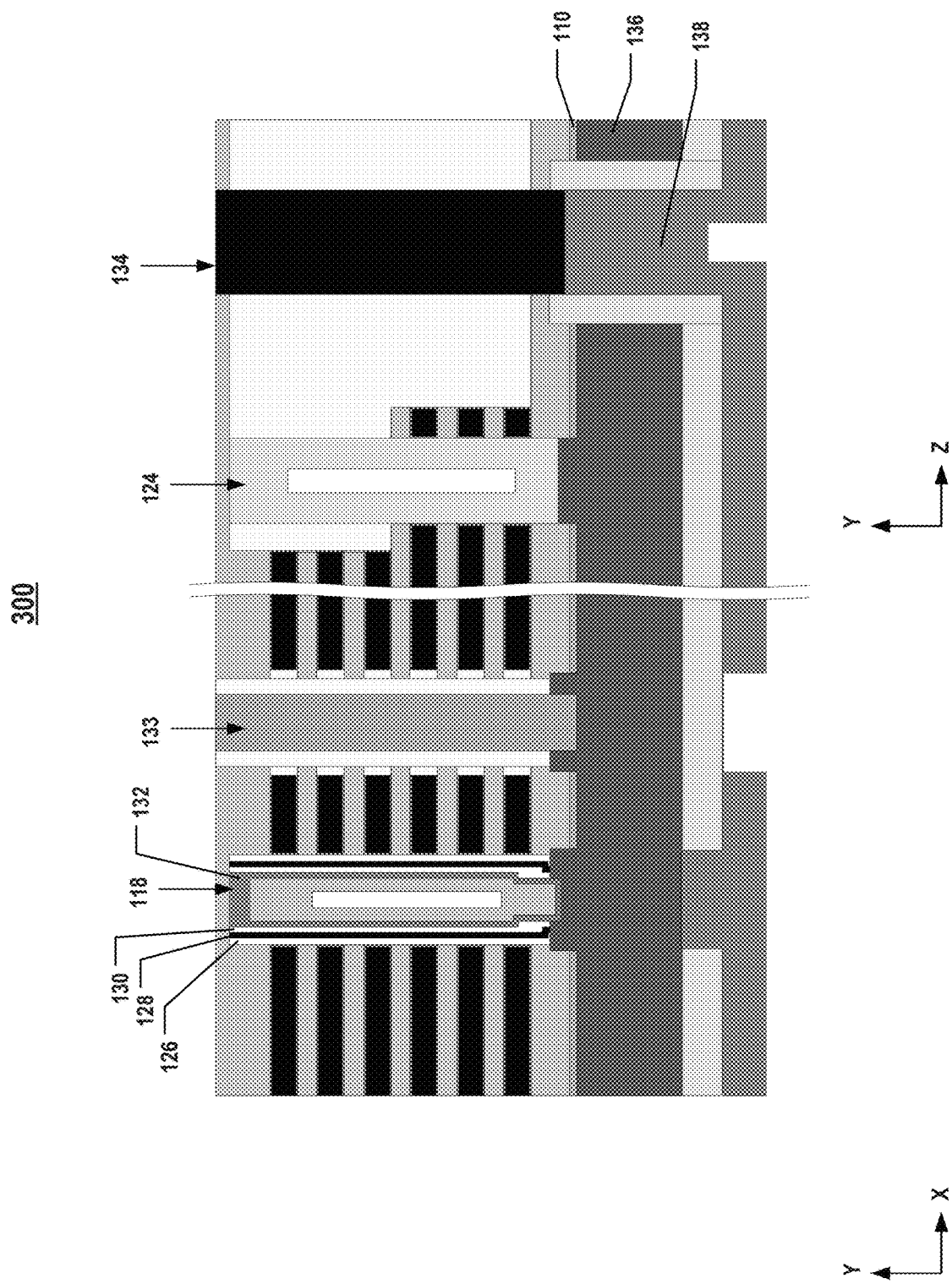
FIG. 23 illustrates a cross-section of another exemplary 3D memory device, according to some aspects of the present disclosure.

As shown in FIG. 13 and operation 2112 in FIG. 21, a substrate removal operation is performed. In some implementations, substrate 102 may be removed by the wet etch, dry etching, or other suitable processes until being stopped by first dielectric layer 104. When using wet etch to remove substrate 102, the bottom surface of channel structure 118 is higher than the bottom surfaces of gate line slit 133 and dummy channel structure 124, and therefore in the final structure, the bottom surface of semiconductor channel 132 is higher than the bottom surfaces of gate line slit 133 and dummy channel structure 124. In some implementations, substrate 102 may be removed by chemical mechanical polishing (CMP) processes, and the bottom portion of gate line slit 133 and dummy channel structure 124 may be removed together, as shown in FIGS. 22 and 23.

In some implementations, substrate 102 may be peeled off. In some implementations, in which substrate 102 includes silicon and the stop layer (first dielectric layer 104) includes a dielectric layer, e.g., silicon oxide or silicon nitride, substrate 102 may be removed using silicon CMP, which can be automatically stopped when reaching the stop layer having materials other than silicon, i.e., acting as a backside CMP stop layer. In some implementations, substrate 102 is removed using wet etching by tetramethylammonium hydroxide (TMAH), which is automatically stopped when reaching the stop layer having materials other than silicon, i.e., acting as a backside etch stop layer.

Figure 14:
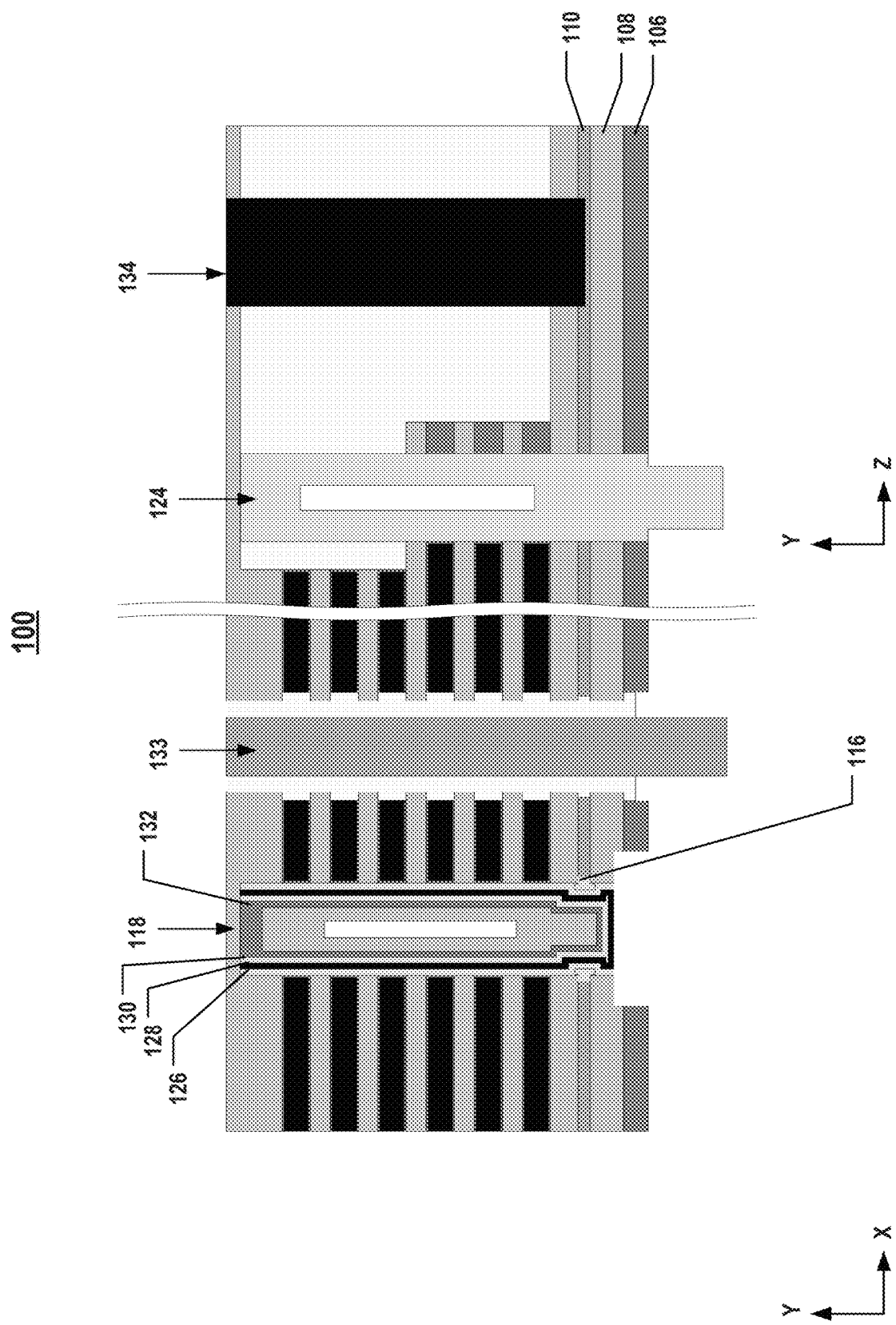

Then, as shown in FIG. 14 and operation 2114 in FIG. 21, first dielectric layer 104 and fourth dielectric layer 114 are removed. In some implementations, first dielectric layer 104 and fourth dielectric layer 114 may be removed by wet etch, dry etch, CMP, or other suitable processes. After removing first dielectric layer 104 and fourth dielectric layer 114, the bottom portion of channel structure 118 is exposed. In some implementations, the bottom portion of the dielectric layer of gate line slit 133 is also removed. In some implementations, a portion of blocking layer 126 may also be removed with fourth dielectric layer 114.

Because channel structure 118 is formed on fourth dielectric layer 114 as shown in FIG. 7, and fourth dielectric layer 114 is formed by the polysilicon oxidation operation as shown in FIG. 6, before removing first dielectric layer 104 and fourth dielectric layer 114, the bottom of channel structure 118, which is the bottommost position of blocking layer 126, can be controlled coplanar to the top surface of first conductive layer 106, or a slightly above the top surface of first conductive layer 106. After removing portions of the memory film in a later process, the bottom surface of semiconductor channel 132 may be above first conductive layer 106, coplanar to the bottom surface of second conductive layer 110, coplanar to the top surface of second conductive layer 110, in between the bottom surface and the top surface of second conductive layer 110, coplanar to the bottom surface of the bottommost layer of third dielectric layers 107, or above the bottom surface of the bottommost layer of third dielectric layers 107. Hence, by using the polysilicon oxidation operation performed on first conductive layer 106, the depth of channel structure 118 can be controlled in a predefined range, and the depth or the bottom profile of channel structure 118 will not be affected by the residues formed in channel hole 112. The control of channel profile is therefore improved.

Figure 15:
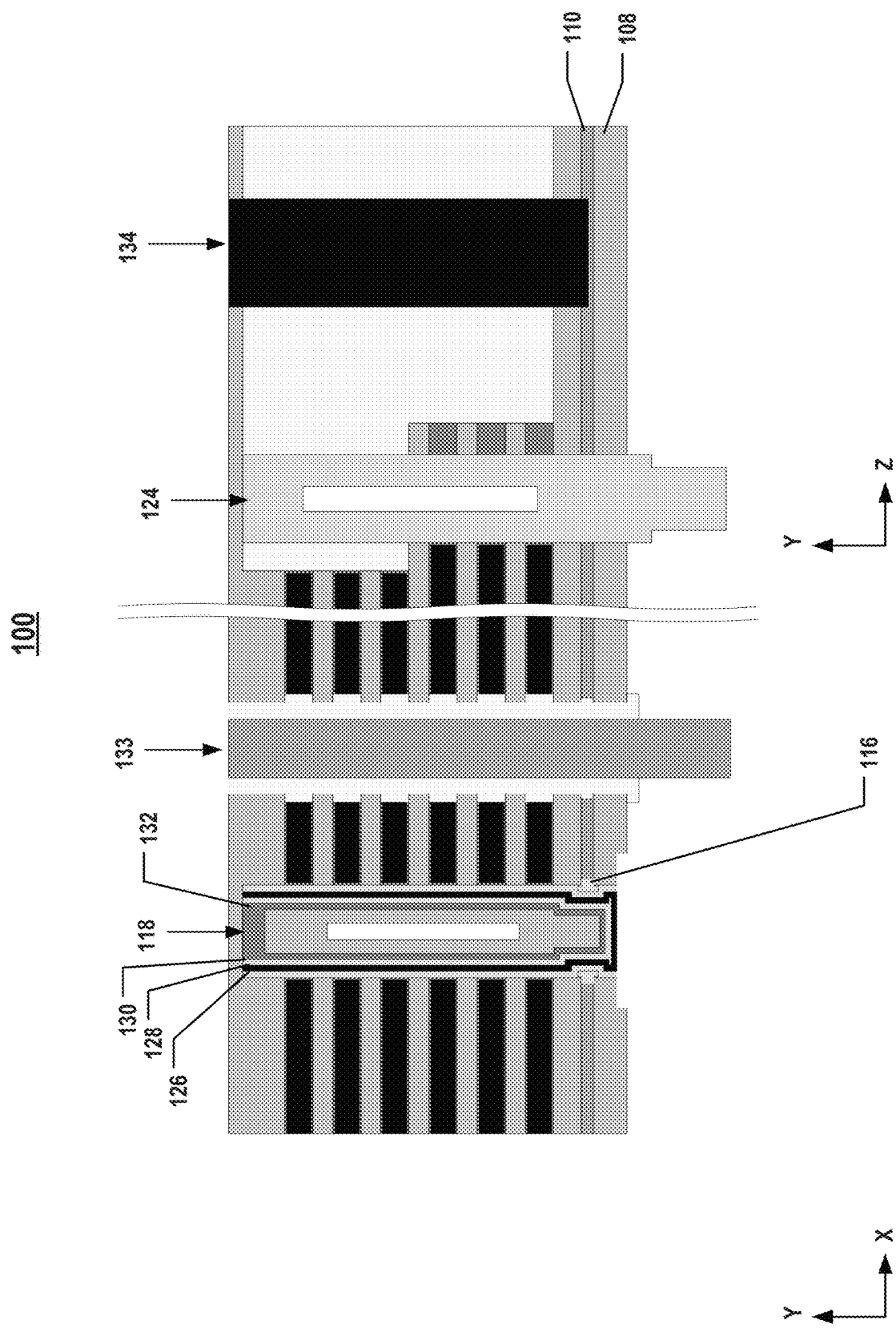

Then, as shown in FIG. 15 and operation 2112 in FIG. 21, first conductive layer 106 is removed. In some implementations, first conductive layer 106 may be removed by wet etch, dry etch, CMP, or other suitable processes.

Figure 16:
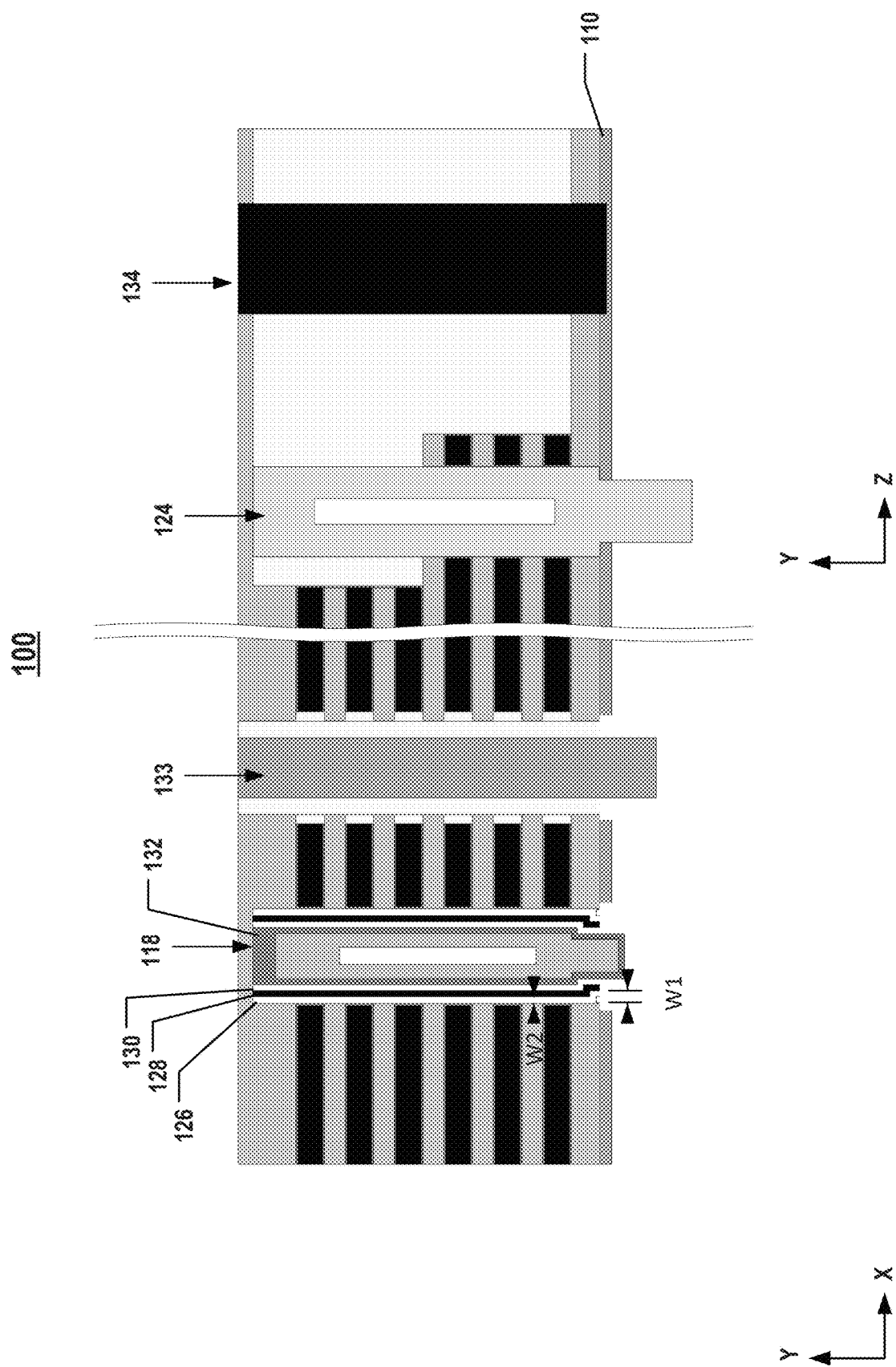

As shown in FIG. 16, second dielectric layer 108 is removed to expose second conductive layer 110, and a portion of the memory film is removed to expose portions of tunneling layer 130, storage layer 128, and blocking layer 126. In some implementations, second dielectric layer 108 and the portion of the memory film are removed by one etch process. In some implementations, second dielectric layer 108 and the portion of the memory film are removed by multiple etch processes. For example, second dielectric layer 108 may be removed first. Storage layer 128 including silicon nitride is selectively removed using wet etching with suitable etchants, such as phosphoric acid, without etching second conductive layer 110. The etching of storage layer 128 may be controlled by controlling the etching time and/or etching rate, such that the etching does not continue to affect the rest of storage layer 128 surrounded by the memory stack. Then, blocking layer 126 and tunneling layer 130 including silicon oxide may be selectively removed using wet etching with suitable etchants, such as hydrofluoric acid, without etching second conductive layer 110 and semiconductor channel 132 including polysilicon. The etching of blocking layer 126 and tunneling layer 130 may be controlled by controlling the etching time and/or etching rate, such that the etching does not continue to affect the rest of blocking layer 126 and tunneling layer 130 surrounded by the memory stack. In some implementations, after removing the portion of the memory film, the bottom surfaces of the exposed portions of tunneling layer 130, storage layer 128, and blocking layer 126 are above the bottom surface of semiconductor channel 132.

In some implementations, in operation 2112, the removal order of first dielectric layer 104, fourth dielectric layer 114, and first conductive layer 106 may be different. In some implementations, after removing substrate 102 as shown in FIG. 13, first dielectric layer 104 may be removed individually and fourth dielectric layer 114 may be kept. Then, first conductive layer 106 around fourth dielectric layer 114 is removed. After that, fourth dielectric layer 114 may be removed with second dielectric layer 108 in the same process.

Because during the formation of channel structure 118, fifth dielectric layer 116 forms a protrusion on sidewalls of channel hole 112 along the x-direction, the bottom portion of the cylinder shape of channel structure 118 is affected by fifth dielectric layer 116 and forms a shrunk structure, or a depression, as shown in FIG. 7. After the bottom portion of the memory film is removed, in some implementations, the exposed portions of tunneling layer 130 and storage layer 128 may have a critical dimension (or a diameter from the plan view) smaller than tunneling layer 130 and storage layer 128 located at the upper portion of channel structure 118, as shown in FIG. 16. Furthermore, in some implementations, the exposed portion of semiconductor channel 132 at the bottom portion of channel structure 118 has a critical dimension (or a diameter from the plan view) smaller than semiconductor channel 132 located at the upper portion of channel structure 118 as well, as shown in FIG. 16.

In some implementations, second dielectric layer 108 may be removed by CMP process, and the bottom surface of gate line slit 133 and the bottom surface of dummy channel structure 124 may be coplanar to or substantially coplanar to the bottom surface of second conductive layer 110, as shown in FIG. 22 or 23.

Because fifth dielectric layer 116 is formed on second conductive layer 110 by the polysilicon oxidation operation as shown in FIG. 6, and the memory film is formed on fifth dielectric layer 116 thereafter, blocking layer 126, storage layer 128, and tunneling layer 130 may not be a straight structure along the y-direction. The bottom portion of blocking layer 126 may have a width W1 larger than a width W2 of the upper portion of blocking layer 126, as shown in FIG. 16. Furthermore, storage layer 128, and tunneling layer 130 may form an angled structure at the bottom of the memory film.

Figure 17:
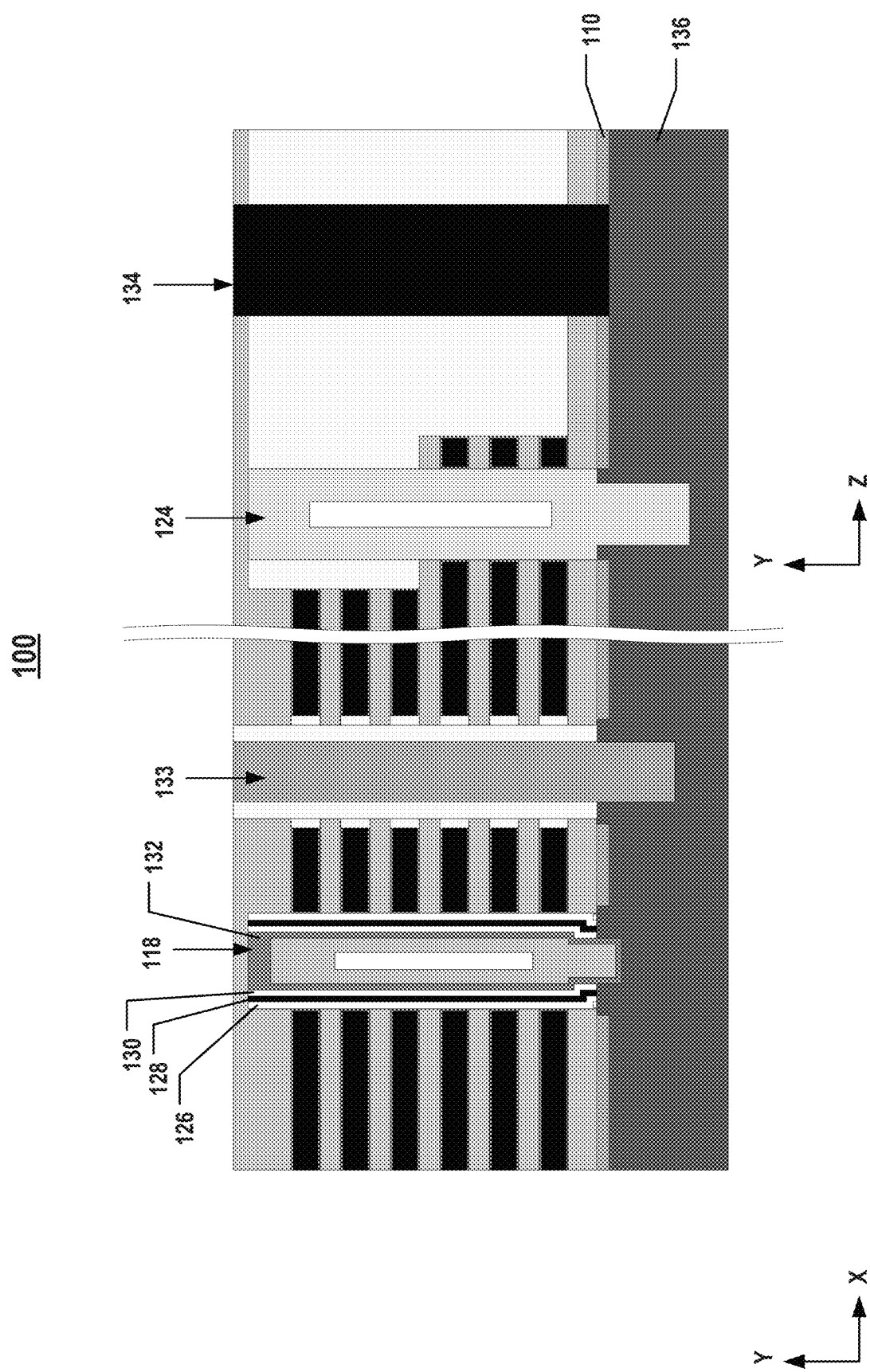

As shown in FIG. 17, a third conductive layer 136 is formed over the exposed channel structure 118 and second conductive layer 110. In some implementations, third conductive layer 136 may be a polysilicon layer. In some implementations, third conductive layer 136 may be formed by CVD, PVD, ALD, or other suitable processes.

Figure 18:
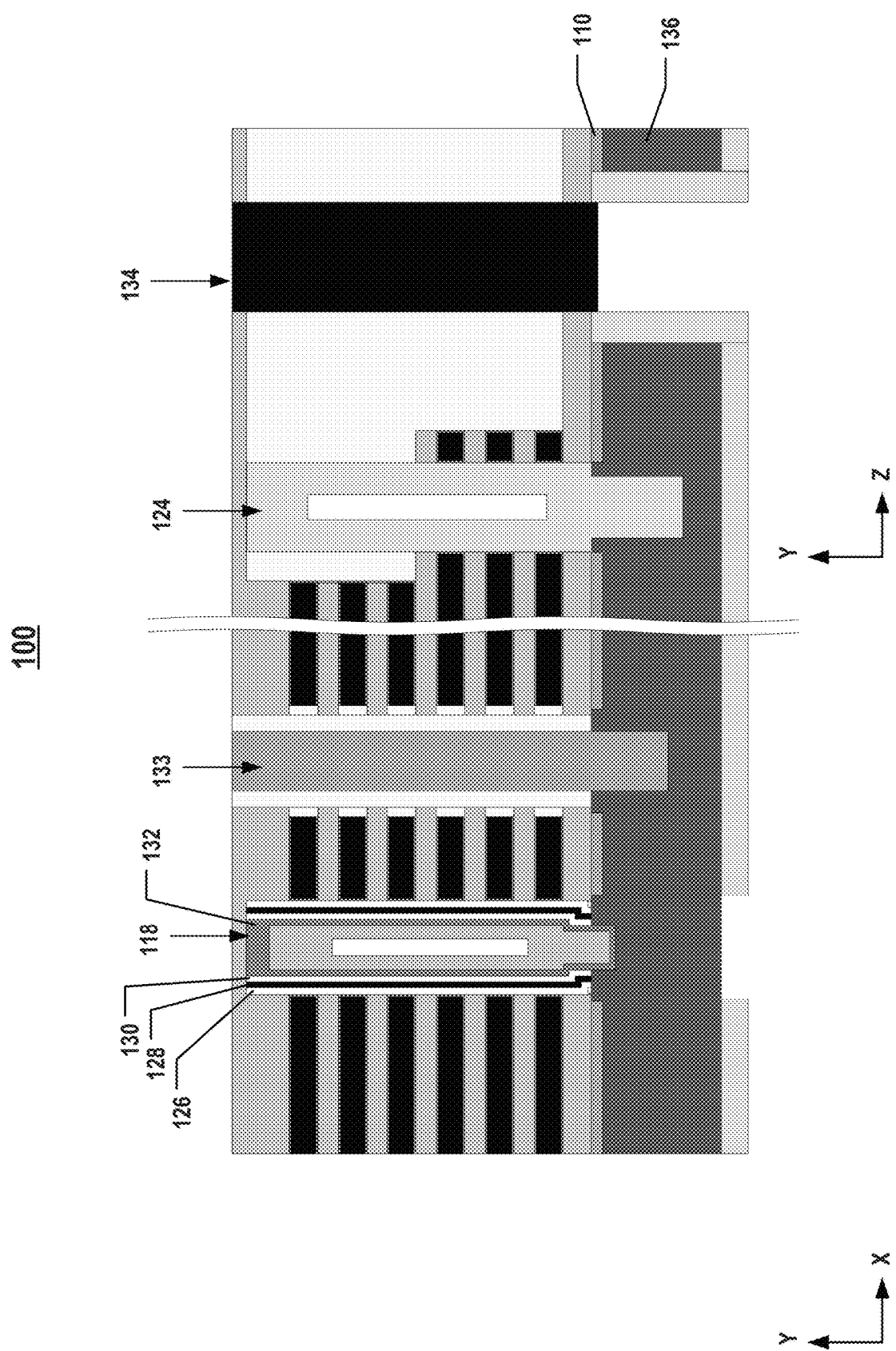
Figure 19:
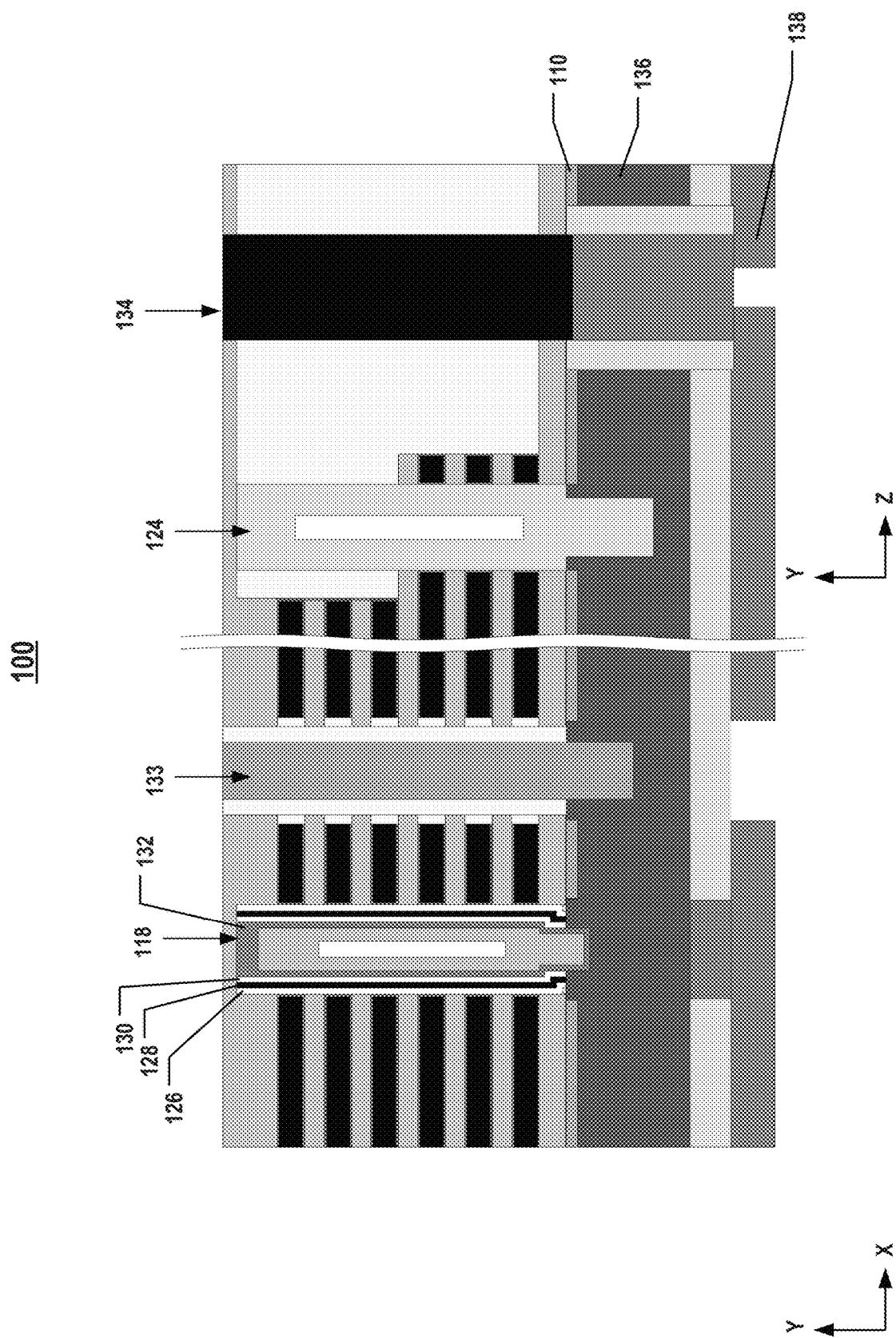

As shown in FIG. 18, a through silicon contact (TSC) is formed to expose the contact structure. As shown in FIG. 19, a contact pad 138 is formed in contact with contact structure 134 or in contact with third conductive layer 136.

FIG. 22 illustrates a cross-section of another exemplary 3D memory device 200, according to some aspects of the present disclosure. 3D memory device 200 shown in FIG. 22 includes channel structure 118, gate line slit 133, and dummy channel structure 124. The bottom portion of gate line slit 133 and the bottom portion of dummy channel structure 124 may be coplanar or substantially coplanar to the bottom surface of second conductive layer 110. In some implementations, the bottom portion of gate line slit 133 and the bottom portion of dummy channel structure 124 may be coplanar or substantially coplanar to the bottom surface of semiconductor channel 132. For example, in some implementations, during the removal operation of first dielectric layer 104, first conductive layer 106, and/or second dielectric layer 108, the bottom portion of gate line slit 133, and the bottom portion of dummy channel structure 124 may be removed together with channel structure 118. In some implementations, the bottom surface of gate line slit 133 and the bottom surface of dummy channel structure 124 may be coplanar to or slightly higher than the bottom surface of second conductive layer 110, as shown in FIG. 22.

FIG. 23 illustrates a cross-section of still another exemplary 3D memory device 300, according to some aspects of the present disclosure. The bottom surface of channel structure 118, e.g., the bottom surface of semiconductor channel 132, may be above the top surface of second conductive layer 110, as shown in FIG. 23. In some implementations, the bottom surface of channel structure 118, e.g., the bottom surface of semiconductor channel 132, may be coplanar to the top surface of second conductive layer 110. In some implementations, the bottom surface of channel structure 118, e.g., the bottom surface of semiconductor channel 132, may be below the top surface of second conductive layer 110, as shown in FIG. 22.

By forming fourth dielectric layer 114 on first conductive layer 106 exposed by sidewalls of channel hole 112, channel hole 112 may be fully or partially filled by fourth dielectric layer 114. Hence, the bottom portion of channel structure 118 may be defined by the position of fourth dielectric layer 114 and first conductive layer 106. The bottom portion of channel structure 118 will not be affected by channel hole etch gouging, and therefore the process window of the formation of channel holes will be greatly increased.

Figure 24:
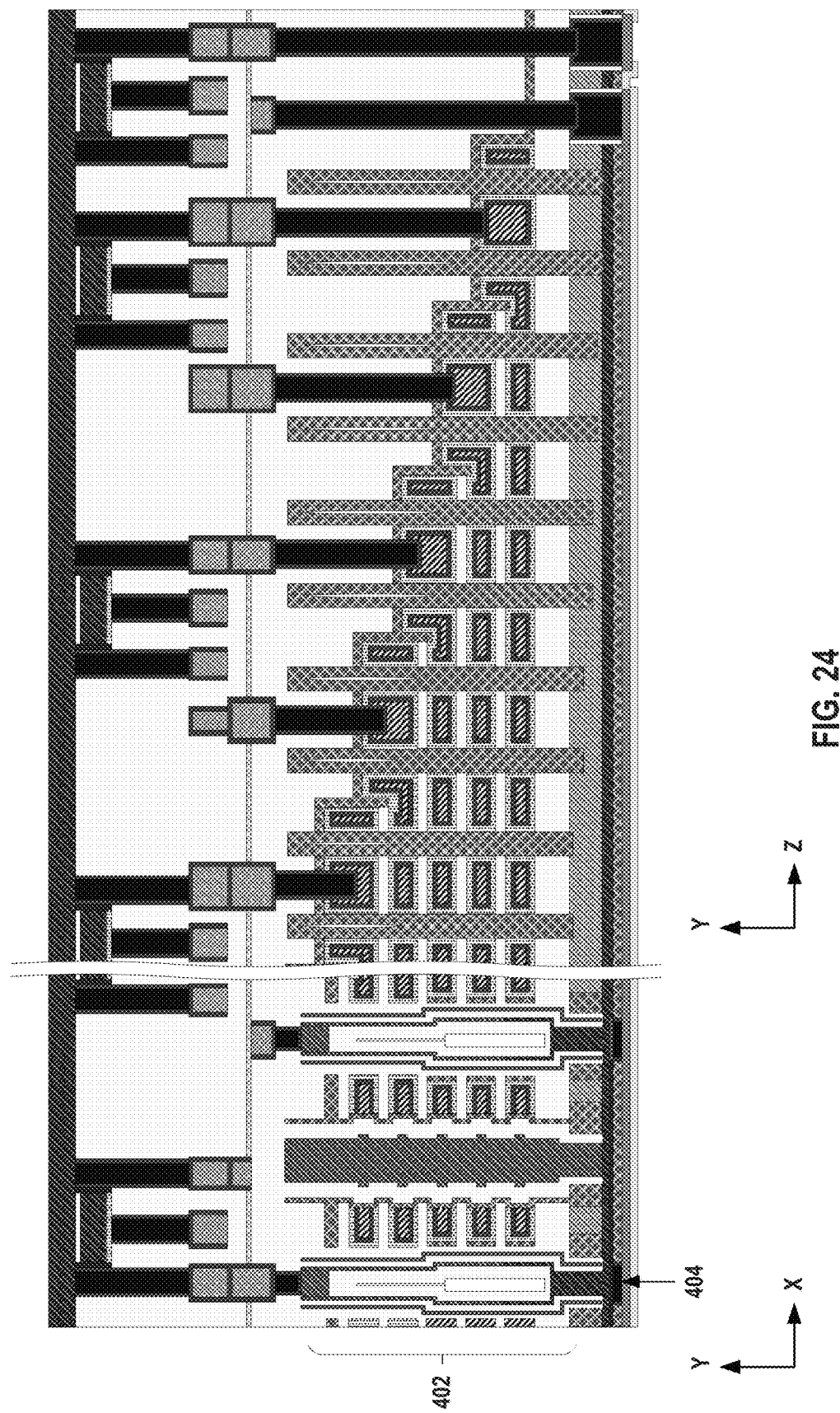
FIG. 24 illustrates a cross-section of an exemplary 3D memory device, according to some aspects of the present disclosure.

FIG. 24 illustrates a cross-section of an exemplary 3D memory device 400, according to some aspects of the present disclosure. As shown in FIG. 24, 3D memory device 400 includes a stack structure 402 and a channel structure 404 extending through stack structure 402 along the y-direction. Stack structure 402 may include interleaved conductive layers and dielectric layers, which is similar to stack structure 111 of 3D memory device 100. In some implementations, the formation and materials of stack structure 402 may be similar to those of stack structure 111.

Figure 25:
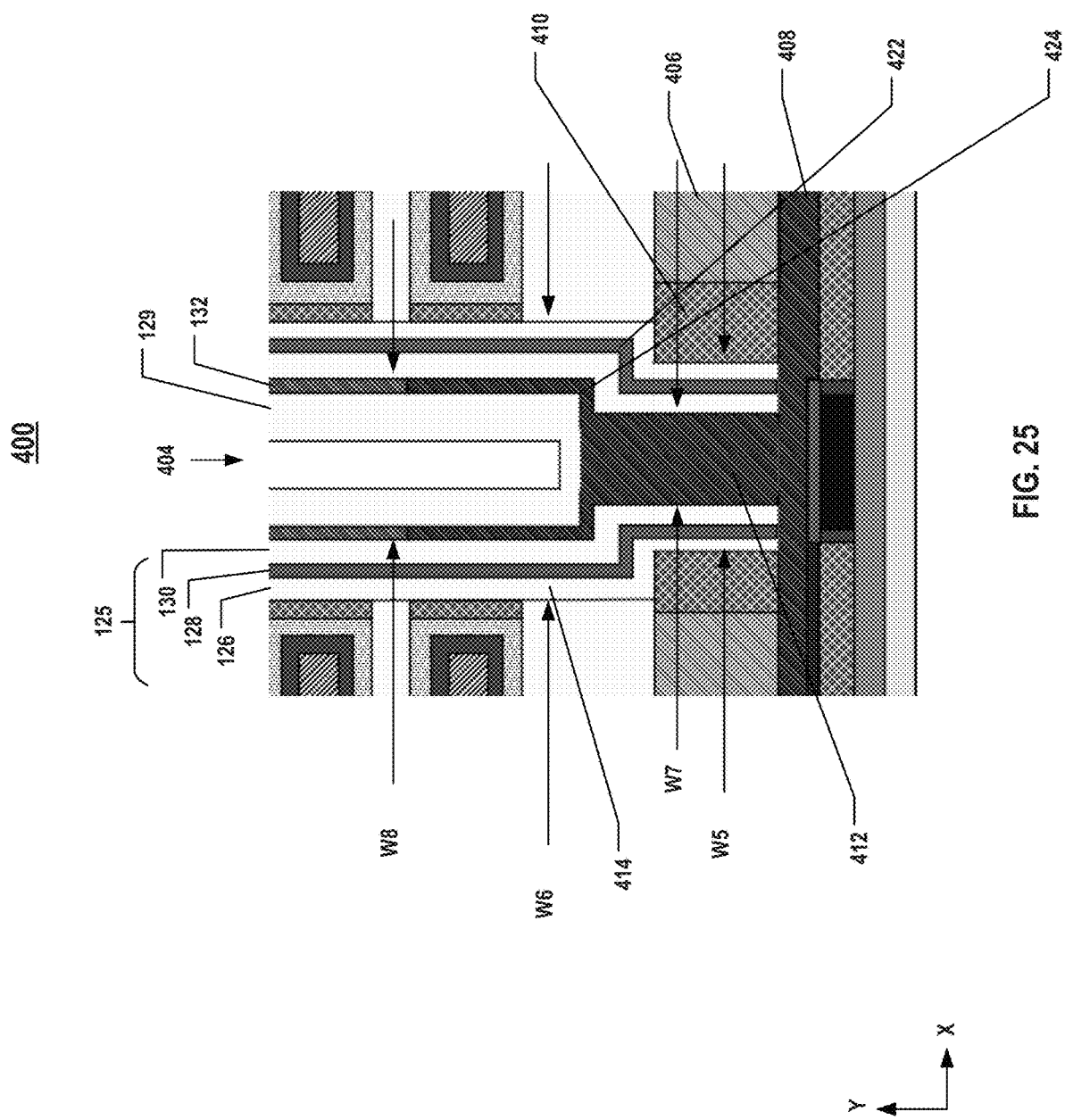
FIG. 25 illustrates a cross-section of a bottom portion of a channel structure, according to some aspects of the present disclosure.

FIG. 25 illustrates a cross-section of a bottom portion of channel structure 404 of 3D memory device 400, according to some aspects of the present disclosure. Channel structure 404 may extend through stack structure 402, and the bottom of channel structure 404 may contact a source of 3D memory device 400. In some implementations, channel structure 404 may include semiconductor channel 132 and memory film 125 formed over semiconductor channel 132, which is similar to channel structure 118 of 3D memory device 100. However, the structure of the bottom portion of channel structure 404 is different from channel structure 118. In some implementations, channel structure 404 may also include dielectric core 129 in the center of channel structure 404. In some implementations, memory film 125 may include tunneling layer 130 over semiconductor channel 132, storage layer 128 over tunneling layer 130, and blocking layer 126 over storage layer 128.

As shown in FIG. 25, the bottom portion 412 of channel structure 404 may include a bending structure of blocking layer 126, tunneling layer 130, and storage layer 128. In some implementations, in the plan view of 3D memory device 400, the bottom portion 412 of channel structure 404 may have an outer diameter W5, and the upper portion 414 of channel structure 404 may have an outer diameter W6. In some implementations, W5 is smaller than W6. In some implementations, memory film 125 may include an angled structure 422, and the outer diameter W5 of memory film 125 at the bottom portion below angled structure 422 is smaller than the outer diameter W6 of memory film 125 at the upper portion above angled structure 422. For example, as shown in FIG. 25, memory film 125 may be formed as two right angle structures. In some implementations, memory film 125 may be formed as obtuse angle structures, acute angle structures, right angle structures, arc angle structures, or any combination of these angled structures.

In some implementations, in the plan view of 3D memory device 400, semiconductor channel 132 in bottom portion 412 of channel structure 404 may have an outer diameter W7, and semiconductor channel 132 in upper portion 414 of channel structure 404 may have an outer diameter W8. In some implementations, W7 is smaller than W8. In some implementations, semiconductor channel 132 may include an angled structure 424, and the outer diameter W7 of semiconductor channel 132 at the bottom portion of channel structure 404 below angled structure 424 is smaller than the outer diameter W8 of semiconductor channel 132 at the upper portion of channel structure 404 above angled structure 424. For example, as shown in FIG. 25, semiconductor channel 132 may be formed as one right angle structure. In some implementations, semiconductor channel 132 may be formed as obtuse angle structures, acute angle structures, right angle structures, arc angle structures, or any combination of these angled structures.

3D memory device 400 may further include a conductive layer 406 in direct contact with stack structure 402, and a doped conductive layer 408 disposed under conductive layer 406. In some implementations, conductive layer 406 may be a polysilicon layer, and doped conductive layer 408 may be a doped polysilicon layer. In some implementations, 3D memory device 400 may further include a dielectric layer 410 disposed between conductive layer 406 and bottom portion 412 of channel structure 404. In the plan view of 3D memory device 400, dielectric layer 410 may surround bottom portion 412 of channel structure 404, and conductive layer 406 may surround dielectric layer 410. Doped conductive layer 408 is disposed under conductive layer 406, dielectric layer 410, and channel structure 404. In some implementations, doped conductive layer 408 may in direct contact with the bottom surfaces of memory film 125 and semiconductor channel 132. In some implementations, dielectric core 129 is only formed in upper portion 414 of channel structure 404.

Figure 26:
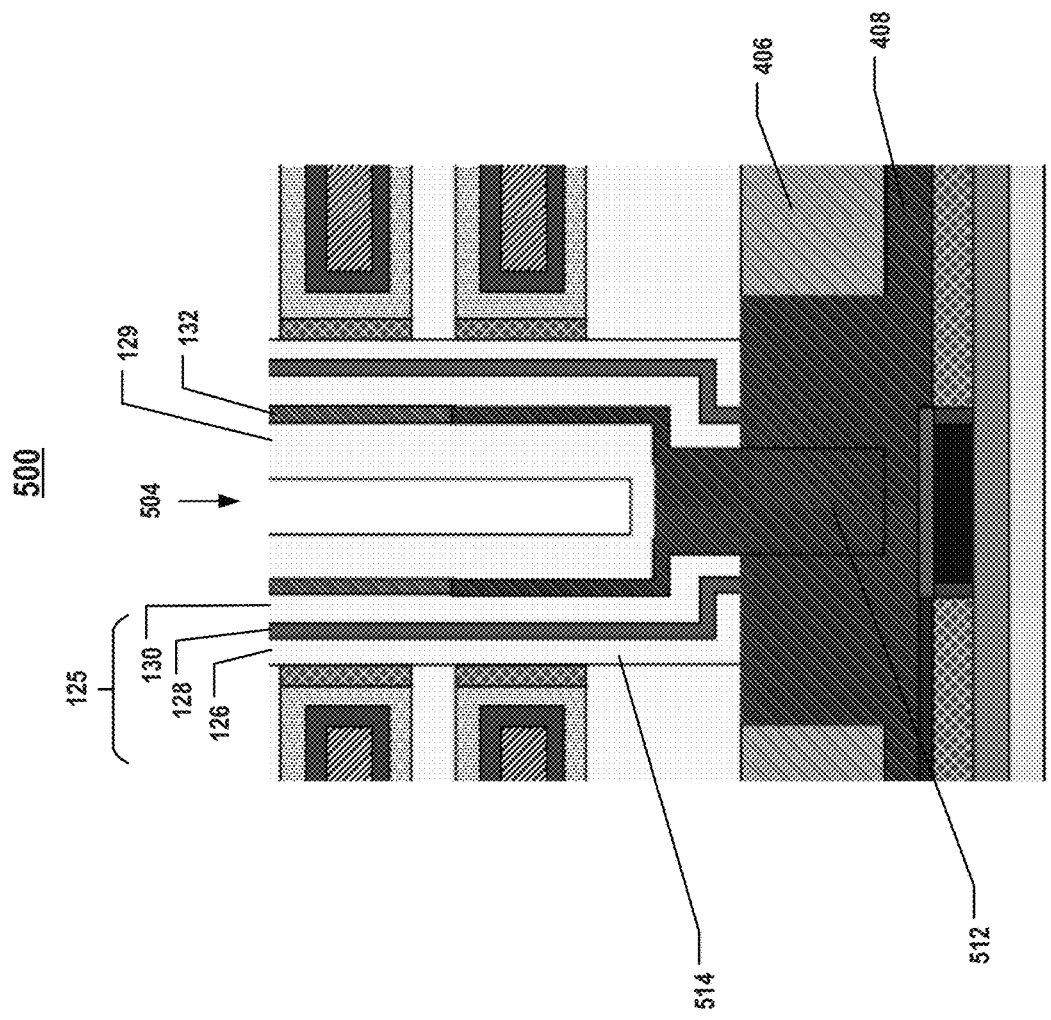
FIG. 26 illustrates a cross-section of a bottom portion of a channel structure, according to some aspects of the present disclosure.

FIG. 26 illustrates a cross-section of a bottom portion of another channel structure 504 of a 3D memory device 500, according to some aspects of the present disclosure. Channel structure 504 of a 3D memory device 500, including the upper portion 514, is similar to channel structure 404 of a 3D memory device 400, but bottom portion 512 of channel structure 504 is different. As shown in FIG. 26, a portion of doped conductive layer 408 extends into conductive layer 406. The extended portion of doped conductive layer 408 surrounds bottom portion 512 of channel structure 504. Conductive layer 406 further surrounds the extended portion of doped conductive layer 408. In some implementations, the bottom surface of memory film 125 is in direct contact with doped conductive layer 408. In some implementations, the top surface of polysilicon layer 406 is coplanar to the top surface of doped polysilicon layer 408 and the bottom surface of memory film 125.

Figure 27:
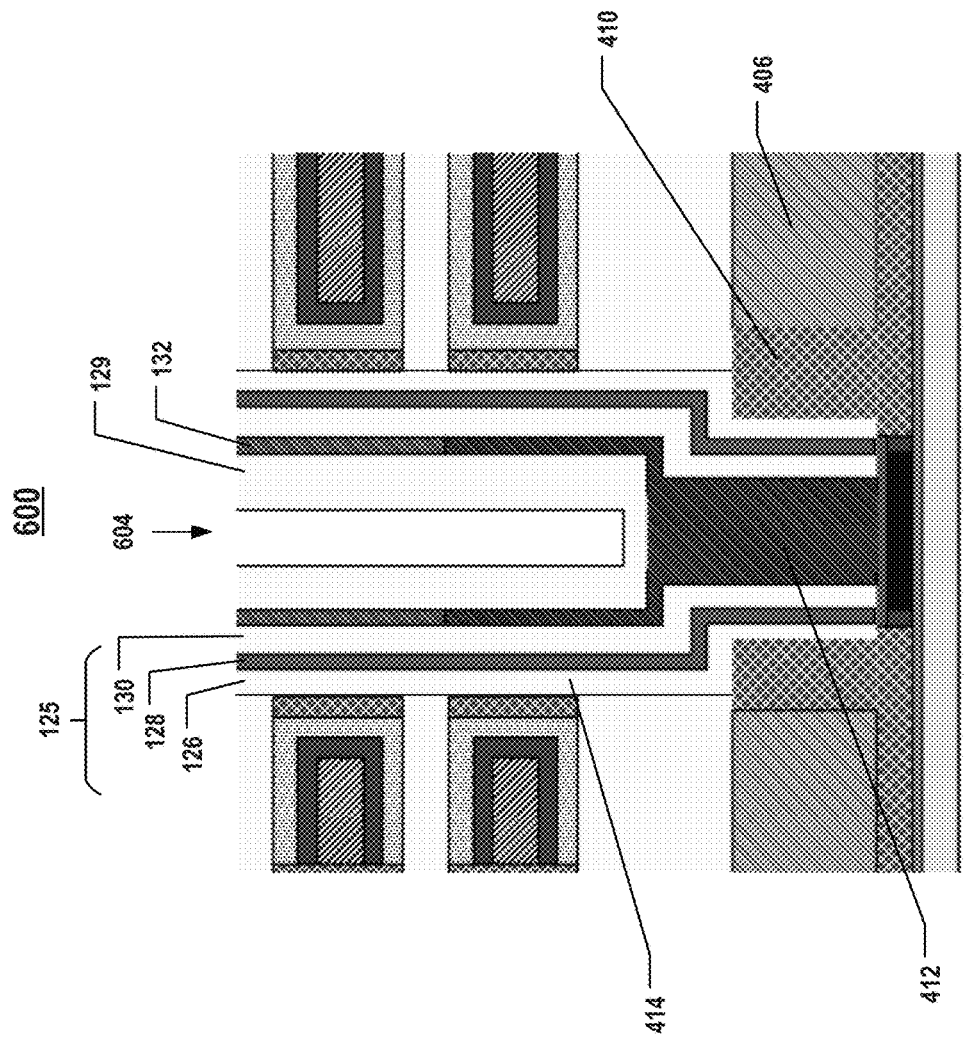
FIG. 27 illustrates a cross-section of a bottom portion of a channel structure, according to some aspects of the present disclosure.

FIG. 27 illustrates a cross-section of a bottom portion of a channel structure 604 of a 3D memory device 600, according to some aspects of the present disclosure. In some implementations, channel structure 604 of 3D memory device 600 may be similar to channel structure 404 of 3D memory device 400, but 3D memory device 600 does not include a doped polysilicon layer under conductive layer 406. In some implementations, channel structure 604 of 3D memory device 600 may be directly coupled to the interconnection structure. For example, channel structure 604 of 3D memory device 600 may be directly coupled to the pad-out structure without forming a doped polysilicon layer under the channel structure.

Figure 28:
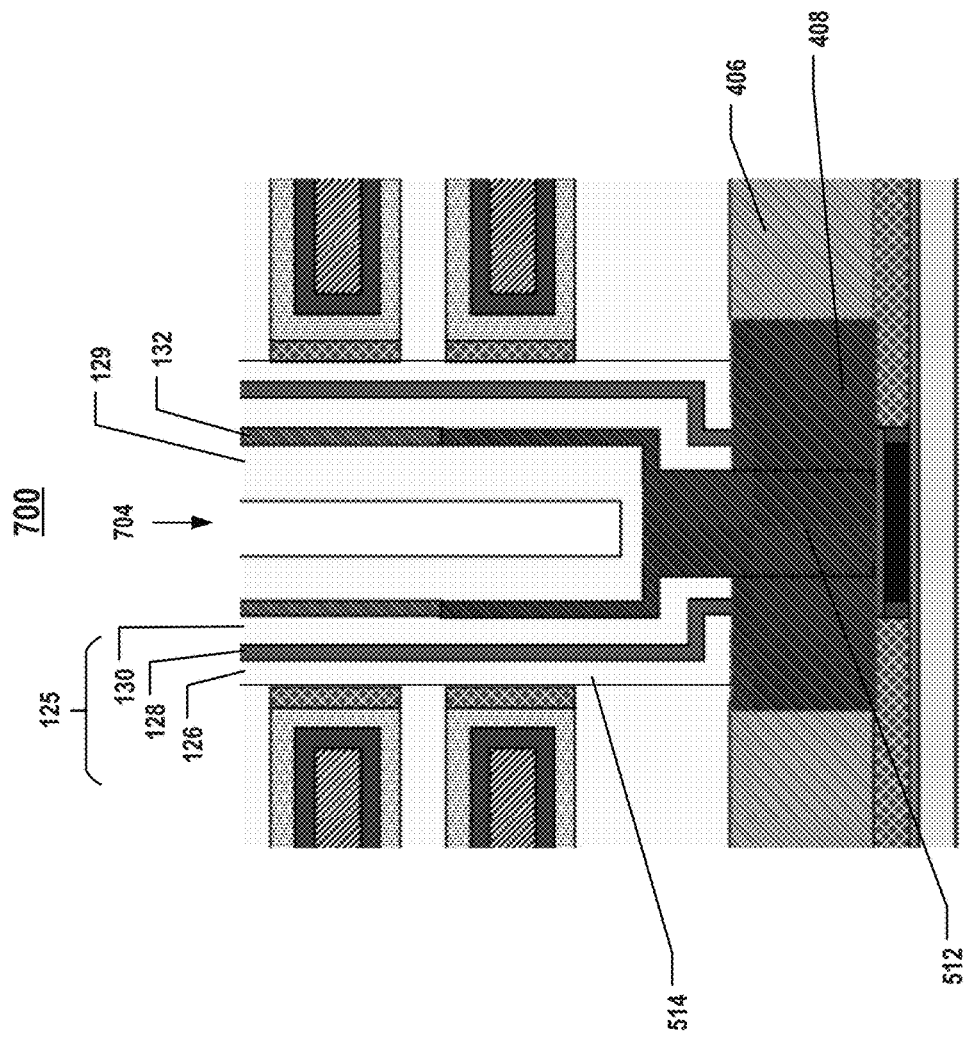
FIG. 28 illustrates a cross-section of a bottom portion of a channel structure, according to some aspects of the present disclosure.

FIG. 28 illustrates a cross-section of a bottom portion of a channel structure 704 of a 3D memory device 700, according to some aspects of the present disclosure. In some implementations, channel structure 704 of 3D memory device 700 may be similar to channel structure 504 of 3D memory device 500, but doped conductive layer 408 of 3D memory device 700 may not be formed under conductive layer 406. As shown in FIG. 28, doped conductive layer 408 of 3D memory device 700 may surrounds bottom portion 512 of channel structure 704. Conductive layer 406 further surrounds doped conductive layer 408. In some implementations, channel structure 704 of 3D memory device 700 may be directly coupled to the interconnection structure. For example, channel structure 704 of 3D memory device 700 may be directly coupled to the pad-out structure without forming a doped polysilicon layer under conductive layer 406.

Figure 39:
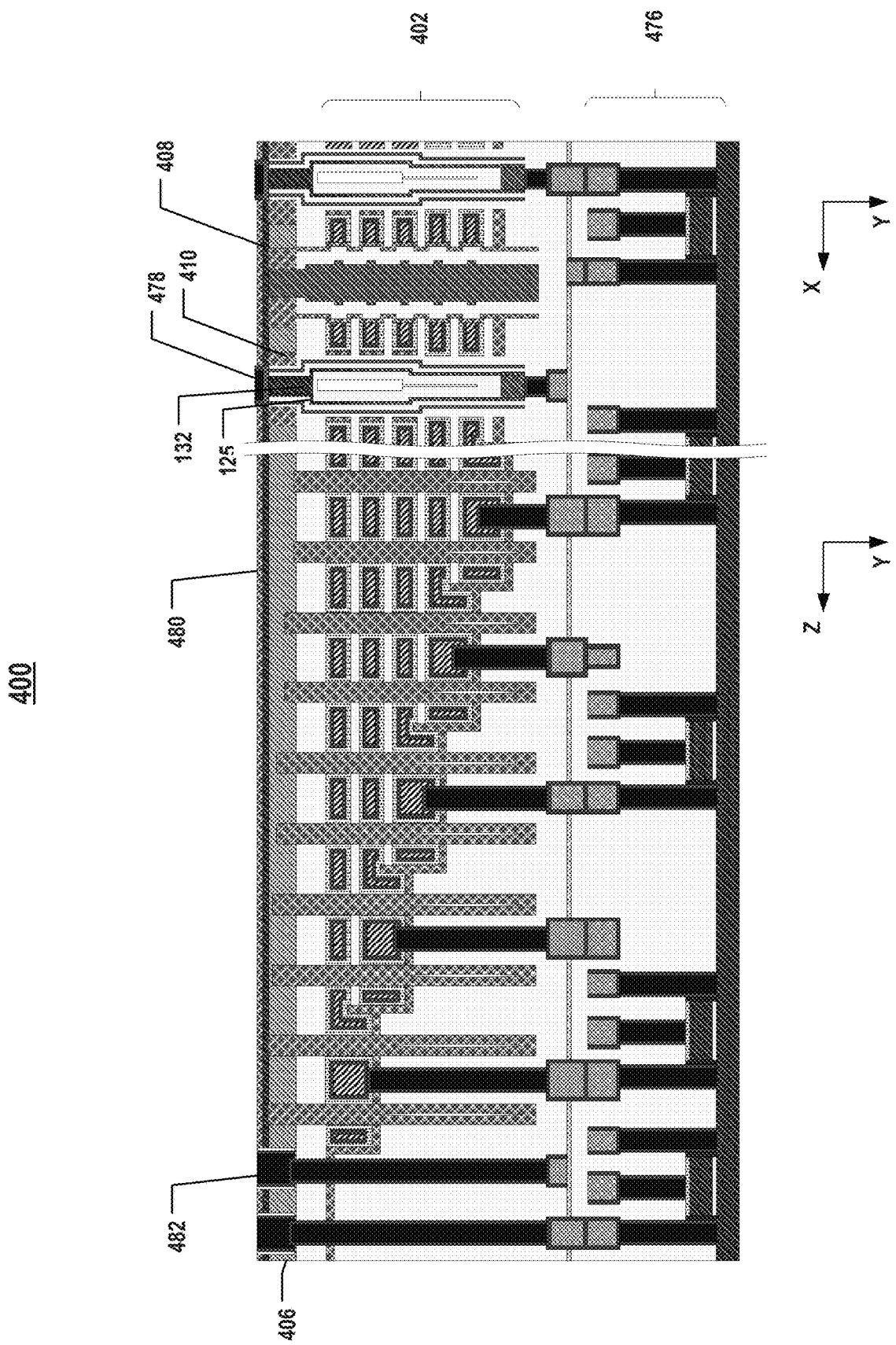
Figure 40:
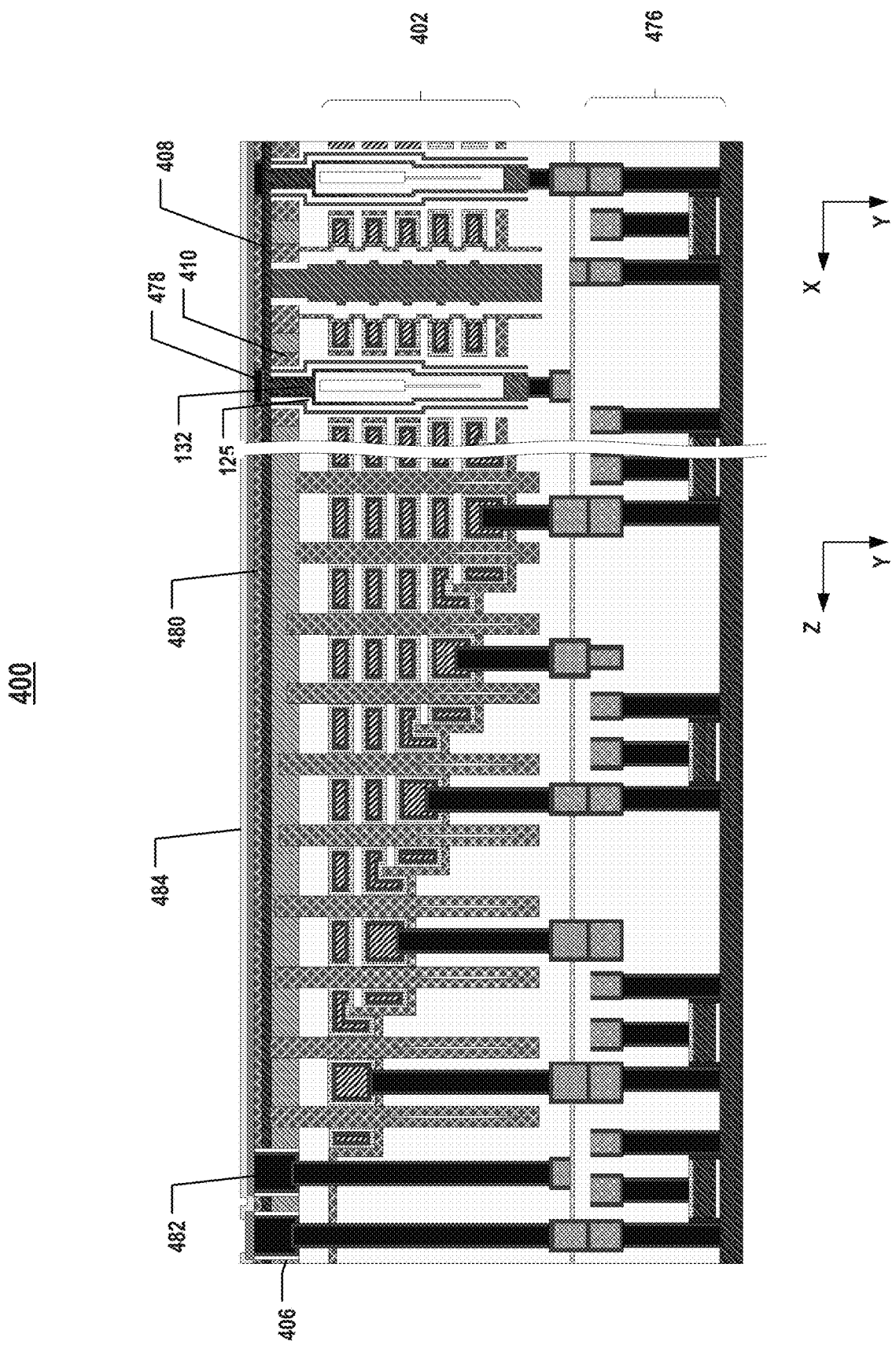
Figure 41:
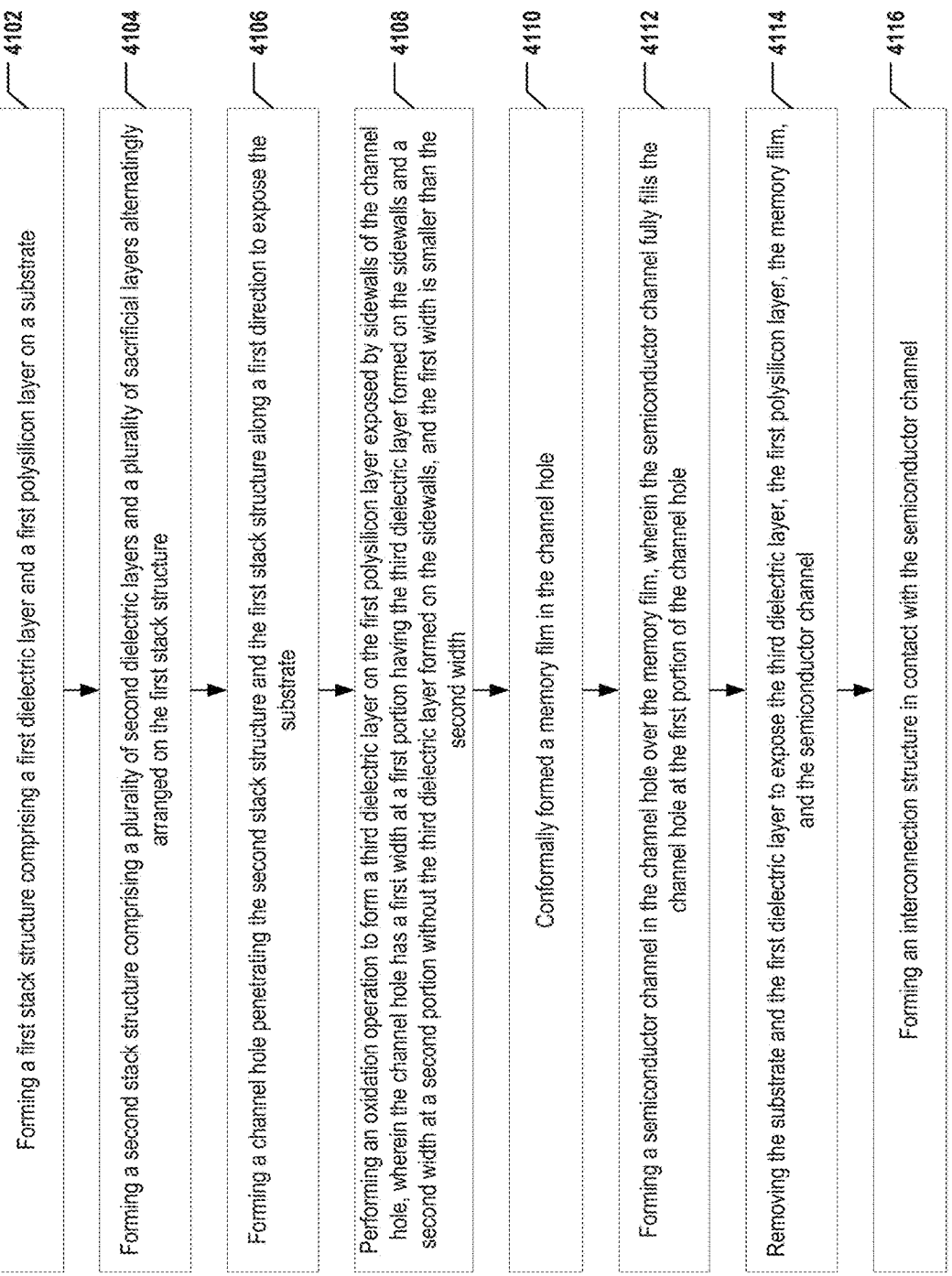
FIG. 41 illustrates a flowchart of an exemplary method for forming a 3D memory device, according to some aspects of the present disclosure.

FIGS. 29-40 illustrate cross-sections of 3D memory device 400 at different stages of a manufacturing process, according to some aspects of the present disclosure. FIG. 41 illustrates a flowchart of an exemplary method 4100 for forming 3D memory device 400, according to some aspects of the present disclosure. For the purpose of better describing the present disclosure, the cross-sections of 3D memory device 400 in FIGS. 29-40 and method 4100 in FIG. 41 will be discussed together. It is understood that the operations shown in method 4100 are not exhaustive and that other operations may be performed as well before, after, or between any of the illustrated operations. Further, some of the operations may be performed simultaneously, or in a different order than shown in FIGS. 29-40 and FIG. 41.

Figure 29:
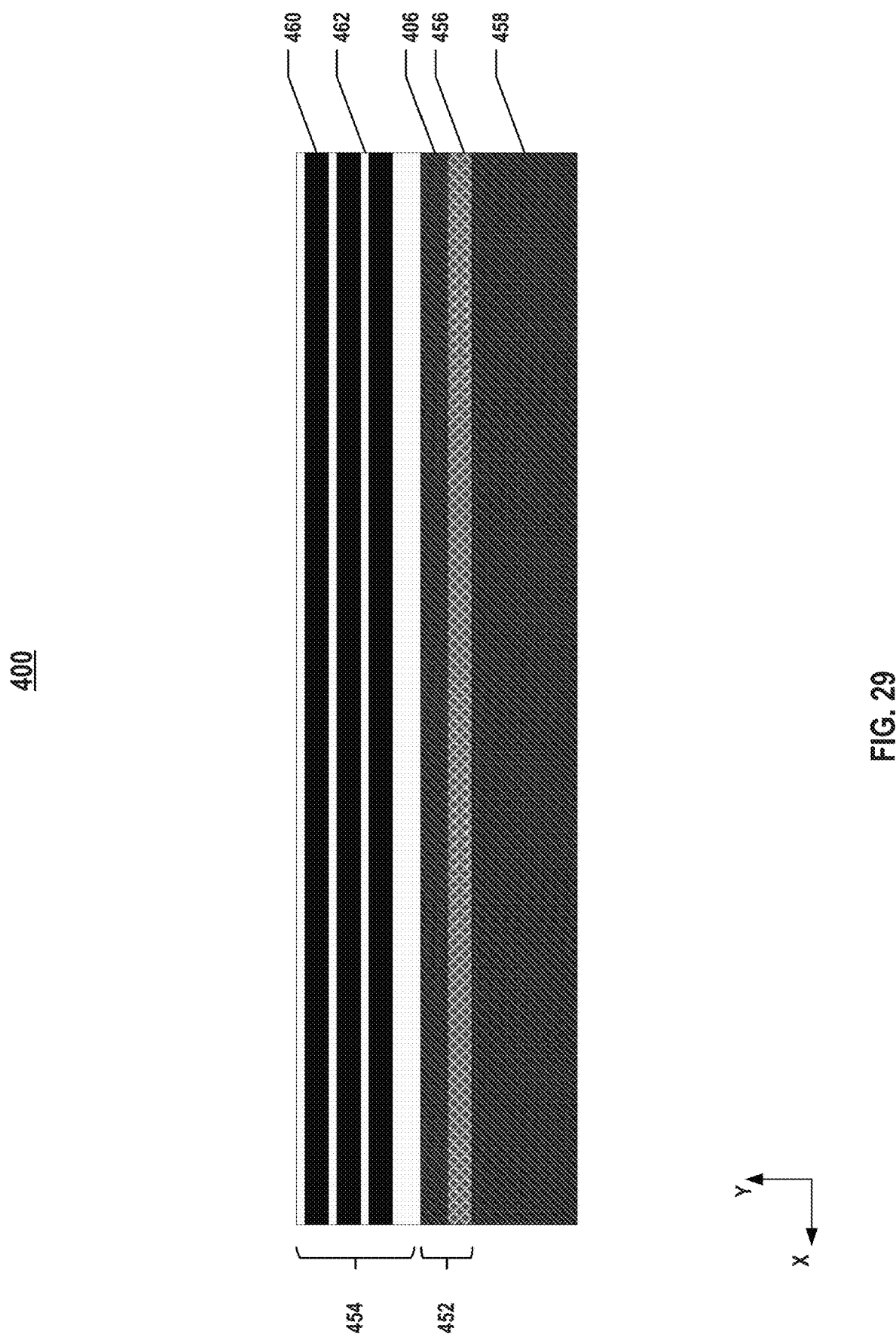
FIGS. 29-40 illustrate cross-sections of an exemplary 3D memory device at different stages of a manufacturing process, according to some aspects of the present disclosure.

As shown in FIG. 29 and operation 4102 in FIG. 41, a stack structure 452 including a dielectric layer 456 and conductive layer 406 is formed on a substrate 458. In some implementations, substrate 458 may be a doped semiconductor layer. In some implementations, dielectric layer 456 may include a layer of silicon oxide or silicon nitride. In some implementations, conductive layer 406 may include a doped polysilicon layer or an undoped polysilicon layer. In some implementations, dielectric layer 456 and conductive layer 406 may be sequentially deposited by one or more thin film deposition processes including, but not limited to, CVD, PVD, ALD, or any combination thereof.

Then, as shown in FIG. 29 and operation 4104 in FIG. 41, a stack structure 454 including a plurality of dielectric layers 462 and a plurality of sacrificial layers 460 alternatingly arranged is formed on stack structure 452. The dielectric/sacrificial layer pairs may include interleaved dielectric layers 462 and sacrificial layers 460 extending along the x-direction and a plane perpendicular to the y-direction. In some implementations, each dielectric layer 462 may include a layer of silicon oxide, and each sacrificial layer 460 may include a layer of silicon nitride. Stack structure 454 may be formed by one or more thin film deposition processes including, but not limited to, CVD, PVD, ALD, or any combination thereof.

Figure 30:
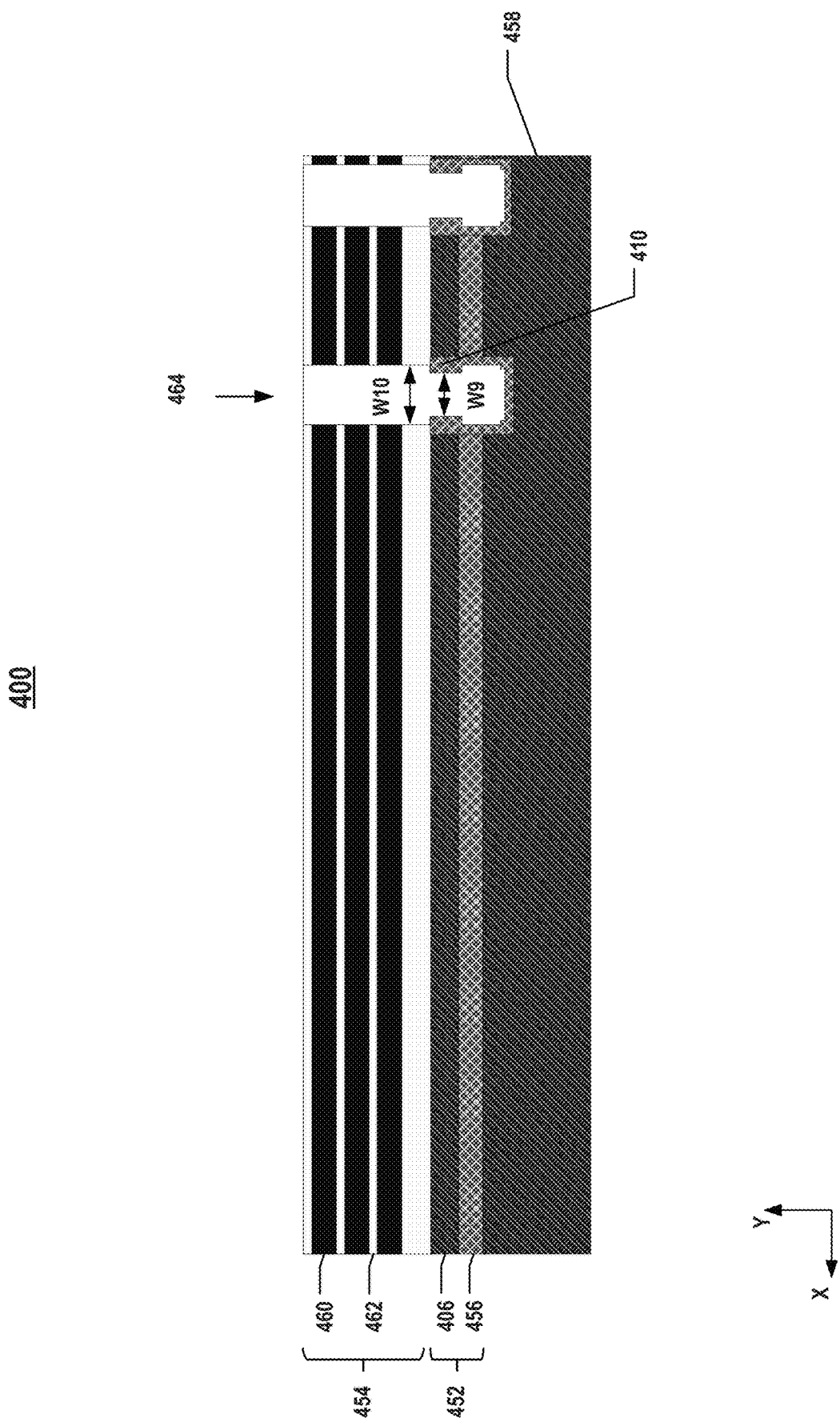

As shown in FIG. 30 and operation 4106 in FIG. 41, a channel hole 464 is formed penetrating stack structure 454 and stack structure 452 along the y-direction, and substrate 458 is exposed by channel hole 464. In some implementations, fabrication processes for forming channel hole 464 may include wet etching and/or dry etching, such as deep reactive ion etching (DRIE).

Then, as shown in FIG. 30 and operation 4108 in FIG. 41, an oxidation operation is performed to form dielectric layer 410 on conductive layer 406 exposed by sidewalls of channel hole 464. In some implementations, dielectric layer 410 is further formed on the bottom of channel hole 464 on substrate 458. In some implementations, dielectric layer 410 is further formed on dielectric layer 456. In some implementations, dielectric layer 410 is formed on conductive layer 406 along the x-direction. As shown in FIG. 30, after the formation of dielectric layer 410, channel hole 464 has a width W9 (or the diameter in the plan view) at the portion having dielectric layer 410 formed on the sidewalls and a width W10 at another portion without dielectric layer 410 formed on the sidewalls. In some implementations, the width W9 is smaller than the width W10.

Figure 31:
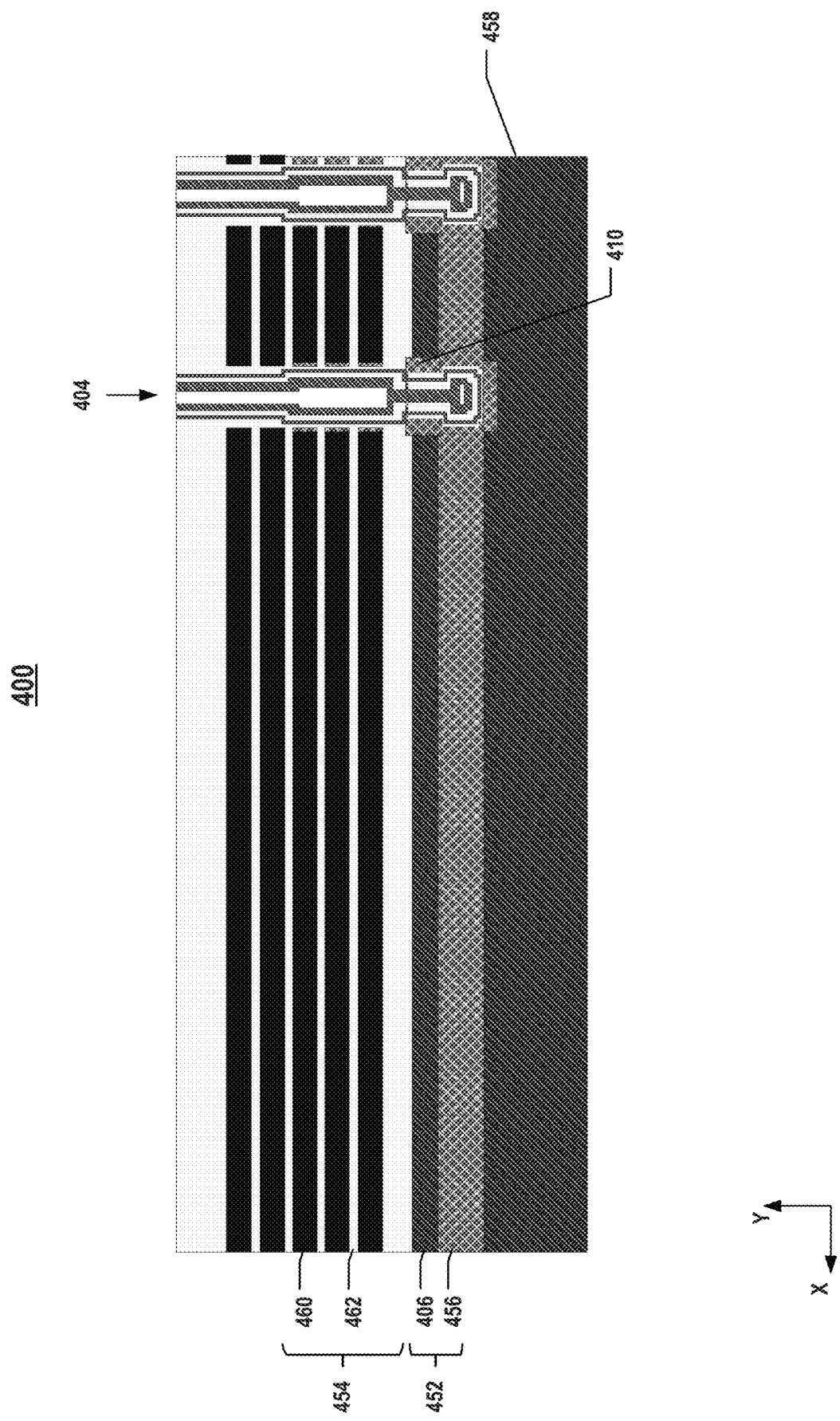

As shown in FIG. 31 and operation 4110 in FIG. 41, channel structure 404 may be formed in channel hole 464. Channel structure 404 may include memory film 125 and semiconductor channel 132. In some implementations, memory film 125 is a composite layer including tunneling layer 130, storage layer 128 (also known as a "charge trap layer"), and blocking layer 126, as shown in FIG. 25. Channel structure 404 can have a cylinder shape (e.g., a pillar shape), and the bottom portion of the cylinder shape may be shrunk at the portion having dielectric layer 410 formed on sidewalls of channel hole 464. The formation of channel structure 404 may include conformally forming memory film 125 in channel hole 464, and then semiconductor channel 132 is formed in channel hole 464 over memory film 125, as shown in operation 4112 in FIG. 41. As shown in FIG. 31, because channel hole 464 has a smaller width W9 at the portion having dielectric layer 410 formed on the sidewalls, semiconductor channel 132 may fully fill channel hole 464 at the portion of the channel hole having dielectric layer 410 formed on the sidewalls.

Figure 32:
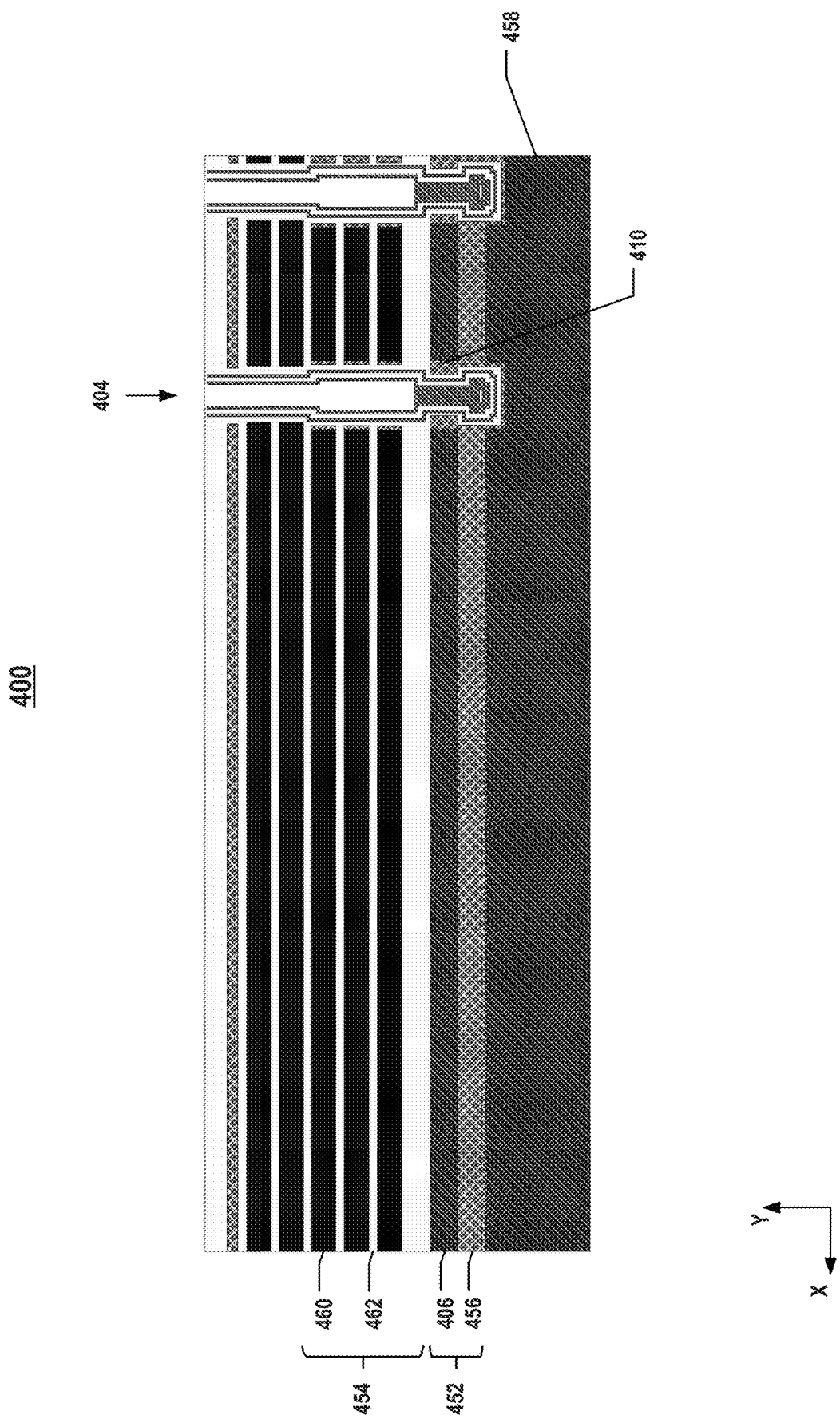

As shown in FIG. 32, a poly etch back operation may be performed to thin semiconductor channel 132, and dielectric core 129 may be formed in the center of channel structure 404. Dielectric core 129, semiconductor channel 132, tunneling layer 130, storage layer 128, and blocking layer 126 are arranged radially from the center toward the outer surface of the pillar in this order, according to some implementations. Because semiconductor channel 132 may fully fill channel hole 464 at the portion of the channel hole having dielectric layer 410 formed on the sidewalls, dielectric core 129 may be formed above the fully filled portion of semiconductor channel 132. In some implementations, tunneling layer 130 may include silicon oxide, silicon oxynitride, or any combination thereof. In some implementations, storage layer 128 may include silicon nitride, silicon oxynitride, silicon, or any combination thereof. In some implementations, blocking layer 126 may include silicon oxide, silicon oxynitride, high dielectric constant (high-k) dielectrics, or any combination thereof. In one example, memory film 125 may include a composite layer of silicon oxide/silicon oxynitride (or silicon nitride)/silicon oxide (ONO).

Figure 33:
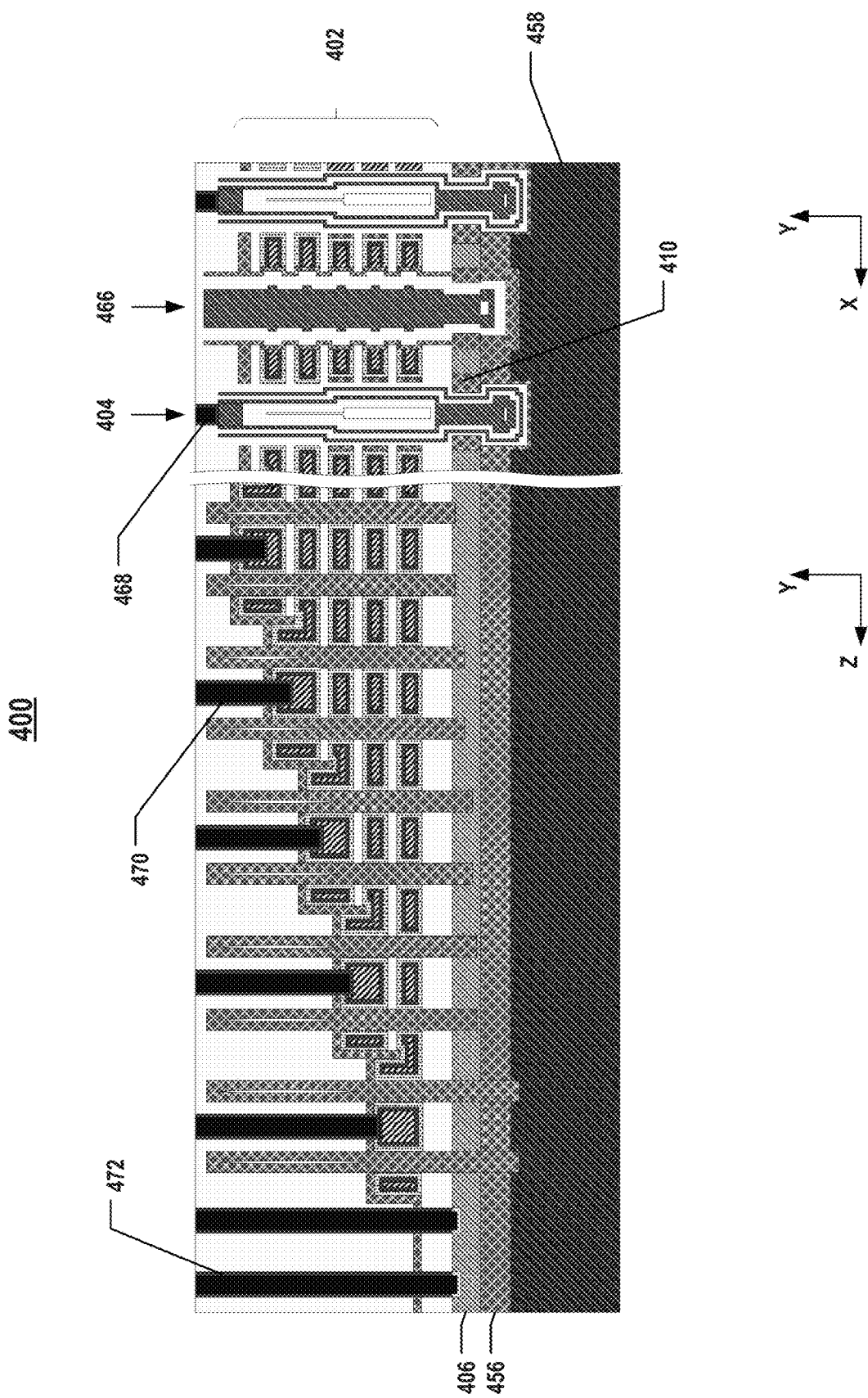

As shown in FIG. 33, a gate line slit 466 may be formed. An opening slit may be first formed extending vertically through stack structure 454 and stack structure 452. In some embodiments, fabrication processes for forming the slit may include wet etching and/or dry etching, such as DRIE. A gate replacement process can then be performed through the slit to replace sacrificial layers 460 with the word line structures. An insulating structure may be fully or partially filled in the slit (with or without an air gap) to form gate line slit 466 using one or more thin film deposition processes, such as ALD, CVD, PVD, any other suitable processes, or any combination thereof.

After the formation of gate line slit 466, local contacts, including channel local contacts 468 and word line local contacts 470, and peripheral contacts 472 are formed. A local dielectric layer can be formed on stack structure 402 by depositing dielectric materials, such as silicon oxide or silicon nitride, using one or more thin film deposition processes, such as CVD, PVD, ALD, or any combination thereof, on top of stack structure 402. Channel local contacts 468, word line local contacts 470, and peripheral contacts 472 may be formed by etching contact openings through the local dielectric layer (and any other interlayer dielectric (ILD) layers) using wet etching and/or dry etching, e.g., RIE, followed by filling the contact openings with conductive materials using one or more thin film deposition processes, such as ALD, CVD, PVD, any other suitable processes, or any combination thereof.

Figure 34:
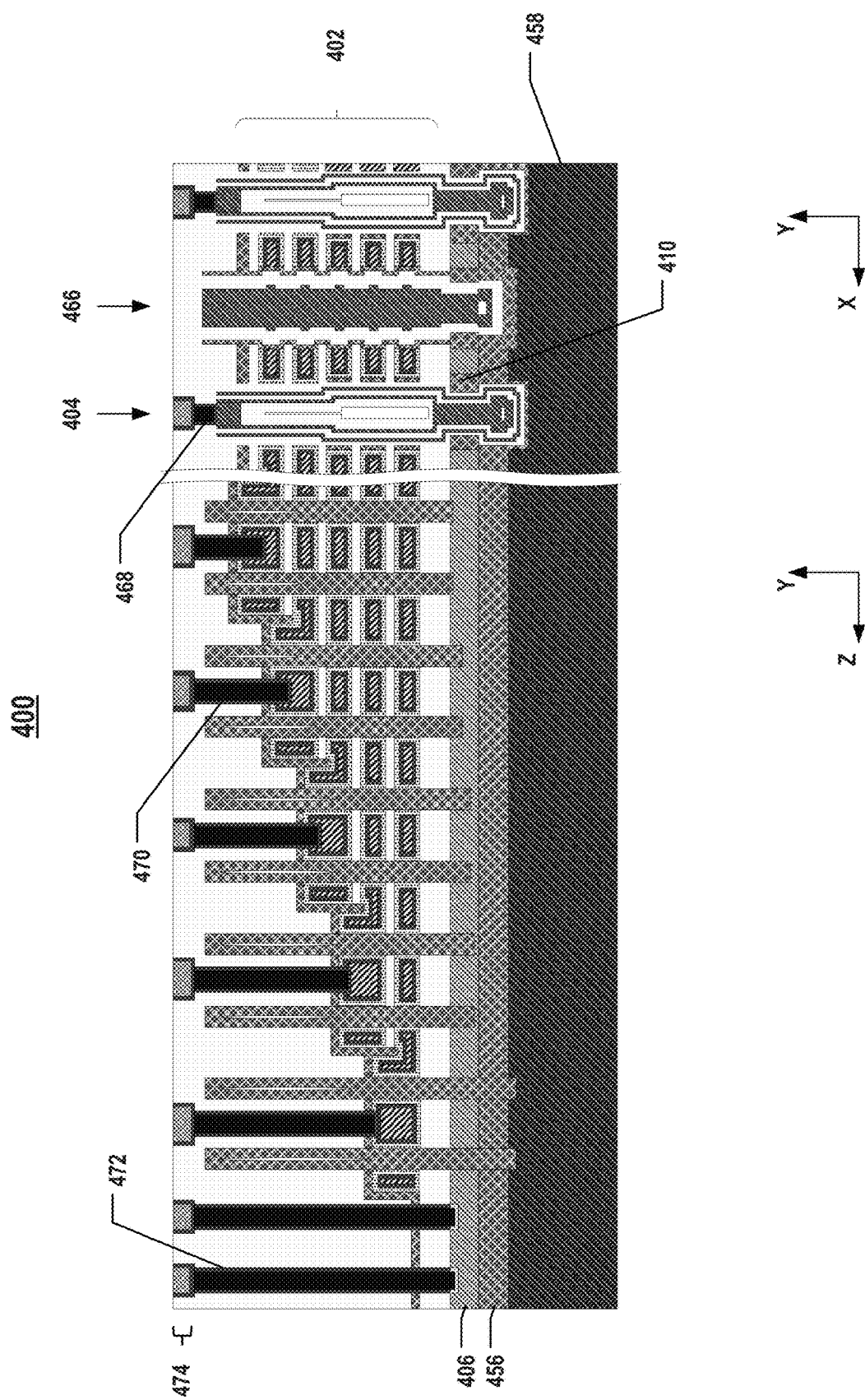
Figure 35:
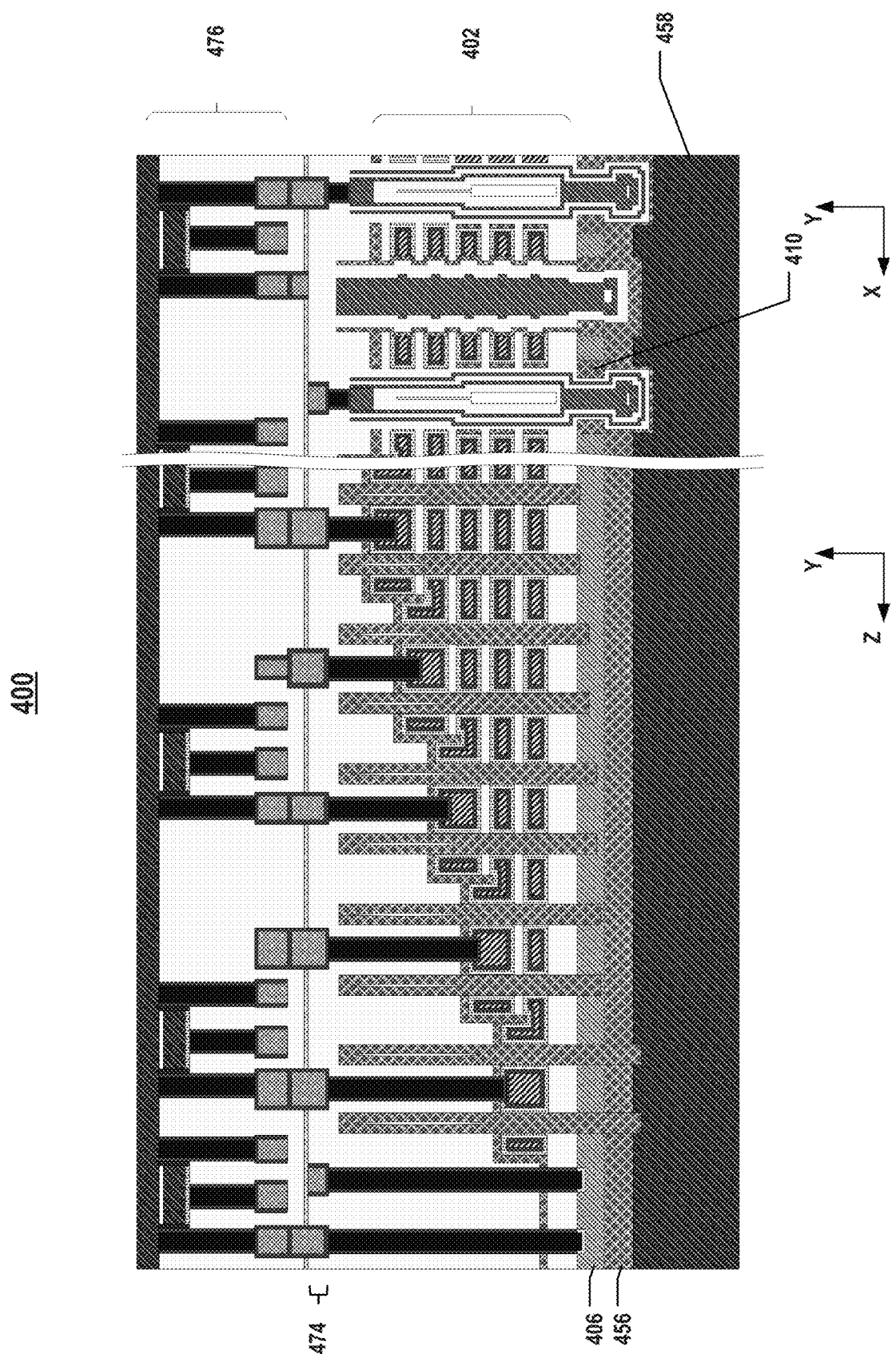

As shown in FIG. 34, a bonding layer 474 is formed above channel local contacts 468, word line local contacts 470, and peripheral contacts 472. Bonding layer 474 may include bonding contacts electrically connected to channel local contacts 468, word line local contacts 470, and peripheral contacts 472. Then, as shown in FIG. 35, the memory stack and a peripheral circuit 476 are bonded in a face-to-face manner. In some embodiments, a treatment process, e.g., a plasma treatment, a wet treatment, and/or a thermal treatment, is applied to the bonding surfaces prior to the bonding.

Figure 36:
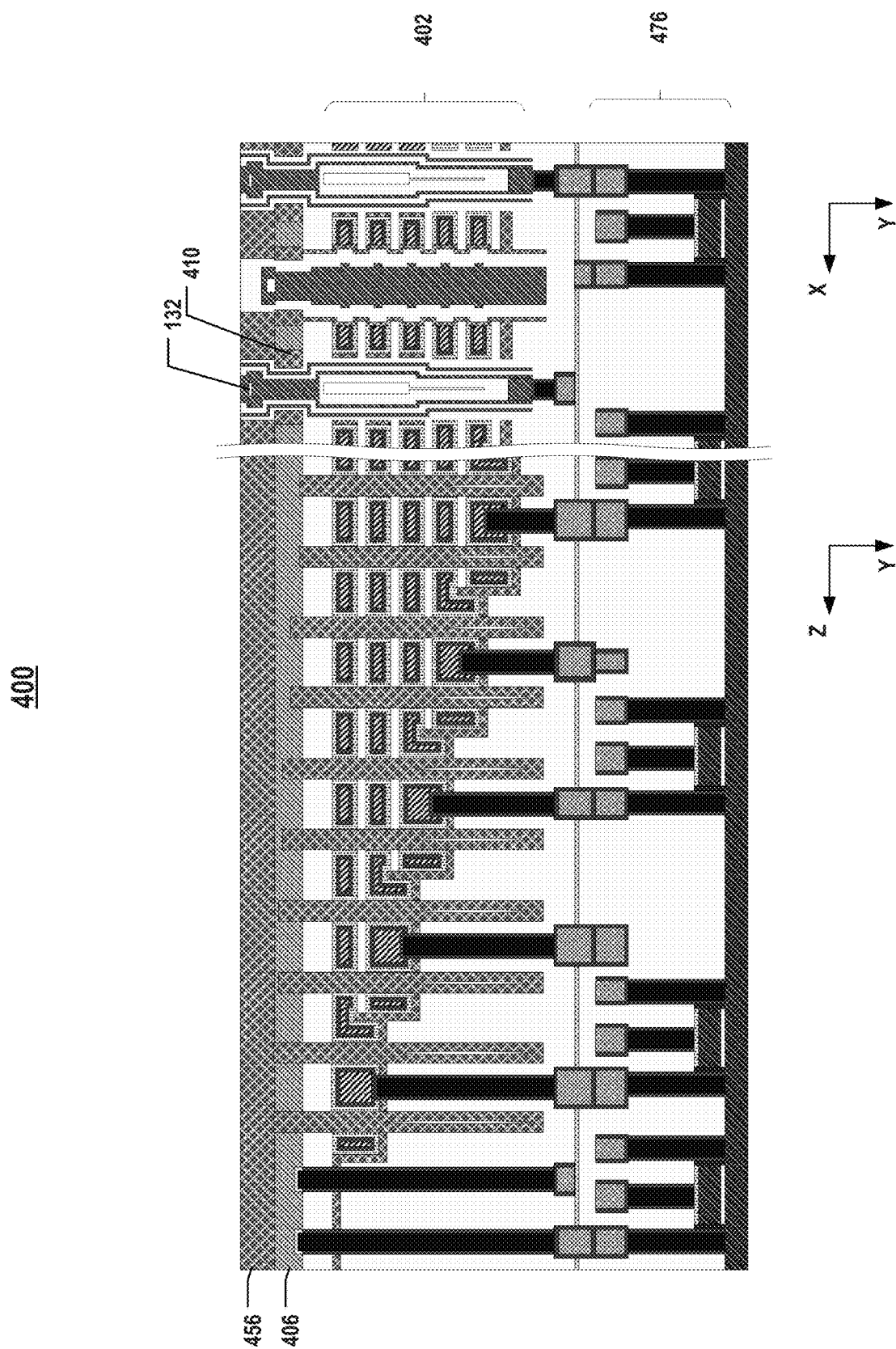

As shown in FIG. 36 and operation 4114 in FIG. 41, substrate 458 is removed to expose dielectric layer 456. In some implementations, substrate 458 may be completely removed using CMP, grinding, dry etching, and/or wet etching. In some embodiments, substrate 458 is peeled off. In some embodiments in which substrate 458 includes silicon, dielectric layer 456 may function as a stop layer, e.g., silicon nitride, when substrate 458 is removed using silicon CMP, which can be automatically stopped when reaching dielectric layer 456 having materials other than silicon, i.e., acting as a backside CMP stop layer. In some embodiments, substrate 458 (a silicon substrate) is removed using wet etching by TMAH, which is automatically stopped when reaching dielectric layer 456 having materials other than silicon, i.e., acting as a backside etch stop layer. Dielectric layer 456 can ensure the complete removal of substrate 458 without the concern of thickness uniformity after thinning.

Figure 37:
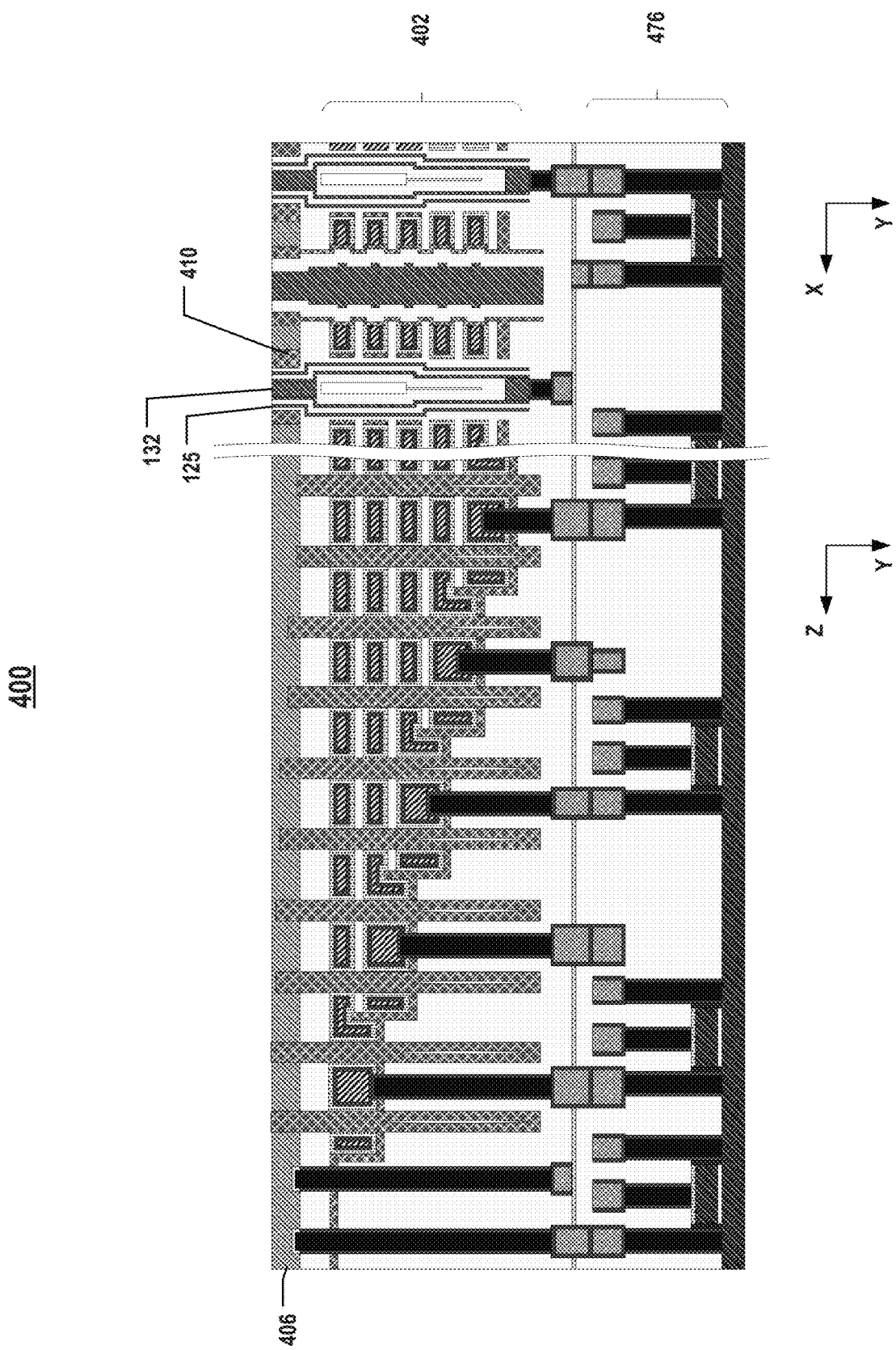

As shown in FIG. 37 and operation 4114 in FIG. 41, in some implementations, after removing substrate 458, a planarization operation, e.g., CMP, may be further performed to remove dielectric layer 456, a portion of memory film 125, and a portion of semiconductor channel 132. In some implementations, after removing dielectric layer 456, the top surface of conductive layer 406 is coplanar to the top surfaces of dielectric layer 410, memory film 125, and semiconductor channel 132.

Figure 38:
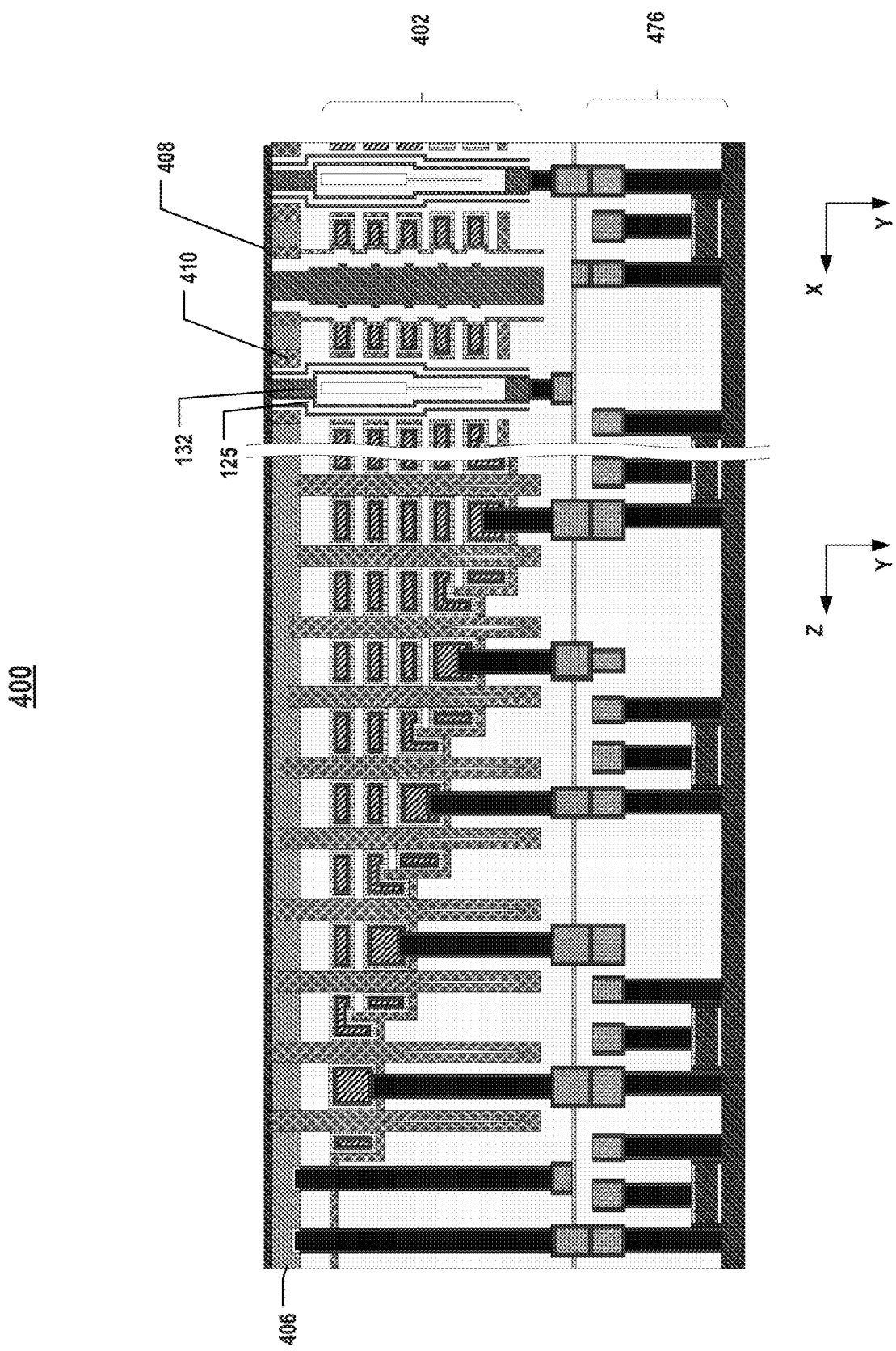

As shown in FIG. 38, an implantation operation may be performed on semiconductor channel 132 to dope the top portion of the polysilicon material of semiconductor channel 132, and then doped conductive layer 408 may be formed on conductive layer 406, dielectric layer 410, memory film 125, and semiconductor channel 132. In some implementations, an activation operation, e.g., laser activation operation, may be further performed on doped conductive layer 408. In some implementations, doped conductive layer 408 is in direct contact with dielectric layer 410, memory film 125, and semiconductor channel 132.

As shown in FIG. 39 and operation 4116 in FIG. 41, an interconnection structure is formed in contact with semiconductor channel 132. An ILD layer 480 may be formed on doped conductive layer 408, and then source contact openings may be formed in ILD layer 480. Source contacts 478 are formed in the source contact opening. In some implementations, contacts 482 are formed extending through ILD layer 480 and in contact with peripheral contacts. As shown in FIG. 40, a redistribution layer 484 is formed over source contacts 478 and contacts 482.

Figure 42:
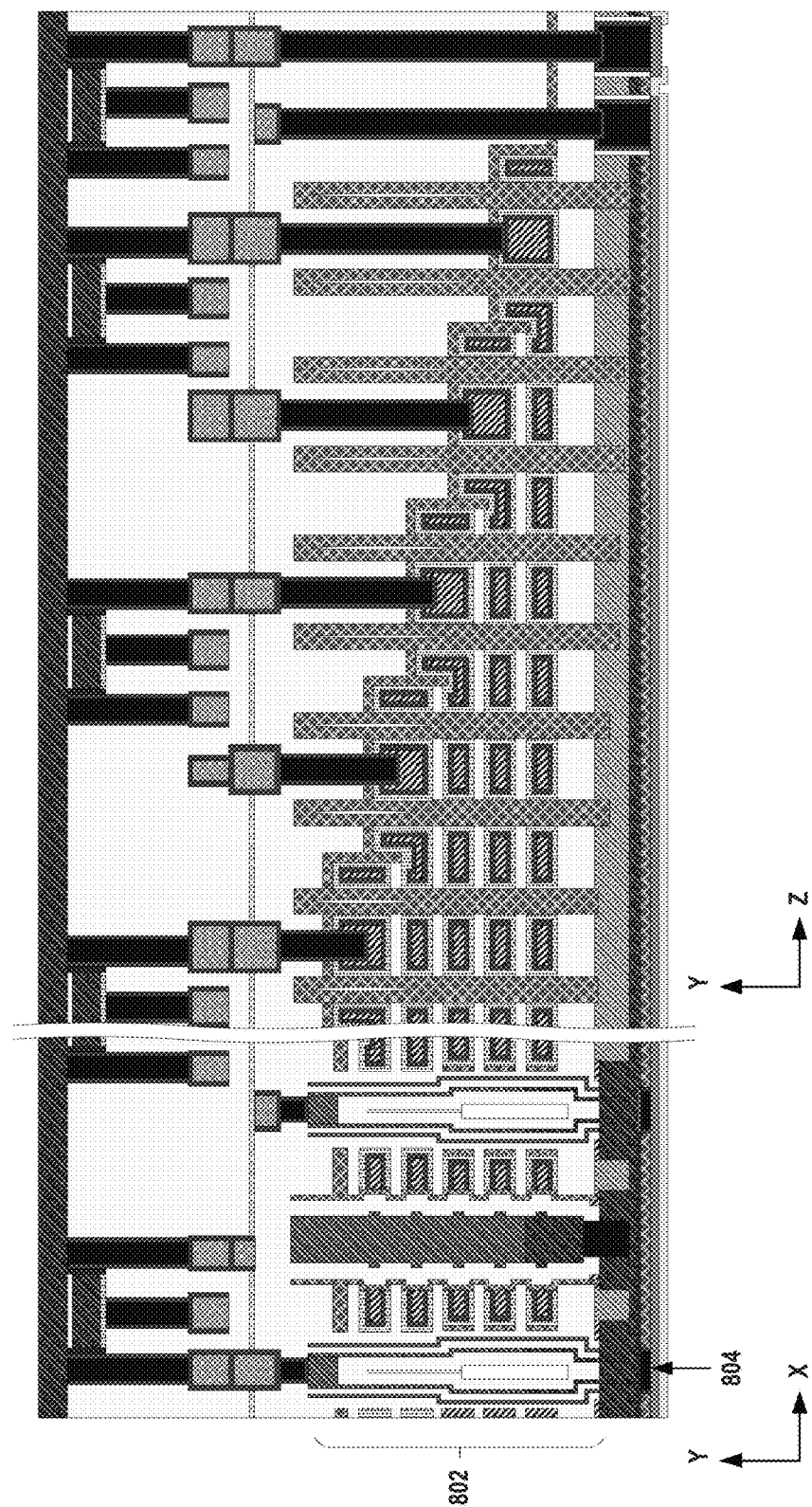
FIG. 42 illustrates a cross-section of an exemplary 3D memory device, according to some aspects of the present disclosure.

FIG. 42 illustrates a cross-section of an exemplary 3D memory device 800, according to some aspects of the present disclosure. As shown in FIG. 42, 3D memory device 800 includes a stack structure 802 and a channel structure 804 extending through stack structure 802 along the y-direction. Stack structure 802 may include interleaved conductive layers and dielectric layers, which is similar to stack structure 111 of 3D memory device 100. In some implementations, the formation and materials of stack structure 802 may be similar to those of stack structure 111.

Figure 43:
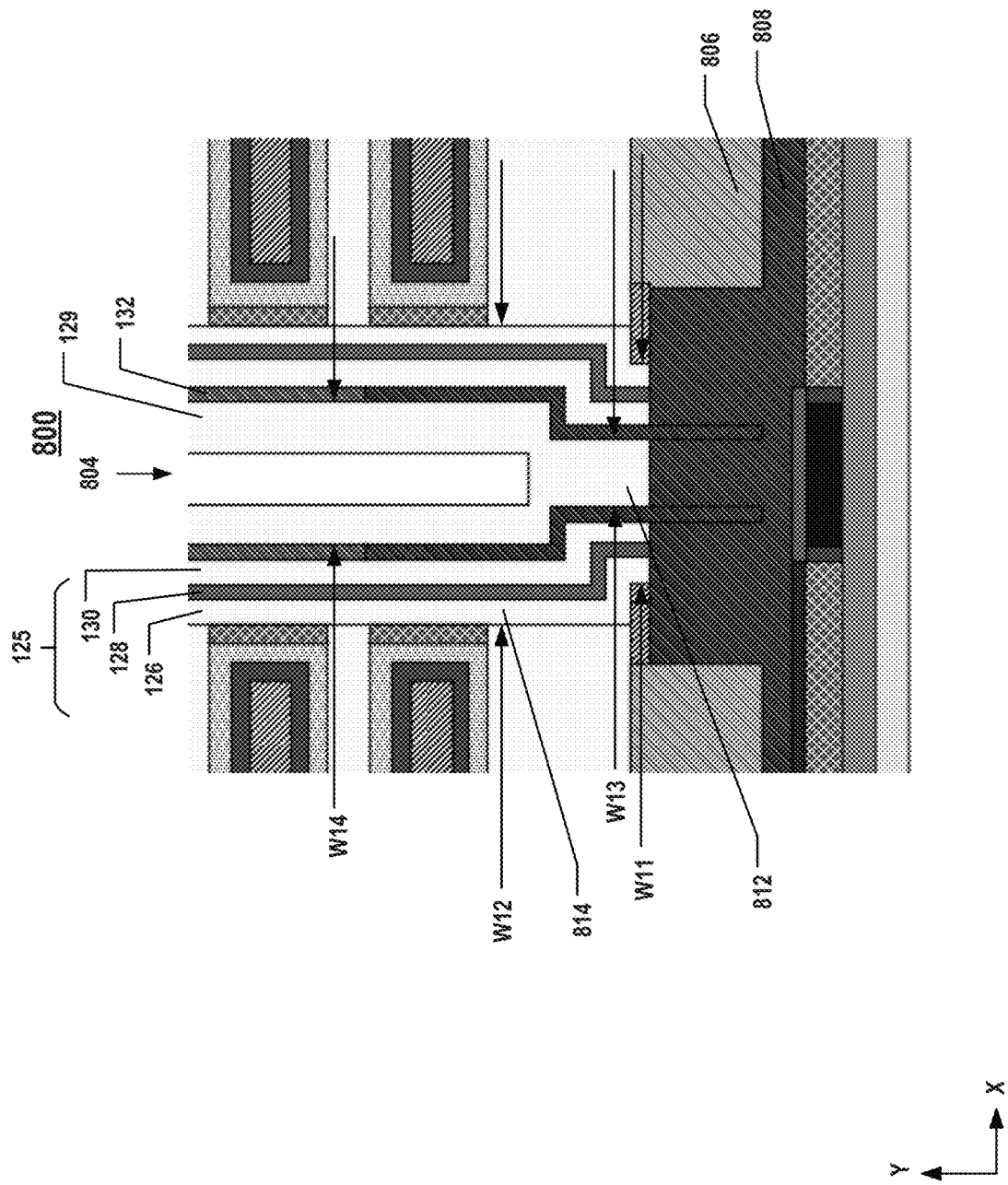
FIG. 43 illustrates a cross-section of a bottom portion of a channel structure, according to some aspects of the present disclosure.

FIG. 43 illustrates a cross-section of a bottom portion of channel structure 804 of 3D memory device 800, according to some aspects of the present disclosure. Channel structure 804 may extend through stack structure 802, and the bottom of channel structure 804 may contact a source of 3D memory device 800. In some implementations, channel structure 804 may include semiconductor channel 132 and memory film 125 formed over semiconductor channel 132, which is similar to channel structure 118 of 3D memory device 100. However, the structure of the bottom portion of channel structure 804 is different from channel structure 118. In some implementations, channel structure 804 may also include dielectric core 129 in the center of channel structure 804. In some implementations, memory film 125 may include tunneling layer 130 over semiconductor channel 132, storage layer 128 over tunneling layer 130, and blocking layer 126 over storage layer 128.

As shown in FIG. 43, the bottom portion 812 of channel structure 804 may include a bending structure of blocking layer 126, tunneling layer 130, and storage layer 128. In some implementations, in the plan view of 3D memory device 800, the bottom portion 812 of channel structure 804 may have a diameter W11, and the upper portion 814 of channel structure 804 may have a diameter W12. In some implementations, W11 is smaller than W12. In some implementations, in the plan view of 3D memory device 800, dielectric core 129 in bottom portion 812 of channel structure 804 may have a diameter W13, and dielectric core 129 in upper portion 814 of channel structure 804 may have a diameter W14. In some implementations, W13 is smaller than W14.

3D memory device 800 may further include a conductive layer 806 in direct contact with stack structure 802, and a doped conductive layer 808 disposed under conductive layer 806. In some implementations, conductive layer 806 may be a polysilicon layer, and doped conductive layer 808 may be a doped polysilicon layer. In some implementations, a portion of doped conductive layer 808 may extend into conductive layer 806. As shown in FIG. 43, a bottom portion of semiconductor channel 132 may extend into the extended portion of doped conductive layer 808, and the extended portion of doped conductive layer 808 surrounds bottom portion 812 of semiconductor channel 132. Conductive layer 806 further surrounds the extended portion of doped conductive layer 808. In some implementations, the bottom surface of memory film 125 is in direct contact with doped conductive layer 808. In some implementations, the top surface of conductive layer 806 is coplanar to the top surface of doped conductive layer 808 and the bottom surface of memory film 125.

The difference between channel structure 804 of 3D memory device 800 and channel structure 404 of 3D memory device 400 is the structure of the bottom portion of the channel structure. As shown in FIG. 43, dielectric core 129 may be filled in between semiconductor channel 132 at the narrow portion (the bottom portion 812) of channel structure 804; however, dielectric core 129 may be formed above semiconductor channel 132 at the narrow portion (the bottom portion 412) of channel structure 404. The difference may be caused by the process of the formation of memory film 125 and semiconductor channel 132. When semiconductor channel 132 is formed fully filling the narrow portion of the channel hole, the later formed dielectric core 129 may be formed above semiconductor channel 132. When semiconductor channel 132 is formed, partially filling the narrow portion of the channel hole, the later formed dielectric core 129 may be filled in between semiconductor channel 132.

By forming dielectric layer 410 on conductive layer 406 exposed by sidewalls of channel hole 464, the bottom portion of channel structure 404 may be defined by the position of dielectric layer 410 and conductive layer 406. The bottom portion of channel structure 404 will not be affected by channel hole etch gouging, and therefore the process window of the formation of channel holes will be greatly increased.

FIGS. 44-52 illustrate cross-sections of 3D memory device 800 at different stages of a manufacturing process, according to some aspects of the present disclosure. FIG. 53 illustrates a flowchart of an exemplary method 5300 for forming 3D memory device 800, according to some aspects of the present disclosure. For the purpose of better describing the present disclosure, the cross-sections of 3D memory device 800 in FIGS. 44-52 and method 5300 in FIG. 53 will be discussed together. It is understood that the operations shown in method 5300 are not exhaustive and that other operations may be performed as well before, after, or between any of the illustrated operations. Further, some of the operations may be performed simultaneously, or in a different order than shown in FIGS. 44-52 and FIG. 53.

Figure 44:
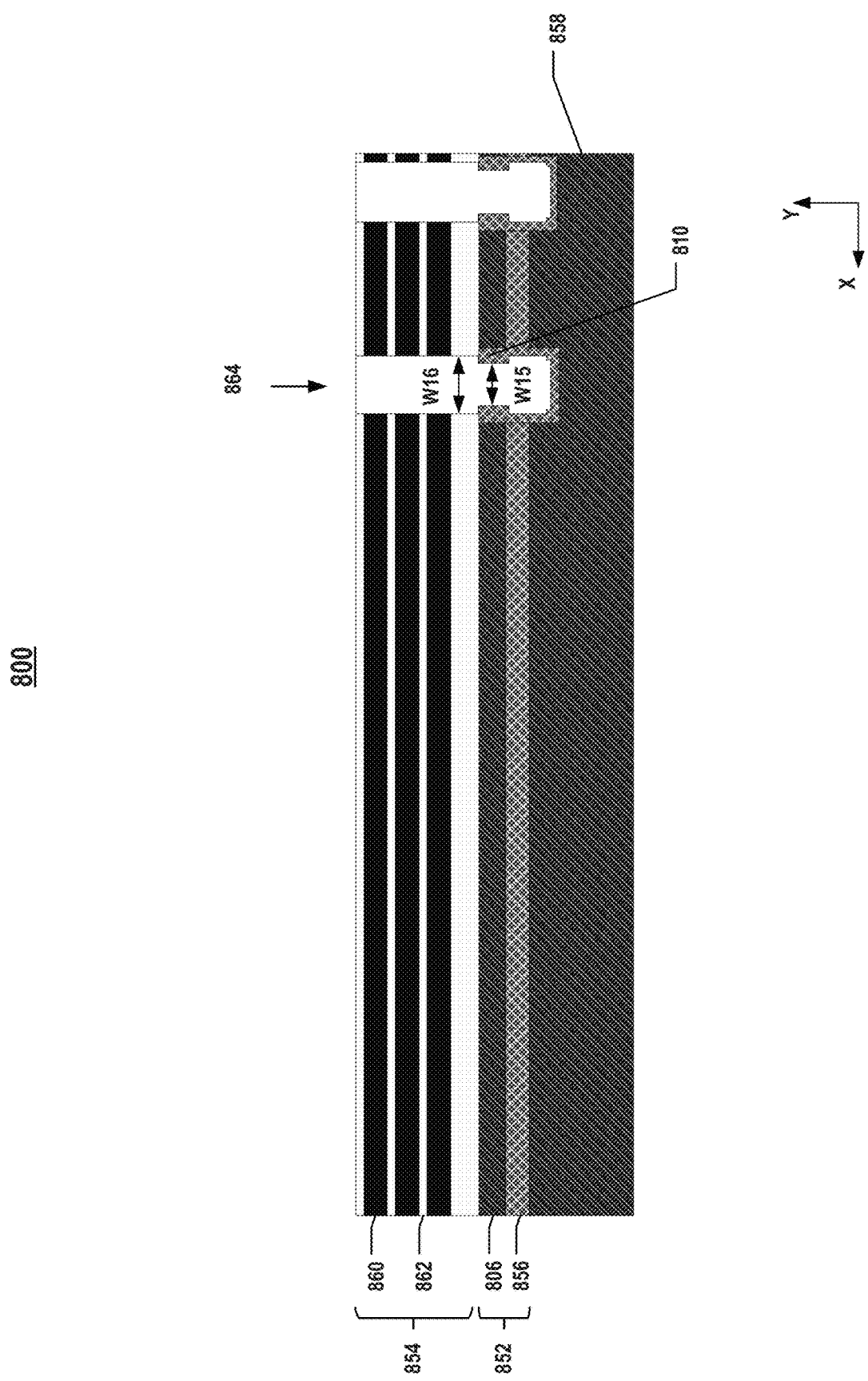
FIGS. 44-52 illustrate cross-sections of an exemplary 3D memory device at different stages of a manufacturing process, according to some aspects of the present disclosure.

As shown in FIG. 44 and operation 5302 in FIG. 53, a stack structure 852 including a dielectric layer 856 and conductive layer 806 is formed on a substrate 858. In some implementations, substrate 858 may be a doped semiconductor layer. In some implementations, dielectric layer 856 may include a layer of silicon oxide or silicon nitride. In some implementations, conductive layer 806 may include a doped polysilicon layer or an undoped polysilicon layer. In some implementations, dielectric layer 856 and conductive layer 806 may be sequentially deposited by one or more thin film deposition processes including, but not limited to, CVD, PVD, ALD, or any combination thereof.

Then, as shown in FIG. 44 and operation 5304 in FIG. 53, a stack structure 854 including a plurality of dielectric layers 862 and a plurality of sacrificial layers 860 alternatingly arranged is formed on stack structure 852. The dielectric/sacrificial layer pairs may include interleaved dielectric layers 862 and sacrificial layers 860 extending along the x-direction and a plane perpendicular to the y-direction. In some implementations, each dielectric layer 862 may include a layer of silicon oxide, and each sacrificial layer 860 may include a layer of silicon nitride. Stack structure 854 may be formed by one or more thin film deposition processes including, but not limited to, CVD, PVD, ALD, or any combination thereof.

As shown in FIG. 44 and operation 5306 in FIG. 53, a channel hole 864 is formed penetrating stack structure 854 and stack structure 852 along the y-direction, and substrate 858 is exposed by channel hole 864. In some implementations, fabrication processes for forming channel hole 464 may include wet etching and/or dry etching, such as deep reactive ion etching (DRIE).

Then, as shown in FIG. 44 and operation 5308 in FIG. 53, an oxidation operation is performed to form dielectric layer 810 on conductive layer 806 exposed by sidewalls of channel hole 864. In some implementations, dielectric layer 810 is further formed on the bottom of channel hole 864 on substrate 858. In some implementations, dielectric layer 810 is further formed on dielectric layer 856. In some implementations, dielectric layer 810 is formed on conductive layer 806 along the x-direction. As shown in FIG. 44, after the formation of dielectric layer 810, channel hole 864 has a width W15 (or the diameter in the plan view) at the portion having dielectric layer 810 formed on the sidewalls and a width W16 at another portion without dielectric layer 810 formed on the sidewalls. In some implementations, the width W15 is smaller than the width W16.

Figure 45:
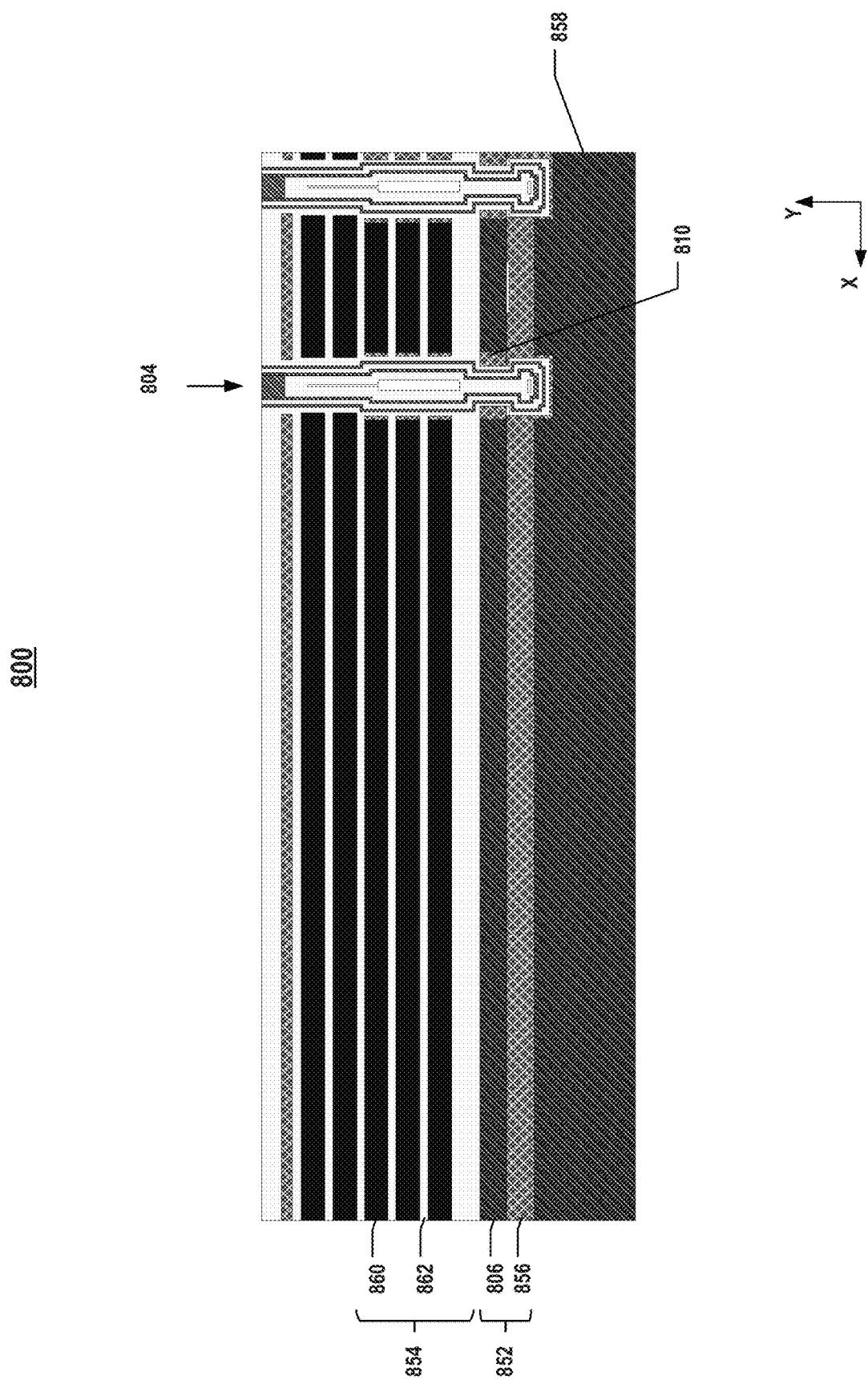

As shown in FIG. 45 and operation 5310 in FIG. 53, channel structure 804 may be formed in channel hole 864. Channel structure 804 may include memory film 125 and semiconductor channel 132. In some implementations, memory film 125 is a composite layer including tunneling layer 130, storage layer 128 (also known as a "charge trap layer"), and blocking layer 126, as shown in FIG. 43. Channel structure 804 can have a cylinder shape (e.g., a pillar shape), and the bottom portion of the cylinder shape may be shrunk at the portion having dielectric layer 810 formed on sidewalls of channel hole 864. The formation of channel structure 804 may include conformally forming memory film 125 in channel hole 864, and then semiconductor channel 132 is formed in channel hole 864 over memory film 125, as shown in operation 5312 in FIG. 53. As shown in FIG. 45, because channel hole 864 has a smaller width W15 at the portion having dielectric layer 810 formed on the sidewalls, semiconductor channel 132 may partially fill channel hole 864 at the portion of the channel hole having dielectric layer 810 formed on the sidewalls.

A poly etch back operation may be performed to thin semiconductor channel 132, and dielectric core 129 may be formed in the center of channel structure 804. Because semiconductor channel 132 may partially fill channel hole 864 at the portion of the channel hole having dielectric layer 810 formed on the sidewalls, dielectric core 129 may fully fill the center of channel hole 864 at the portion of the channel hole having dielectric layer 810 formed on the sidewalls, as shown in operation 5312 in FIG. 53. Dielectric core 129, semiconductor channel 132, tunneling layer 130, storage layer 128, and blocking layer 126 are arranged radially from the center toward the outer surface of the pillar in this order, according to some implementations. In some implementations, tunneling layer 130 may include silicon oxide, silicon oxynitride, or any combination thereof. In some implementations, storage layer 128 may include silicon nitride, silicon oxynitride, silicon, or any combination thereof. In some implementations, blocking layer 126 may include silicon oxide, silicon oxynitride, high dielectric constant (high-k) dielectrics, or any combination thereof. In one example, memory film 125 may include a composite layer of silicon oxide/silicon oxynitride (or silicon nitride)/silicon oxide (ONO).

Figure 46:
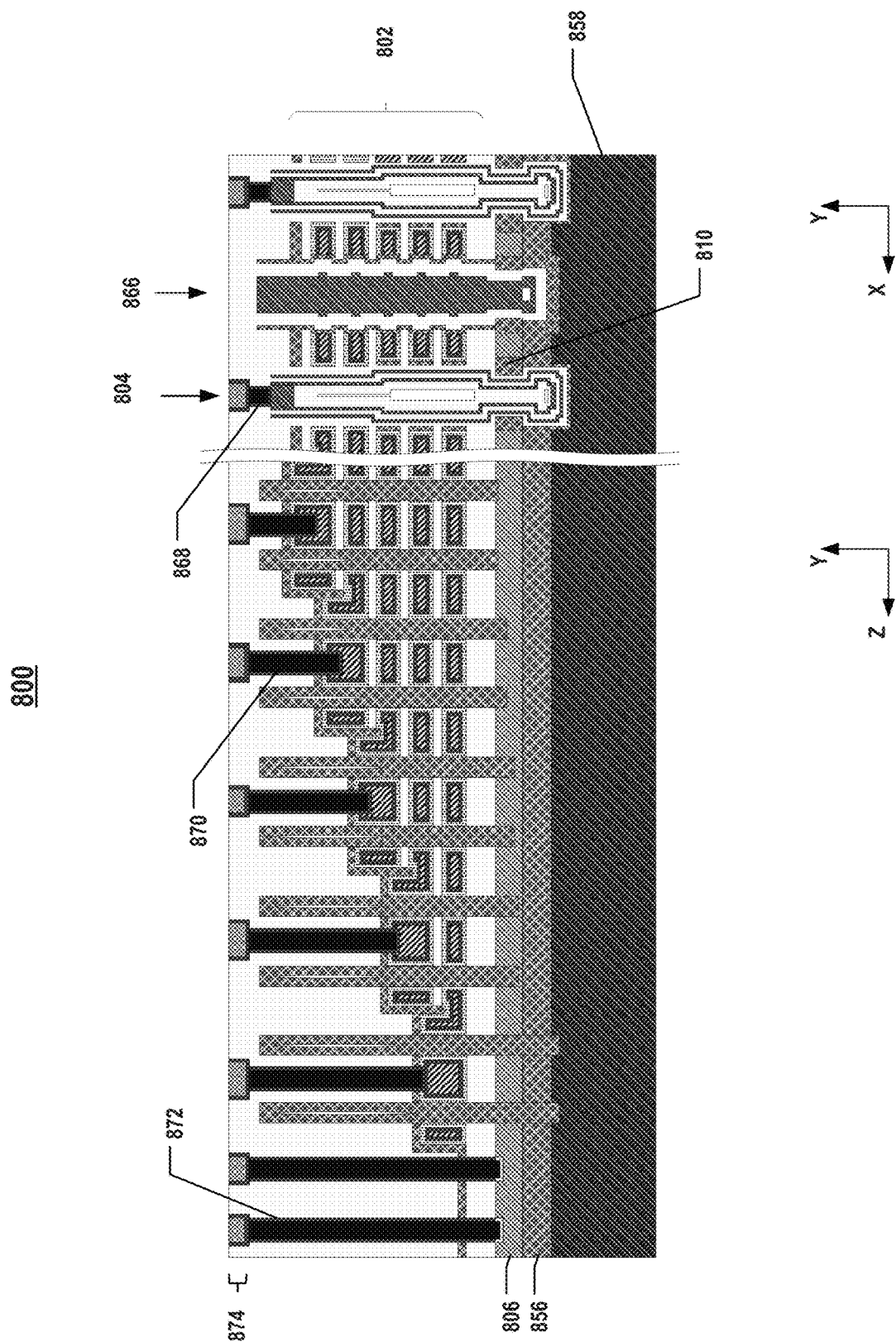

As shown in FIG. 46, a gate line slit 866 may be formed, and a gate replacement then can be performed to replace sacrificial layers 860 with the word line structures. An insulating structure may be fully or partially filled in the slit (with or without an air gap) to form gate line slit 866 using one or more thin film deposition processes, such as ALD, CVD, PVD, any other suitable processes, or any combination thereof.

After the formation of gate line slit 866, local contacts, including channel local contacts 868 and word line local contacts 870, and peripheral contacts 872 are formed. A local dielectric layer can be formed on stack structure 802 by depositing dielectric materials, such as silicon oxide or silicon nitride, using one or more thin film deposition processes, such as CVD, PVD, ALD, or any combination thereof, on top of stack structure 802. Channel local contacts 868, word line local contacts 870, and peripheral contacts 872 may be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

Figure 47:
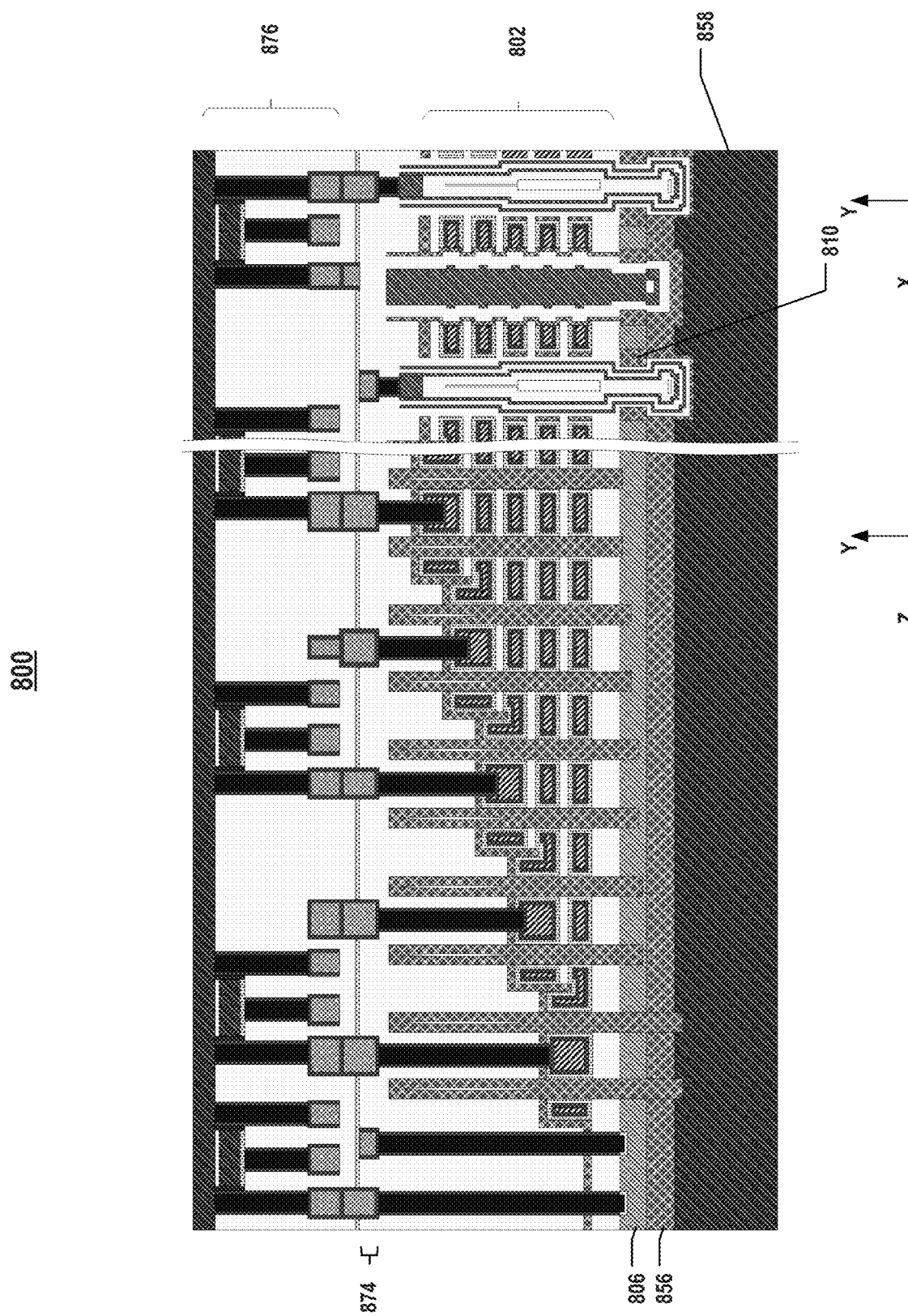

A bonding layer 874 is formed above channel local contacts 868, word line local contacts 870, and peripheral contacts 872. Bonding layer 874 may include bonding contacts electrically connected to channel local contacts 868, word line local contacts 870, and peripheral contacts 872. Then, as shown in FIG. 47, the memory stack and a peripheral circuit 876 are bonded in a face-to-face manner. In some embodiments, a treatment process, e.g., a plasma treatment, a wet treatment, and/or a thermal treatment, is applied to the bonding surfaces prior to the bonding.

Figure 48:
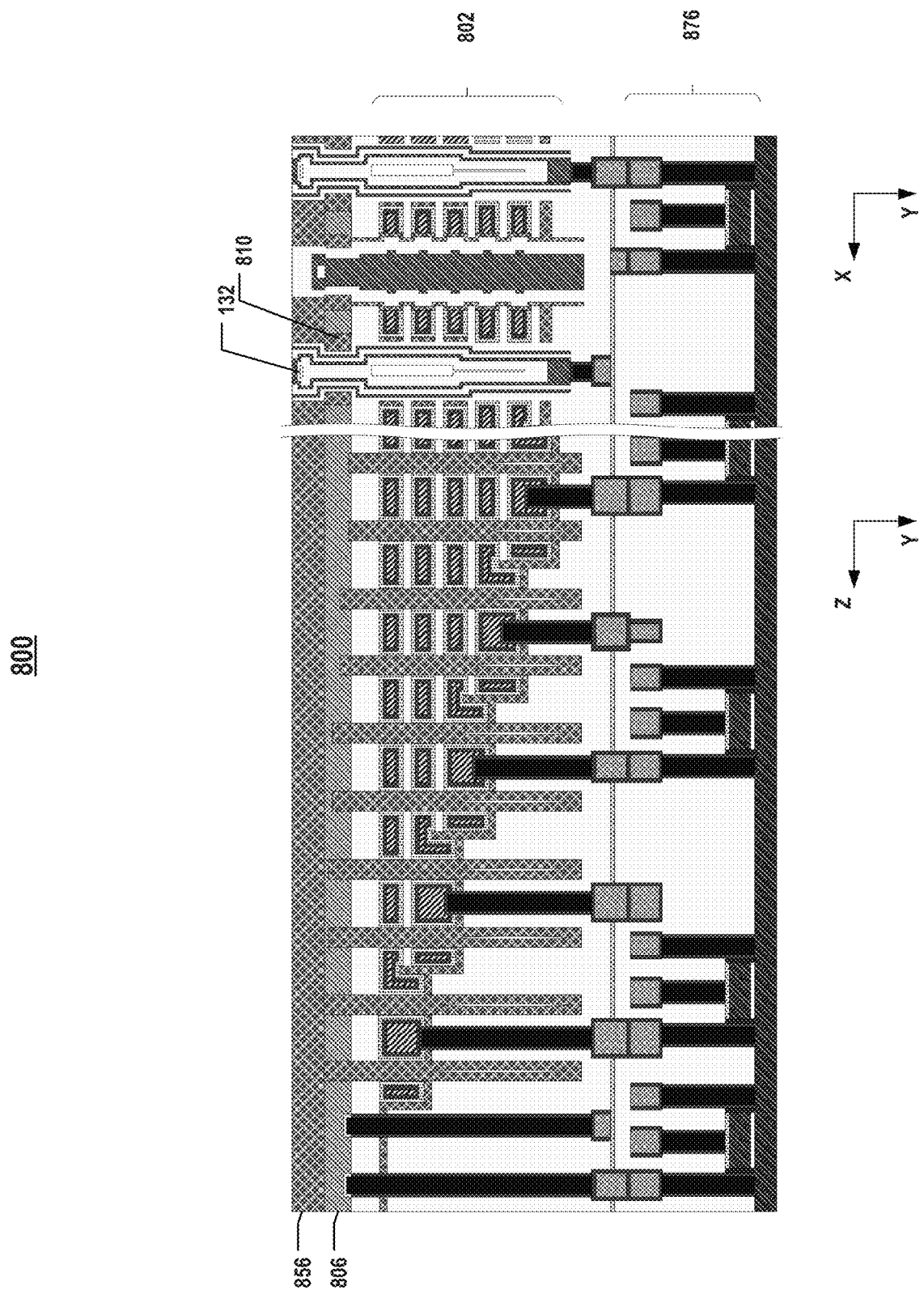

As shown in FIG. 48 and operation 5314 in FIG. 53, substrate 858 is removed to expose dielectric layer 856. In some implementations, substrate 858 may be completely removed using CMP, grinding, dry etching, and/or wet etching. In some embodiments, substrate 858 is peeled off. In some embodiments in which substrate 858 includes silicon, dielectric layer 856 may function as a stop layer, e.g., silicon nitride, when substrate 858 is removed using silicon CMP, which can be automatically stopped when reaching dielectric layer 856 having materials other than silicon, i.e., acting as a backside CMP stop layer. In some embodiments, substrate 858 (a silicon substrate) is removed using wet etching by TMAH, which is automatically stopped when reaching dielectric layer 856 having materials other than silicon, i.e., acting as a backside etch stop layer. Dielectric layer 856 can ensure the complete removal of substrate 858 without the concern of thickness uniformity after thinning.

Figure 49:
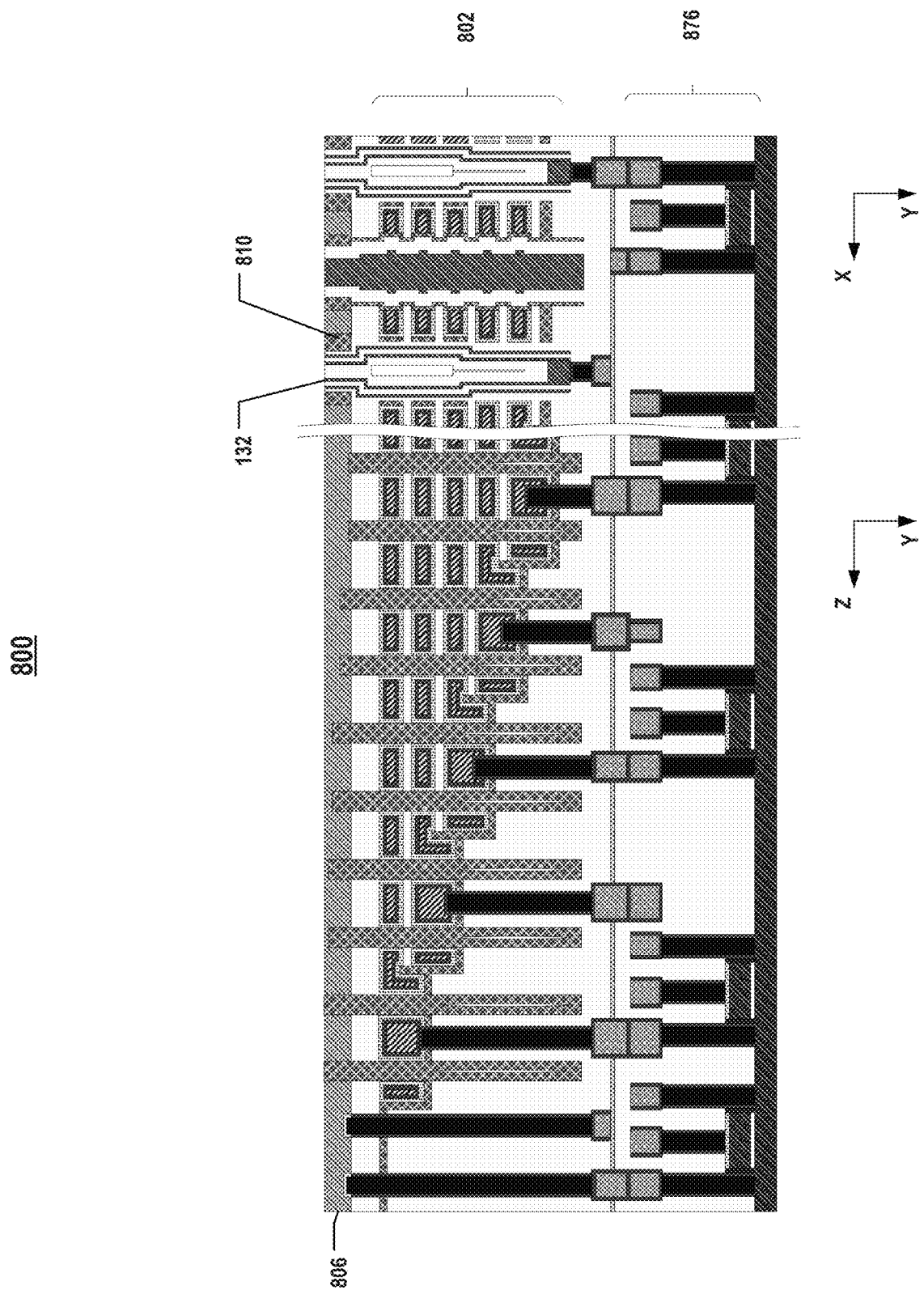

As shown in FIG. 49 and operation 5314 in FIG. 53, in some implementations, after removing substrate 858, a planarization operation, e.g., CMP, may be further performed to remove dielectric layer 856, a portion of memory film 125, and a portion of semiconductor channel 132. In some implementations, after removing dielectric layer 856, the top surface of conductive layer 806 is coplanar to the top surfaces of dielectric layer 810, memory film 125, and semiconductor channel 132.

Figure 50:
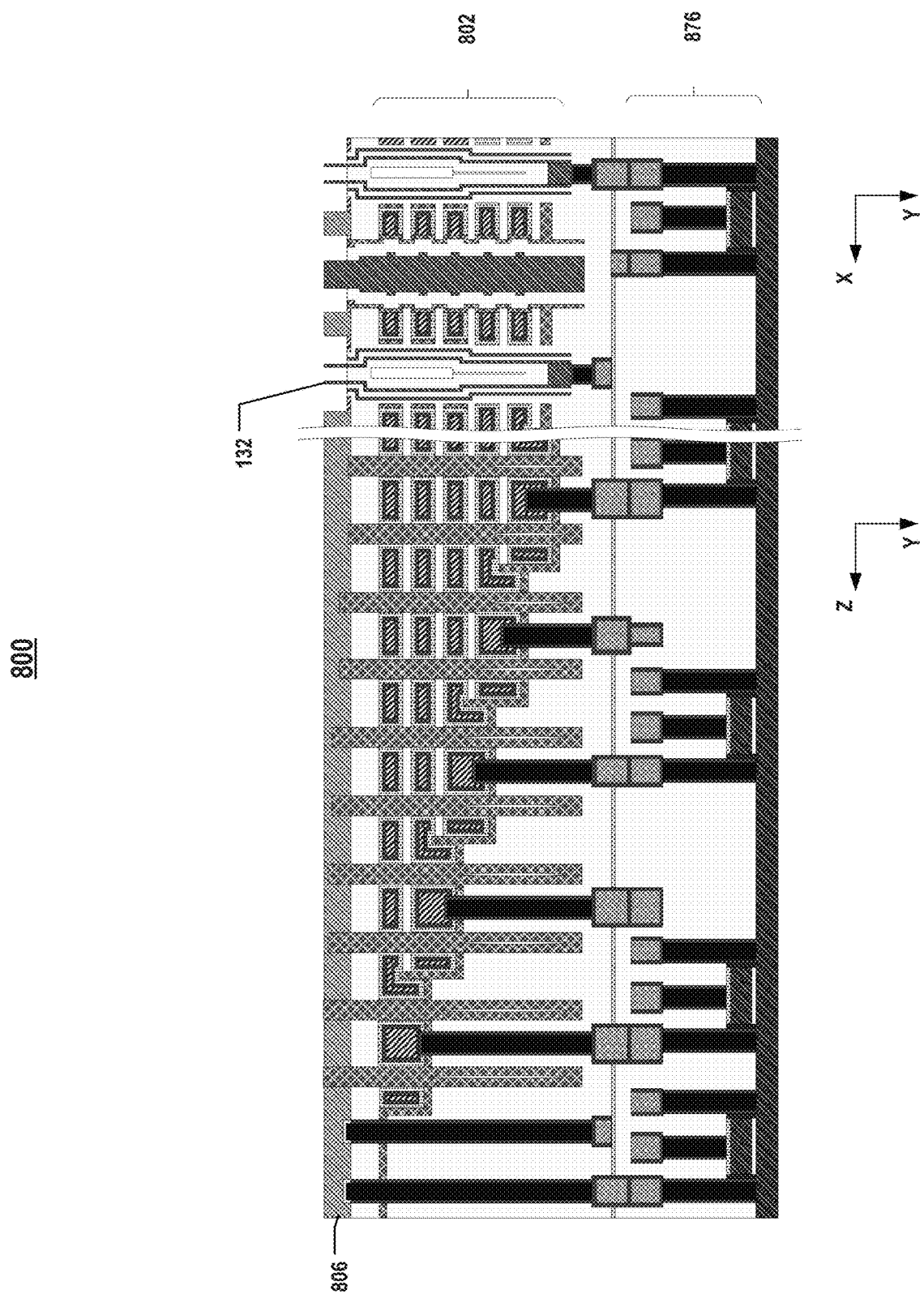
Figure 51:
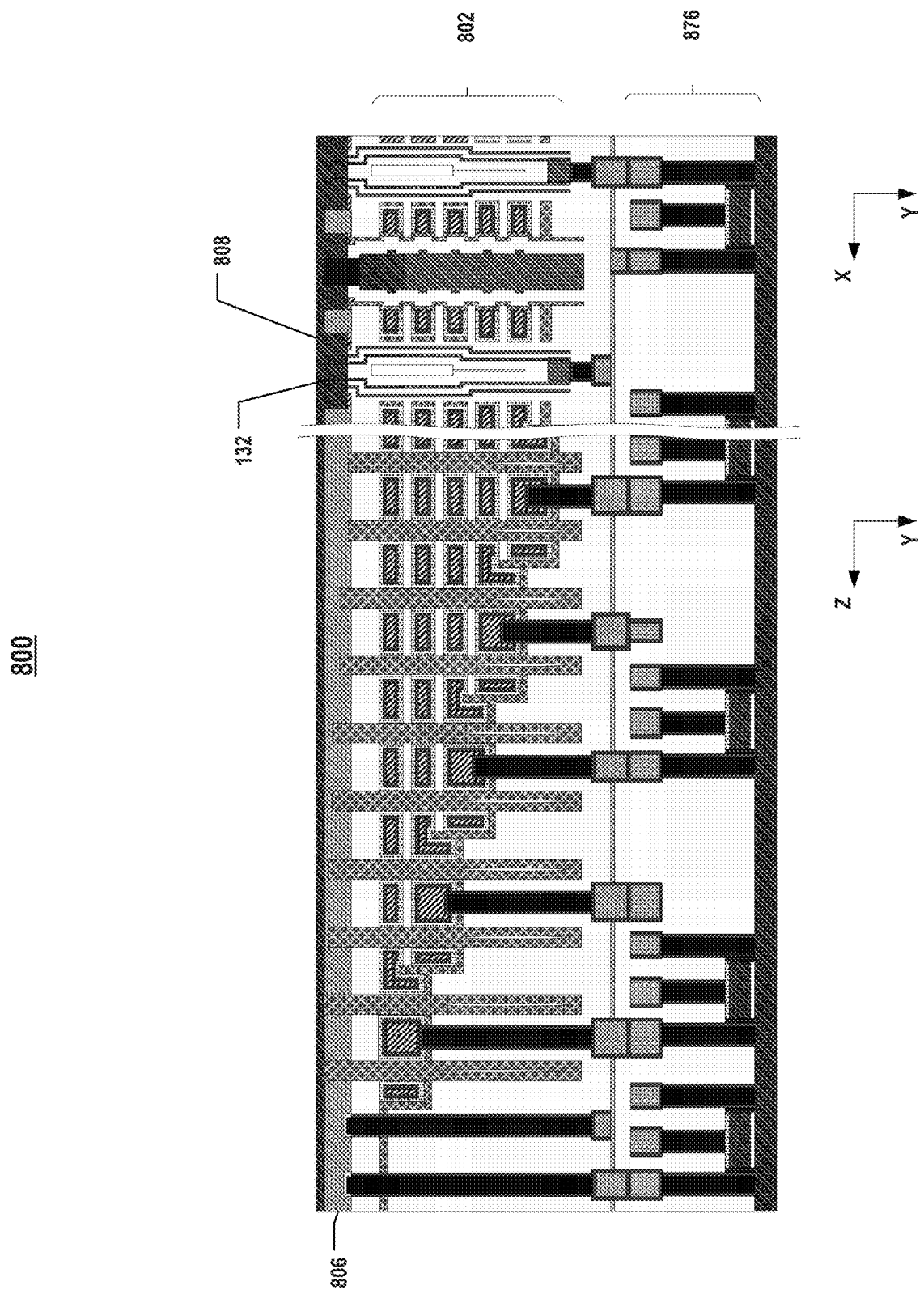

Then, as shown in FIG. 50, dielectric layer 810 and portions of memory film 125 may be removed to form a recess that exposes the side surfaces of semiconductor channel 132. In some implementation, dielectric layer 810 and portions of memory film 125, including silicon oxide/silicon oxynitride (or silicon nitride)/silicon oxide (ONO), may be removed by dry etch, wet etch, or other suitable processes. An implantation operation may be performed on semiconductor channel 132 to dope the top portion of the polysilicon material of semiconductor channel 132, and then doped conductive layer 808 may be formed on conductive layer 806 and formed in the recess. In some implementations, an activation operation, e.g., laser activation operation, may be further performed on doped conductive layer 808. In some implementations, doped conductive layer 808 is in direct contact with memory film 125, and semiconductor channel 132.

Figure 52:
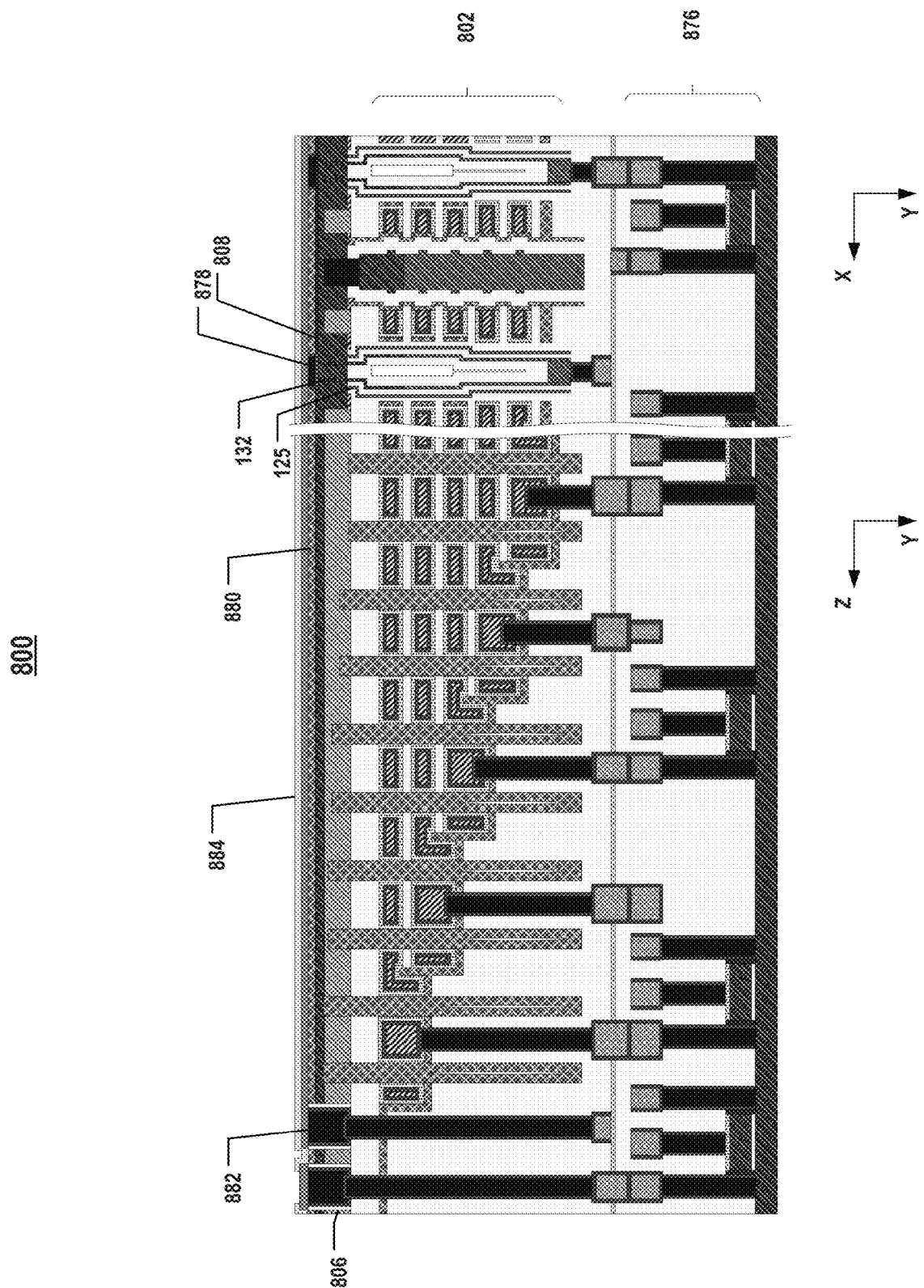
Figure 53:
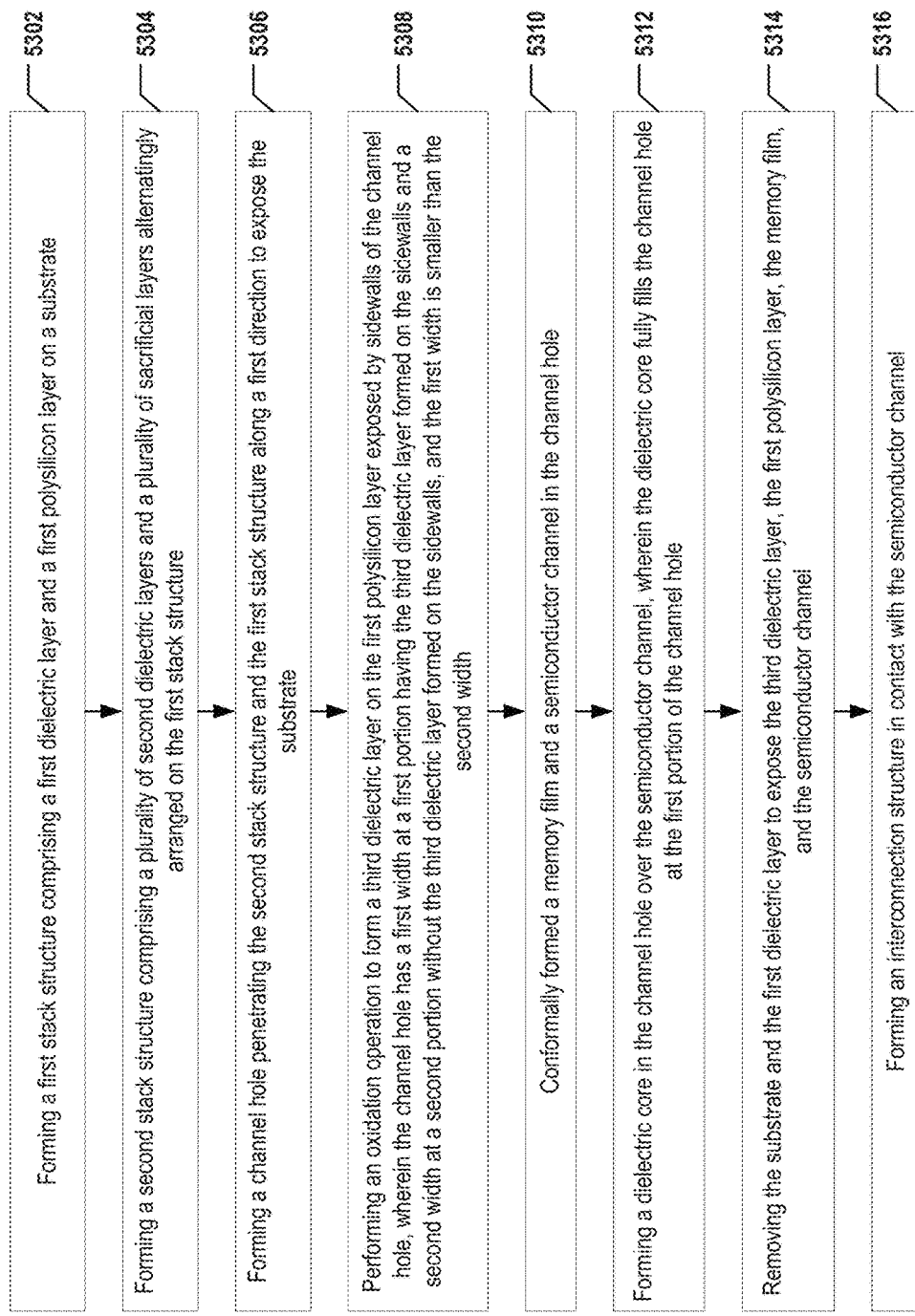
FIG. 53 illustrates a flowchart of an exemplary method for forming a 3D memory device, according to some aspects of the present disclosure.

As shown in FIG. 52 and operation 5316 in FIG. 53, an interconnection structure is formed in contact with semiconductor channel 132. An ILD layer 880 may be formed on doped conductive layer 808, and then source contact openings may be formed in ILD layer 880. Source contacts 878 are formed in the source contact opening. In some implementations, contacts 882 are formed extending through ILD layer 880 and in contact with peripheral contacts. As shown in FIG. 52, a redistribution layer 884 may be formed over source contacts 878 and contacts 882.

By forming dielectric layer 810 on conductive layer 806 exposed by sidewalls of channel hole 864, the bottom portion of channel structure 804 may be defined by the position of dielectric layer 810 and conductive layer 806. The bottom portion of channel structure 804 will not be affected by channel hole etch gouging, and therefore the process window of the formation of channel holes will be greatly increased.

Figure 54:
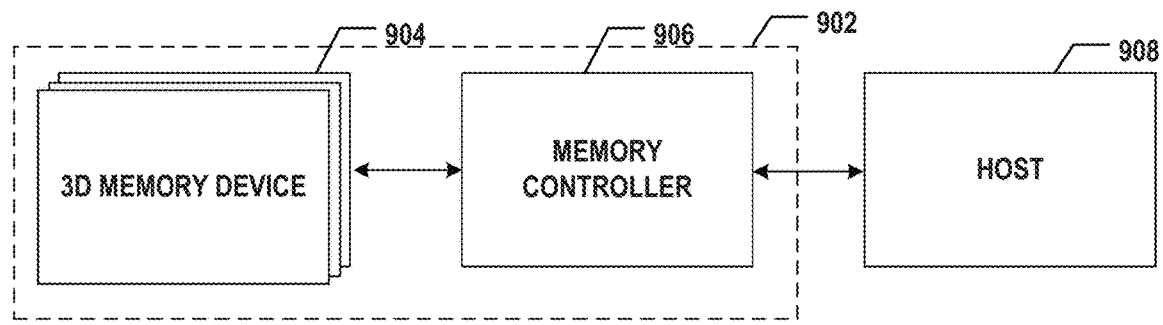
FIG. 54 illustrates a block diagram of an exemplary system having a memory device, according to some aspects of the present disclosure.

FIG. 54 illustrates a block diagram of an exemplary system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 54, system 900 can include a host 908 and a memory system 902 having one or more memory devices 904 and a memory controller 906. Host 908 can be a processor of an electronic device, such as a central processing unit (CPU), or a system-on-chip (SoC), such as an application processor (AP). Host 908 can be configured to send or receive data to or from memory devices 904.

Memory device 904 can be any memory device disclosed in the present disclosure. As disclosed above in detail, memory device 904, such as a NAND Flash memory device, may have a controlled and predefined discharge current in the discharge operation of discharging the bit lines. Memory controller 906 is coupled to memory device 904 and host 908 and is configured to control memory device 904, according to some implementations. Memory controller 906 can manage the data stored in memory device 904 and communicate with host 908. For example, memory controller 906 may be coupled to memory device 904, such as 3D memory device 100, 200, 300, 400, 500, 600, 700, or 800 described above, and memory controller 906 may be configured to control the operations of channel structure 118, 404, 504, 604, 704, or 804 through the peripheral device. By forming the dielectric layer on the polysilicon layer exposed by sidewalls of the channel holes, the bottom portion of channel structures will not be affected by channel hole etch gouging, and therefore the process window of forming 3D memory device 100, 200, 300, 400, 500, 600, 700, or 800 will be greatly increased.

In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 904, such as read, erase, and program operations. Memory controller 906 can also be configured to manage various functions with respect to the data stored or to be stored in memory device 904 including, but not limited to bad-block management, garbage collection, logical-to-physical address conversion, wear leveling, etc. In some implementations, memory controller 906 is further configured to process error correction codes (ECCs) with respect to the data read from or written to memory device 904. Any other suitable functions may be performed by memory controller 906 as well, for example, formatting memory device 904. Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 55A:
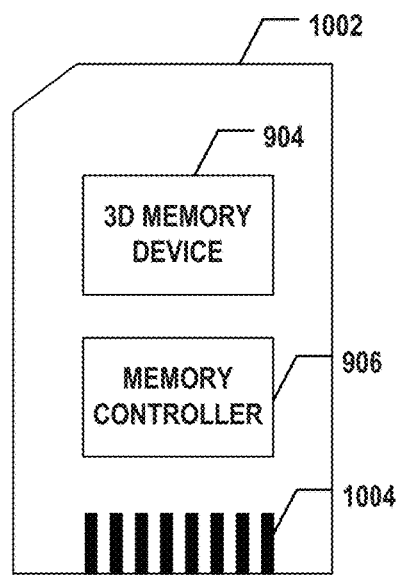
FIG. 55A illustrates a diagram of an exemplary memory card having a memory device, according to some aspects of the present disclosure.
Figure 55B:
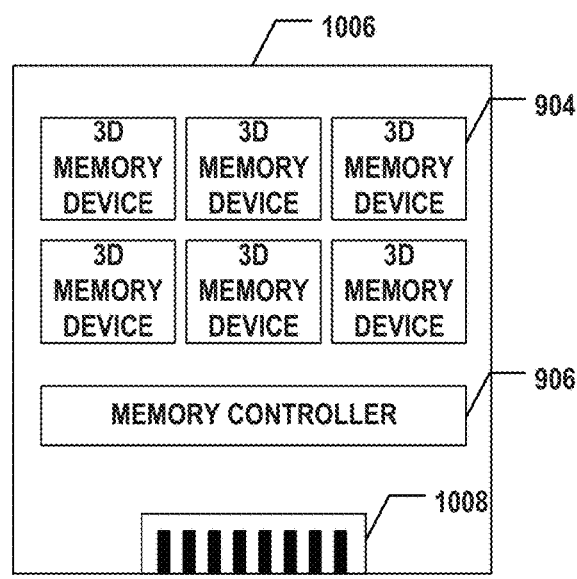
FIG. 55B illustrates a diagram of an exemplary solid-state drive (SSD) having a memory device, according to some aspects of the present disclosure.

Memory controller 906 and one or more memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 55A, memory controller 906 and a single memory device 904 may be integrated into a memory card 1002. Memory card 1002 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1002 can further include a memory card connector 1004 coupling memory card 1002 with a host (e.g., host 908 in FIG. 18). In another example as shown in FIG. 55B, memory controller 906 and multiple memory devices 904 may be integrated into an SSD 1006. SSD 1006 can further include an SSD connector 1008 coupling SSD 1006 with a host (e.g., host 908 in FIG. 18). In some implementations, the storage capacity and/or the operation speed of SSD 1006 is greater than those of memory card 1002.

According to one aspect of the present disclosure, a 3D memory device is disclosed. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The memory film includes a tunneling layer over the semiconductor channel, a storage layer over the tunneling layer, and a blocking layer over the storage layer. A first thickness of the blocking layer at the bottom portion of the channel structure is larger than a second thickness of the blocking layer at an upper portion of the channel structure.

In some implementations, the semiconductor channel comprises an angled structure, and a first diameter of the semiconductor channel at the bottom portion of the channel structure below the angled structure is smaller than a second diameter of the semiconductor channel at the upper portion of the channel structure above the angled structure.

In some implementations, the 3D memory device further includes a polysilicon layer disposed under the stack structure, and the polysilicon layer is in direct contact with the semiconductor channel. In some implementations, the polysilicon layer is in direct contact with a bottom surface of the semiconductor channel and a portion of a side surface of the semiconductor channel at the bottom portion of the channel structure. In some implementations, the bottom surface of the semiconductor channel is above a bottom surface of the stack structure. In some implementations, the bottom surface of the semiconductor channel is beneath a bottom surface of the stack structure.

In some implementations, a bottom surface of the memory film is above the bottom surface of the semiconductor channel. In some implementations, the memory film includes a bending portion at the bottom portion of the channel structure. In some implementations, the semiconductor channel includes a bent portion at the bottom portion of the channel structure.

According to another aspect of the present disclosure, a 3D memory device is disclosed. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The semiconductor channel comprises an angled structure, and a first diameter of the semiconductor channel at the bottom portion of the channel structure below the angled structure is smaller than a second diameter of the semiconductor channel at an upper portion of the channel structure above the angled structure.

In some implementations, the 3D memory device further includes a polysilicon layer disposed under the stack structure, and the polysilicon layer is in direct contact with the semiconductor channel. In some implementations, the polysilicon layer is in direct contact with a bottom surface of the semiconductor channel and a portion of a side surface of the semiconductor channel at the bottom portion of the channel structure. In some implementations, the bottom surface of the semiconductor channel is above a bottom surface of the stack structure. In some implementations, the bottom surface of the semiconductor channel is beneath a bottom surface of the stack structure.

In some implementations, the semiconductor channel includes a bent portion at the bottom portion of the channel structure.

According to still another aspect of the present disclosure, a system is disclosed. The system includes a 3D memory device configured to store data, and a memory controller coupled to the 3D memory device and configured to control operations of the 3D memory device. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The memory film includes a tunneling layer over the semiconductor channel, a storage layer over the tunneling layer, and a blocking layer over the storage layer. A first thickness of the blocking layer at the bottom portion of the channel structure is larger than a second thickness of the blocking layer at an upper portion of the channel structure.

According to yet another aspect of the present disclosure, a system is disclosed. The system includes a 3D memory device configured to store data, and a memory controller coupled to the 3D memory device and configured to control operations of the 3D memory device. The 3D memory device includes a stack structure having interleaved conductive layers and dielectric layers, and a channel structure extending through the stack structure along a first direction. The channel structure is in contact with a source of the 3D memory device at a bottom portion of the channel structure. The channel structure includes a semiconductor channel, and a memory film over the semiconductor channel. The semiconductor channel comprises an angled structure, and a first diameter of the semiconductor channel at the bottom portion of the channel structure below the angled structure is smaller than a second diameter of the semiconductor channel at an upper portion of the channel structure above the angled structure.

According to yet another aspect of the present disclosure, a method for forming a 3D memory device is disclosed. A first stack structure including a first dielectric layer, a first polysilicon layer, a second dielectric layer, and a second polysilicon layer is formed on a substrate. A second stack structure including a plurality of third dielectric layers and a plurality of sacrificial layers alternatingly arranged is formed on the first stack structure. A channel hole is formed penetrating the second stack structure and the first stack structure along a first direction. An oxidation operation is performed to form a fourth dielectric layer on the first polysilicon layer exposed by sidewalls of the channel hole. A channel structure is formed in the channel hole. The substrate, the first dielectric layer, the first polysilicon layer, the fourth dielectric layer, and a bottom portion of the channel structure are removed. A third polysilicon layer is formed over the exposed channel structure.

In some implementations, the fourth dielectric layer is formed on the first polysilicon layer exposed by sidewalls of the channel hole along a second direction perpendicular to the first direction. In some implementations, a fifth dielectric layer is formed on the second polysilicon layer exposed by sidewalls of the channel hole along the second direction.

In some implementations, the first polysilicon layer is divided by the channel hole into a first portion and a second portion in a cross-sectional view of the 3D memory device, and the fourth dielectric layer formed on the first portion of the first polysilicon layer is in contact with the fourth dielectric layer formed on the second portion of the first polysilicon layer.

In some implementations, the first polysilicon layer is divided by the channel hole into a first portion and a second portion in a cross-sectional view of the 3D memory device, and the fourth dielectric layer formed on the first portion of the first polysilicon layer is separate from the fourth dielectric layer formed on the second portion of first polysilicon layer by a gap.

In some implementations, a gate line slit structure is formed penetrating the second stack structure and the first stack structure along the first direction. In some implementations, a dummy channel structure is formed penetrating the second stack structure and the first stack structure along the first direction.

In some implementations, a memory film is formed over sidewalls of the channel hole, and a semiconductor channel is formed over the memory film.

In some implementations, the substrate and the first dielectric layer are sequentially removed to expose the first polysilicon layer and the fourth dielectric layer. The first polysilicon layer is removed. The fourth dielectric layer and a bottom portion of the memory film are removed to expose a bottom surface of the semiconductor channel and a bottom surface of the memory film.

In some implementations, the substrate, the first dielectric layer, and the fourth dielectric layer are sequentially removed to expose a bottom surface of the semiconductor channel. The first polysilicon layer is removed. A bottom portion of the memory film is removed to expose a bottom surface of the memory film.

In some implementations, the bottom surface of the memory film is above the bottom surface of the semiconductor channel. In some implementations, the third polysilicon layer is formed in direct contact with the bottom surface of the semiconductor channel and the bottom surface of the memory film. In some implementations, the plurality of sacrificial layers are replaced with a plurality of word lines.

In some implementations, the first polysilicon layer includes a doped polysilicon layer. In some implementations, a pretreatment operation is performed on the first polysilicon layer and the second polysilicon layer. In some implementations, the pretreatment operation includes an $NH_3$ treatment on the first polysilicon layer and the second polysilicon layer.

According to yet another aspect of the present disclosure, a method for forming a 3D memory device is disclosed. A first stack structure including a first dielectric layer, a first polysilicon layer, a second dielectric layer, and a second polysilicon layer is formed on a substrate. A second stack structure including a plurality of third dielectric layers and a plurality of sacrificial layers alternatingly arranged is formed on the first stack structure. A channel hole is formed penetrating the second stack structure and the first stack structure along a first direction. A fourth dielectric layer is formed on the first polysilicon layer exposed by sidewalls of the channel hole along a second direction perpendicular to the first direction to connect the first polysilicon layer divided by the channel hole. A channel structure is formed in the channel hole above the fourth dielectric layer. The substrate, the first dielectric layer, the first polysilicon layer, the fourth dielectric layer, and a bottom portion of the channel structure are removed. A third polysilicon layer is formed over the exposed channel structure.

In some implementations, an oxidation operation is performed on the first polysilicon layer exposed by sidewalls of the channel hole.

In some implementations, the first polysilicon layer is divided by the channel hole into a first portion and a second portion in a cross-sectional view of the 3D memory device, and the fourth dielectric layer formed on the first portion of the first polysilicon layer is in contact with the fourth dielectric layer formed on the second portion of the first polysilicon layer.

In some implementations, a fifth dielectric layer is formed on the second polysilicon layer exposed by sidewalls of the channel hole along the second direction. In some implementations, the fifth dielectric layer forms a protrusion on sidewalls of the channel hole along the second direction.

In some implementations, a memory film is formed over sidewalls of the channel hole. A semiconductor channel is formed over the memory film. A bottom portion of the memory film and a bottom portion of the semiconductor channel include a depression formed on the fifth dielectric layer.

In some implementations, the substrate and the first dielectric layer are sequentially removed to expose the first polysilicon layer and the fourth dielectric layer. The first polysilicon layer is removed. The fourth dielectric layer and a bottom portion of the memory film are removed to expose a bottom surface of the semiconductor channel and a bottom surface of the memory film.

In some implementations, the substrate, the first dielectric layer, and the fourth dielectric layer are sequentially removed to expose a bottom surface of the semiconductor channel. The first polysilicon layer is removed. A bottom portion of the memory film is removed to expose a bottom surface of the memory film.

In some implementations, the bottom surface of the memory film is above the bottom surface of the semiconductor channel. In some implementations, the third polysilicon layer is formed in direct contact with the bottom surface of the semiconductor channel and the bottom surface of the memory film.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a stack structure comprising interleaved conductive layers and dielectric layers;
a channel structure extending through the stack structure along a first direction in contact with a source of the 3D memory device at a bottom portion of the channel structure, the channel structure comprising a semiconductor channel, and a memory film over the semiconductor channel, and the memory film comprising a tunneling layer over the semiconductor channel, a storage layer over the tunneling layer, and a blocking layer over the storage layer; and
a polysilicon layer disposed under the stack structure,
wherein a first thickness of the blocking layer at the bottom portion of the channel structure is larger than a second thickness of the blocking layer at an upper portion of the channel structure, and the first thickness of the blocking layer or the second thickness of the blocking layer comprises dielectric materials formed between the storage layer and the stack structure along a second direction perpendicular to the first direction; and
the tunneling layer, the storage layer, and the blocking layer are in direct contact with the polysilicon layer.

2. The 3D memory device of claim 1, wherein the semiconductor channel comprises an angled structure, and a first diameter of the semiconductor channel at the bottom portion of the channel structure below the angled structure is smaller than a second diameter of the semiconductor channel at the upper portion of the channel structure above the angled structure.

3. The 3D memory device of claim 1,
wherein the polysilicon layer is in direct contact with the semiconductor channel.

4. The 3D memory device of claim 3, wherein the polysilicon layer is in direct contact with a bottom surface of the semiconductor channel and a portion of a side surface of the semiconductor channel at the bottom portion of the channel structure.

5. The 3D memory device of claim 4, wherein the bottom surface of the semiconductor channel is above a bottom surface of the stack structure.

6. The 3D memory device of claim 4, wherein the bottom surface of the semiconductor channel is beneath a bottom surface of the stack structure.

7. The 3D memory device of claim 3, wherein a bottom surface of the memory film is above the bottom surface of the semiconductor channel.

8. The 3D memory device of claim 1, wherein the memory film comprises a bending portion at the bottom portion of the channel structure.

9. A three-dimensional (3D) memory device, comprising:
a stack structure comprising interleaved conductive layers and dielectric layers;
a channel structure extending through the stack structure along a first direction in contact with a source of the 3D memory device at a bottom portion of the channel structure, the channel structure comprising a semiconductor channel, and a memory film over the semiconductor channel, and the memory film comprising a tunneling layer over the semiconductor channel, a storage layer over the tunneling layer, and a blocking layer over the storage layer; and
a polysilicon layer disposed under the stack structure,
wherein the semiconductor channel comprises an angled structure, and a first diameter of the semiconductor channel at the bottom portion of the channel structure below the angled structure is smaller than a second diameter of the semiconductor channel at an upper portion of the channel structure above the angled structure; and
the tunneling layer, the storage layer, and the blocking layer are in direct contact with the polysilicon layer.

10. The 3D memory device of claim 9,
wherein the polysilicon layer is in direct contact with the semiconductor channel.

11. The 3D memory device of claim 10, wherein the polysilicon layer is in direct contact with a bottom surface of the semiconductor channel and a portion of a side surface of the semiconductor channel at the bottom portion of the channel structure.

12. The 3D memory device of claim 11, wherein the bottom surface of the semiconductor channel is above a bottom surface of the stack structure.

13. The 3D memory device of claim 11, wherein the bottom surface of the semiconductor channel is beneath a bottom surface of the stack structure.

14. The 3D memory device of claim 9, wherein the semiconductor channel comprises a bending portion at the bottom portion of the channel structure.

15. A method for forming a three-dimensional (3D) memory device, comprising:
   forming a first stack structure comprising a first dielectric layer, a first polysilicon layer, a second dielectric layer, and a second polysilicon layer on a substrate;
   forming a second stack structure comprising a plurality of third dielectric layers and a plurality of sacrificial layers alternatingly arranged on the first stack structure;
   forming a channel hole penetrating the second stack structure and the first stack structure along a first direction;
   performing an oxidation operation to form a fourth dielectric layer on the first polysilicon layer exposed by sidewalls of the channel hole;
   forming a channel structure in the channel hole;
   removing the substrate, the first dielectric layer, the first polysilicon layer, the fourth dielectric layer, and a bottom portion of the channel structure; and
   forming a third polysilicon layer over the channel structure.

16. The method of claim 15, wherein performing the oxidation operation to form the fourth dielectric layer on the first polysilicon layer exposed by sidewalls of the channel hole, further comprises:
   forming the fourth dielectric layer on the first polysilicon layer exposed by sidewalls of the channel hole along a second direction perpendicular to the first direction.

17. The method of claim 16, wherein performing the oxidation operation to form the fourth dielectric layer on the first polysilicon layer exposed by sidewalls of the channel hole, further comprises:
   forming a fifth dielectric layer on the second polysilicon layer exposed by sidewalls of the channel hole along the second direction.

18. The method of claim 16, wherein the first polysilicon layer is divided by the channel hole into a first portion and a second portion in a cross-sectional view of the 3D memory device, and the fourth dielectric layer formed on the first portion of the first polysilicon layer is in contact with the fourth dielectric layer formed on the second portion of the first polysilicon layer.

19. The method of claim 16, wherein the first polysilicon layer is divided by the channel hole into a first portion and a second portion in a cross-sectional view of the 3D memory device, and the fourth dielectric layer formed on the first portion of the first polysilicon layer is separate from the fourth dielectric layer formed on the second portion of first polysilicon layer by a gap.

20. The method of claim 15, further comprising:
   performing a pretreatment operation on the first polysilicon layer and the second polysilicon layer.

\* \* \* \* \*